United States Patent
Yomogita et al.

(10) Patent No.: US 9,923,141 B2
(45) Date of Patent: *Mar. 20, 2018

(54) CARBAZOLE-BASED POLYMER AND ORGANIC ELECTROLUMINESCENCE ELEMENT USING SAME

(71) Applicant: Idemitsu Kosan Co., Ltd., Tokyo (JP)

(72) Inventors: Akinori Yomogita, Sodegaura (JP);
Hironori Kawakami, Sodegaura (JP);
Masami Watanabe, Sodegaura (JP);
Kiyoshi Ikeda, Sodegaura (JP);
Masahiro Kawamura, Sodegaura (JP);
Nobuhiro Yabunouchi, Sodegaura (JP);
Tomoki Kato, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 374 days.

This patent is subject to a terminal disclaimer.

(21) Appl. No.: 14/234,967

(22) PCT Filed: Oct. 16, 2012

(86) PCT No.: PCT/JP2012/006603
§ 371 (c)(1),
(2) Date: Jan. 24, 2014

(87) PCT Pub. No.: WO2013/057922
PCT Pub. Date: Apr. 25, 2013

(65) Prior Publication Data
US 2014/0299855 A1     Oct. 9, 2014

(30) Foreign Application Priority Data

Oct. 19, 2011   (JP) ................. 2011-229720

(51) Int. Cl.
*H01L 51/54*     (2006.01)
*C09K 11/06*     (2006.01)
(Continued)

(52) U.S. Cl.
CPC ........ *H01L 51/0003* (2013.01); *C08G 61/124* (2013.01); *C08G 73/0672* (2013.01);
(Continued)

(58) Field of Classification Search
CPC .... C08G 61/00; C08G 61/12; C08G 73/0622; C08G 73/0627; C08G 2261/00;
(Continued)

(56) References Cited

U.S. PATENT DOCUMENTS 5,085,946 A   2/1992 Saito et al.
6,942,931 B2  9/2005 Lee et al.
(Continued)

FOREIGN PATENT DOCUMENTS

JP   2-223188   9/1990
JP   07-053681  2/1995
(Continued)

OTHER PUBLICATIONS

International Search Report issued in related International Patent Application No. PCT/JP2012/006603, completed Nov. 2, 2012.

*Primary Examiner* — Andrew K Bohaty
(74) *Attorney, Agent, or Firm* — Foley & Lardner LLP

(57) ABSTRACT

A polymer including a structural unit represented by the following formula (A). In the formula (A), P is independently a group represented by the following formula (P), a is an integer of 2 to 5, and b is an integer of 0 to 5. In the formula (P), A is independently a nitrogen atom or CR; X is a single bond, O, S, $C(R)_2$ or NR. R is independently a hydrogen atom, a substituted or unsubstituted alkyl group including 1 to 20 carbon atoms or the like, or a single bond used for bonding to another P or L, provided that at least one R contained in (P)a is represented by any one of the following formulas (3) to (7).

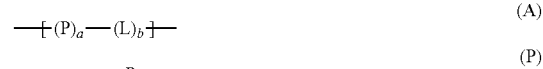

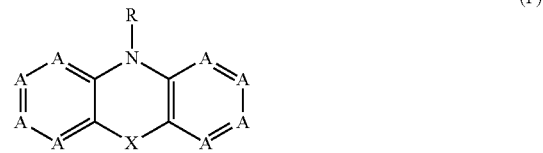

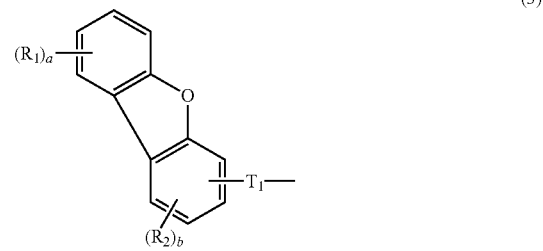

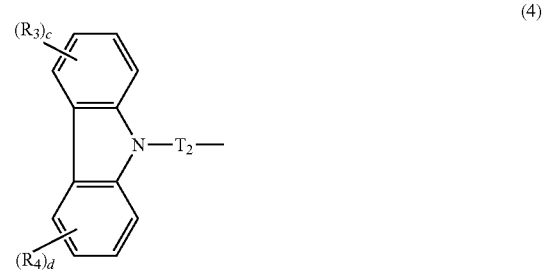

(Continued)

-continued

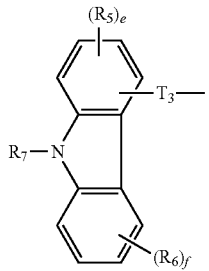
(5)

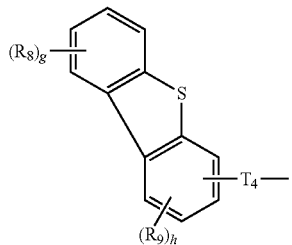

(6)

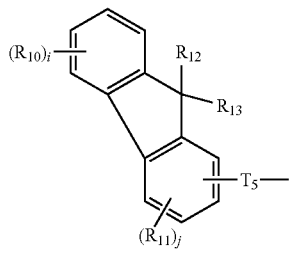

(7)

19 Claims, No Drawings

(51) Int. Cl.
| H01L 51/00 | (2006.01) |
| H01L 51/50 | (2006.01) |
| C08G 61/12 | (2006.01) |
| C09D 179/04 | (2006.01) |
| C08G 73/06 | (2006.01) |
| H01L 51/05 | (2006.01) |
| H01L 51/42 | (2006.01) |
| H01L 51/56 | (2006.01) |

(52) U.S. Cl.
CPC ........ *C09D 179/04* (2013.01); *H01L 51/0035* (2013.01); *H01L 51/0039* (2013.01); *H01L 51/0043* (2013.01); *H01L 51/05* (2013.01); *H01L 51/42* (2013.01); *H01L 51/5056* (2013.01); *H01L 51/5088* (2013.01); *H01L 51/56* (2013.01); *C08G 2261/124* (2013.01); *C08G 2261/148* (2013.01); *C08G 2261/149* (2013.01); *C08G 2261/1412* (2013.01); *C08G 2261/1646* (2013.01); *C08G 2261/3142* (2013.01); *C08G 2261/3162* (2013.01); *C08G 2261/3241* (2013.01); *C08G 2261/364* (2013.01); *C08G 2261/411* (2013.01); *C08G 2261/91* (2013.01); *C08G 2261/92* (2013.01); *C08G 2261/95* (2013.01); *Y02E 10/549* (2013.01); *Y02P 70/521* (2015.11)

(58) Field of Classification Search
CPC .......... C08G 2261/135; C08G 2261/14; C08G 2261/141; C08G 2261/142; C08G 2261/149; C08G 2261/1644; C08G 2261/30; C08G 2261/31; C08G 2261/312; C08G 2261/314; C08G 2261/3142; C08G 2261/316; C08G 2261/3162; C08G 2261/324; C08G 2261/3241; C08G 2261/40; C08G 2261/411; C08G 2261/76; C08G 2261/91; C08G 2261/92; C08G 2261/95; C08G 2261/124; C09D 179/00; C09D 179/04; H01L 51/0032; H01L 51/0034; H01L 51/0035; H01L 51/0039; H01L 51/0043; H01L 51/50; H01L 51/5056; H01L 51/5088
USPC ....... 428/690, 691, 917, 411.4, 336; 427/58, 427/66; 313/500–512; 257/40, 88–104, 257/E51.001–E51.052; 252/301.16–301.35, 500; 528/8, 210
See application file for complete search history.

(56) References Cited

U.S. PATENT DOCUMENTS

| 8,034,882 | B2 | 10/2011 | Yu et al. | |
| 2003/0008175 | A1* | 1/2003 | Lee | C08G 61/02 428/690 |
| 2006/0051611 | A1 | 3/2006 | Brunner et al. | |
| 2006/0073357 | A1 | 4/2006 | Brunner et al. | |
| 2006/0078757 | A1 | 4/2006 | Boerner | |
| 2008/0054794 | A1* | 3/2008 | Hatanaka | C09K 11/06 313/504 |
| 2008/0233429 | A1 | 9/2008 | Oguma et al. | |
| 2008/0265755 | A1 | 10/2008 | Yu et al. | |
| 2008/0274303 | A1 | 11/2008 | Agata et al. | |
| 2009/0066224 | A1 | 3/2009 | Yu et al. | |
| 2010/0133992 | A1 | 6/2010 | Yang et al. | |
| 2011/0017983 | A1 | 1/2011 | Mizuki et al. | |
| 2011/0084254 | A1 | 4/2011 | Kim et al. | |

FOREIGN PATENT DOCUMENTS

| JP | 08-048726 | 2/1996 |
| JP | 2003-12777 | 1/2003 |
| JP | 2004-269696 | 9/2004 |
| JP | 2004-339432 | 12/2004 |
| JP | 2005-272834 | 10/2005 |
| JP | 2006-510231 | 3/2006 |
| JP | 2007-119763 | 5/2007 |
| JP | 2007-162009 | 6/2007 |
| JP | 2007-177225 | 7/2007 |
| JP | 2008-531822 | 8/2008 |
| JP | 2008-537560 | 9/2008 |
| JP | 2009-060052 | 3/2009 |
| JP | 2009-283509 | 12/2009 |
| JP | 2010-062442 | 3/2010 |
| JP | 2010-065087 | 3/2010 |
| JP | 2010-126535 | 6/2010 |
| JP | 2011-080066 | 4/2011 |
| WO | WO 2005/049546 A1 | 6/2005 |
| WO | WO 2009/110360 A1 | 9/2009 |

* cited by examiner

CARBAZOLE-BASED POLYMER AND ORGANIC ELECTROLUMINESCENCE ELEMENT USING SAME

TECHNICAL FIELD

The invention relates to a carbazole-based polymer and an organic electroluminescence device (Organic EL Device) using the same.

BACKGROUND ART

Due to self-emission and no dependency on viewing angle, as well as capability of plane emission and reduction in thickness, application of an organic EL device to a display of a TV or a mobile phone, an illumination or the like has been studied.

An organic EL device has a configuration in which a thin film of an organic compound is sandwiched between a cathode and an anode. The methods for forming a thin film are roughly divided into the deposition method and the coating method. The deposition method is a method in which a low-molecular weight compound is mainly used, and a thin film is formed on the substrate in vacuum. The industrial-base-production thereof proceeds. On the other hand, the coating method is a technique in which a thin film is formed on the substrate by using a solution (e.g. inkjet and printing). The deposition method has a high material utilization efficiency, and hence is suited to an increase in area and an enhancement of resolution. This method is a technology which is deemed to be indispensable in an organic EL large-sized display in the future.

The vacuum deposition method using a low-molecular material has an extremely low utilization efficiency of the material. In addition, if the size is increased, the degree of distortion of a shadow mask becomes large. Therefore, deposition on a large-sized substrate is difficult, and as a result, fabrication of a display using a large-sized organic EL substrate is difficult. In addition, the production cost also increases.

On the other hand, in the case of a high-molecular weight material, it is possible to form a homogenous film by applying a solution obtained by dissolving the high-molecular weight material in an organic solvent. A coating method represented by the inkjet method or the printing method can be used by utilizing such a nature of a high-molecular weight material. Therefore, it is possible to enhance the material utilization efficiency to near to 100%. In addition, since it can be applied to substrates of various shapes ranging from a small-sized substrate to a large-sized substrate, the production cost of the device can be significantly reduced.

However, in general, the coating method is not suited to a stacked-type device, and has a problem that it is not easy to improve the performance of the device.

The reason for unsuitability of applying the coating method to a stacked-type device is that, when stacking layers, films which have been formed in advance are inevitably dissolved. Specifically, in a stacked-type organic EL device fabricated by the coating method, a hole-injecting layer and a hole-transporting layer have to be insoluble in a solvent used when an emitting layer is formed.

Therefore, at present, most of organic EL devices obtained by the coating method are limited to a two-layer structure in which a hole-injecting layer is formed by a water-dispersion liquid of polythiophene:polystyrene sulfonic acid (PEDOT:PSS), and an emitting layer is formed by using an aromatic organic solvent such as toluene. Since the PEDOT:PSS layer is not dissolved in toluene, it is possible to fabricate such two-layer structure.

A hole-transporting material is formed into a hole-transporting layer and stacking on a hole-injecting layer by using an organic solvent such as toluene, xylene, dioxane and cyclohexanone. In this case, the adhesiveness to a hole-injecting layer emerges as a problem. If a hole transporting material has a low adhesion to a hole-injecting layer, current leakage may occur. In addition, since the surface flatness of a resulting layer is not good and the interface between the layer and an emitting layer is not flat and smooth, the life of a device obtained may be shortened.

As for a hole-transporting layer, use of a high-molecular weight compound has been studied in expectation of improved physical or thermal durability. For example, Patent Document 1 reports an organic EL device using as a polymer polyvinyl carbazole (PVCz) having a hole injecting ability. Since the glass transition temperature (Tg) of PVCz is extremely high, the resulting thin film has an excellent stability, whereby an organic EL device having a high durability can be fabricated.

However, the device thus obtained has problems that it requires a significantly high driving voltage, and has insufficient luminous efficiency and short lifetime.

Further, Patent Document 2 discloses an organic EL device using a polymer obtained by co-polymerizing a vinyl anthracene derivative and a vinyl carbazole derivative. However, the device has problems that the luminous efficiency is poor and the lifetime is short.

On the other hand, various studies have been made on a high-molecular weight electroluminescence material since it can be formed into a film by applying the solution thereof and printing (Patent Documents 3 to 7).

However, it has problems that an organic EL device using the above mentioned high-molecular weight compound does not always have sufficient device properties such as a long life (half life) and a high luminous efficiency.

Further, as a material for a hole-transporting layer or a material for an emitting layer, many high-molecular weight materials using a carbazole unit have been studied. However, in the both cases of a material for a hole-transporting layer (Patent Documents 8 and 9) and a material for an emitting layer (Patent Documents 10 to 13), since high-molecular weight materials are synthesized by random co-polymerization, the resulting device has low reproducibility. In addition, it has problems that partial structural defects occur due to an irregular main chain skeleton and trap of holes occurs, thereby to lower the device performances (efficiency, lifetime).

Moreover, the materials for a hole-transporting layer disclosed in Patent Documents 8 and 9 have a problem that the resulting devices have deteriorated performances (efficiency, lifetime) due to poor adhesion to a hole-injecting layer or insufficient surface flatness of a hole-transporting layer obtained.

RELATED ART DOCUMENTS

Patent Documents

Patent Document 1: JP-A-H2-223188
Patent Document 2: JP-A-H8-48726
Patent Document 3: JP-A-2005-272834
Patent Document 4: JP-A-2007-119763
Patent Document 5: JP-A-2007-162009
Patent Document 6: JP-A-2007-177225
Patent Document 7: WO2005/049546

Patent Document 8: JP-A-2010-065087
Patent Document 9: JP-A-2009-283509
Patent Document 10: JP-A-2003-12777
Patent Document 11: JP-A-2006-510231
Patent Document 12: JP-A-2008-531822
Patent Document 13: JP-A-2008-537560

SUMMARY OF THE INVENTION

The invention is aimed at providing a polymer which is suited to the formation of a thin film by a coating method and is preferable as a material for organic electronics.

As a result of extensive studies, the inventors have found that a high-molecular weight compound having as a repeating unit a structure in which 2 to 5 carbazoles or groups similar to carbazole (P group mentioned later) are bonded with each other, the structure being substituted by a carbazole skeleton, a dibenzofuran skeleton, a dibenzothiophene skeleton or a fluorene skeleton, is useful for increasing the luminous efficiency and prolonging the lifetime of an organic EL device obtained. The invention has been made based on this finding.

According to the invention, the following polymer or the like are provided.

1. A polymer comprising a structural unit represented by the following formula (A):

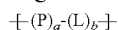  (A)

wherein in the formula (A), P is independently a group represented by the following formula (P);

a is an integer of 2 to 5, (P)a means that "a" Ps are bonded sequentially in which "a" is the number of Ps, and the "a" Ps may be the same or different;

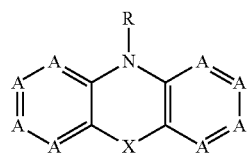  (P)

wherein in the formula (P), A is independently a nitrogen atom or CR;

X is a single bond, O, S, C(R)$_2$ or NR;

R is independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, a substituted or unsubstituted arylsily group or a single bond used for bonding to another P or L;

provided that at least one R contained in (P)a is represented by any one of the following formulas (3) to (7);

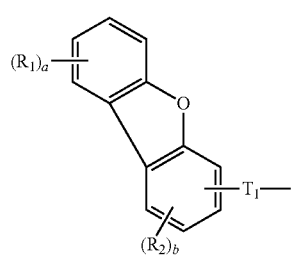  (3)

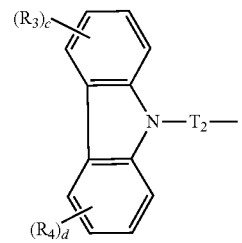  (4)

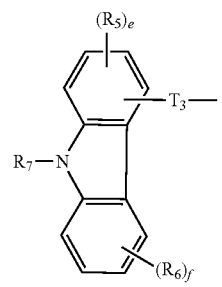  (5)

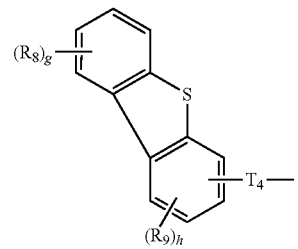  (6)

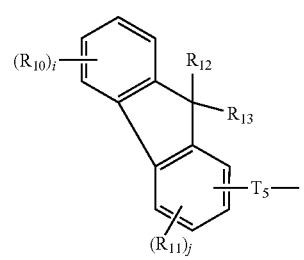  (7)

wherein $R_1$ to $R_{13}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted or unsubstituted alkylamino group, a substituted or unsubstituted arylamino group, a silyl group substituted by one or more selected from alkyl groups and aryl groups, a halogen atom, a nitro group, a cyano group or a hydroxyl group, a, c, d, f, g and i are independently an integer of 0 to 4;

b, e, h and j are independently an integer of 0 to 3;

$T_1$ to $T_5$ are independently a single bond or a substituted or unsubstituted arylene group including 6 to 50 ring carbon atoms;

L is a linkage group;

b is an integer of 0 to 5, (L)b means, when b is 2 or more, "b" Ls are bonded sequentially in which b is the number of b, and in this case, "b" Ls may be the same or different, and bonding position of Ls is not limited; and
when b is 0, (L)b is a single bond.
2. The polymer according to 1, wherein P is independently a substituted or unsubstituted carbazole residue.
3. The polymer according to 2, wherein bonding position of adjacent carbazole residues in the "a" carbazole residues being bonded sequentially in which "a" is the number of the carbazole residues is one selected from the $3^{rd}$-$3'^{rd}$ position, the $3^{rd}$-$2'^{md}$ position and the $2^{nd}$-the $2'^{md}$ position.
4. The polymer according to any of 1 to 3, wherein (P)a is "a" carbazole residues being bonded sequentially in which "a" is the number of the carbazole residues, and the carbazole residue that is bonded with L is bonded with L at the $9^{th}$, $3^{rd}$ or $2^{nd}$ position of the carbazole residue.
5. The polymer according to any of 1 to 4, wherein a is 2 or 3.
6. The polymer according to any of 1 to 5, which has a structure represented by any of the following formulas (8) to (36):

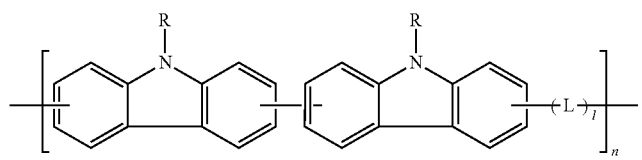

(8)

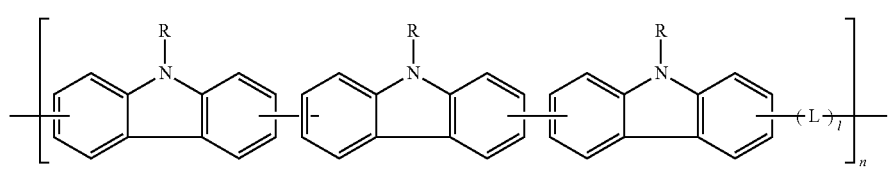

(9)

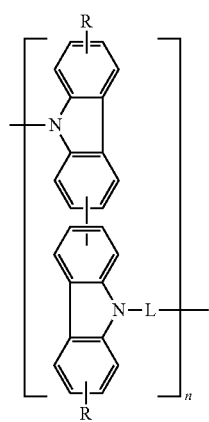

(10)

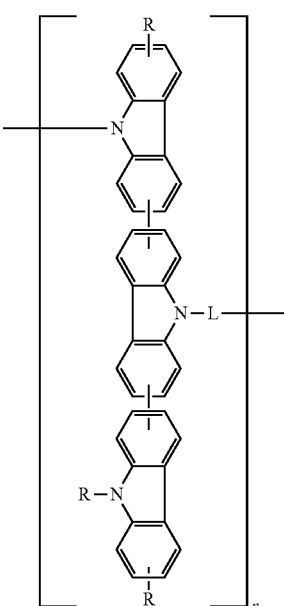

(11)

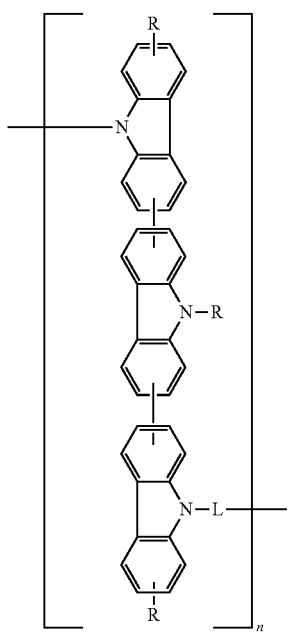
(12)
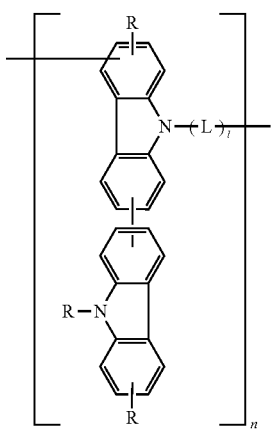
(13)
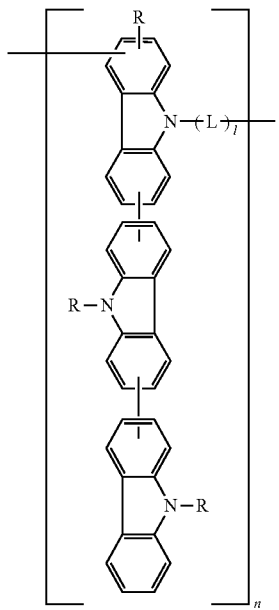
(14)
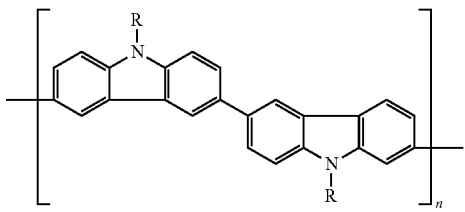
(15)
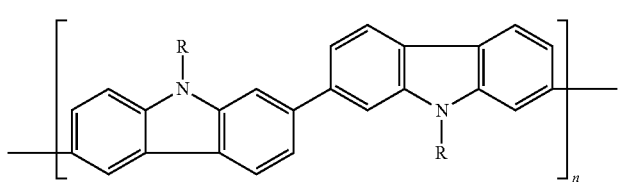
(16)

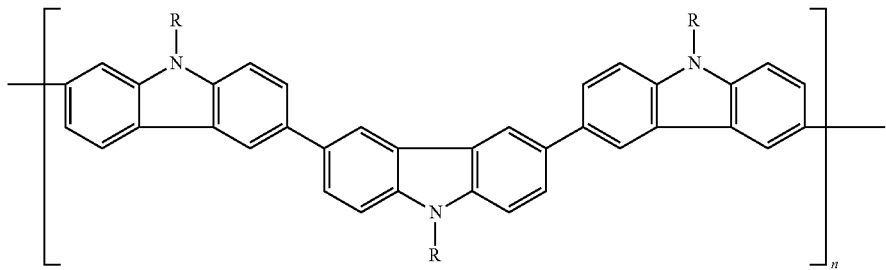
(17)
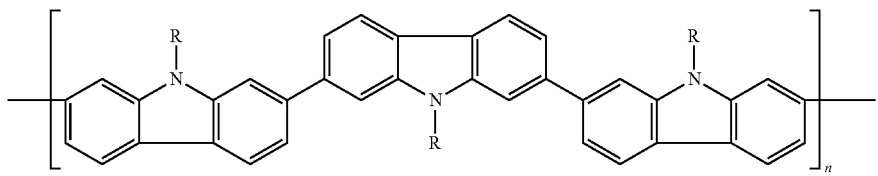
(18)
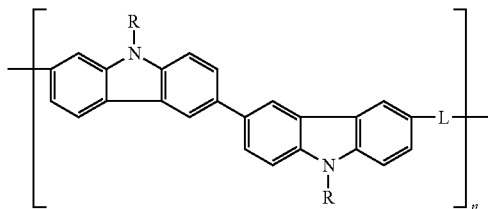
(19)
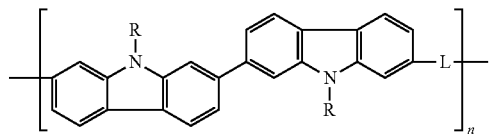
(20)
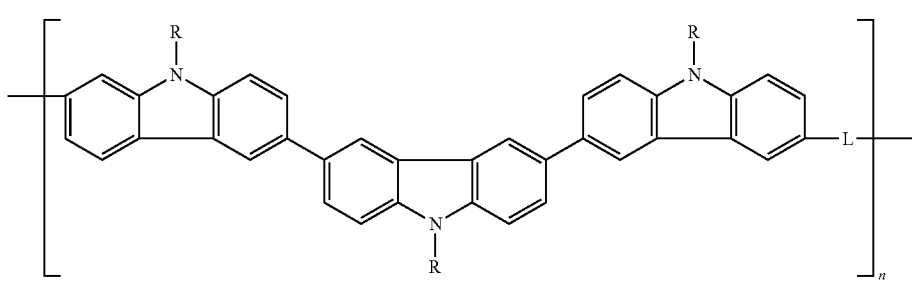
(21)
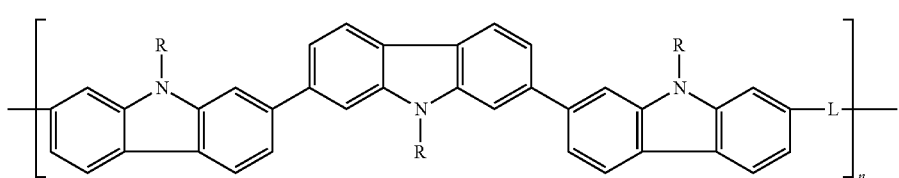
(22)

-continued
(23)
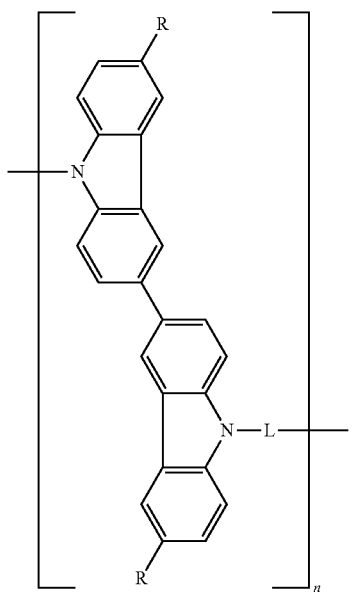
(24)
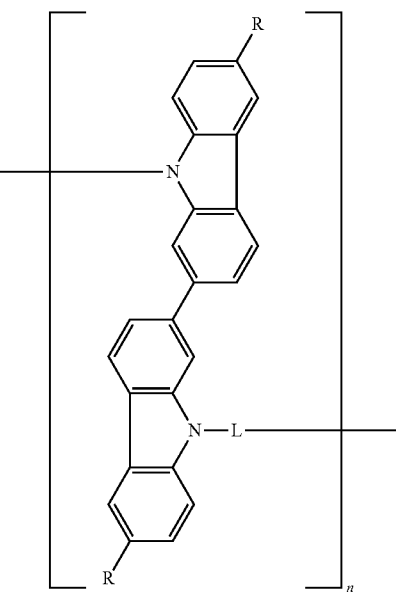
(25)
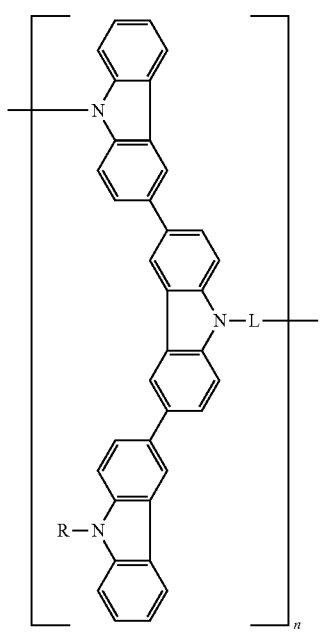
(26)
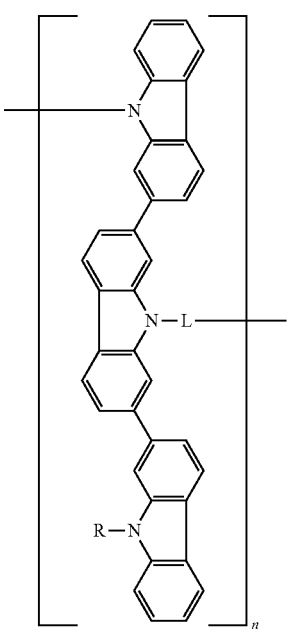

-continued
(27) 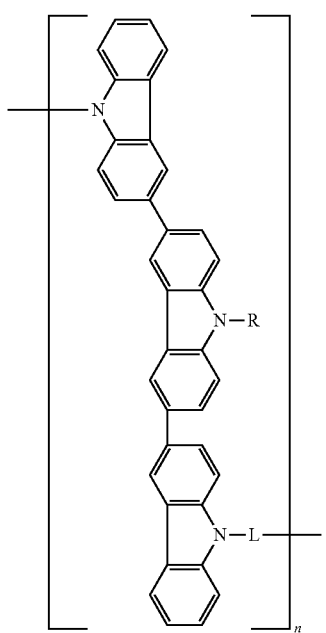
(28) 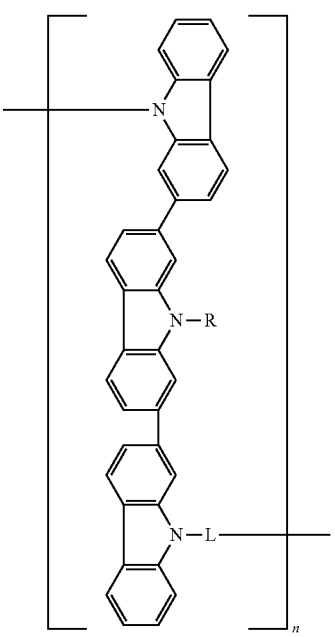
(29) 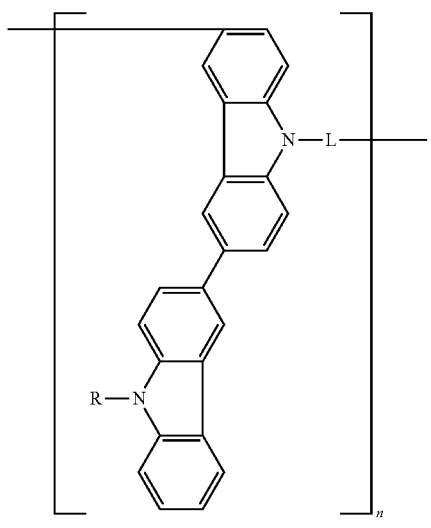
(30) 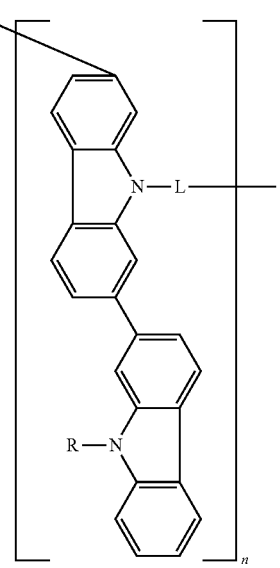

-continued
(31)
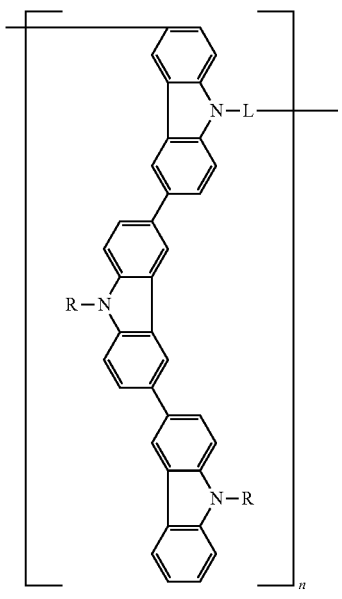
(32)
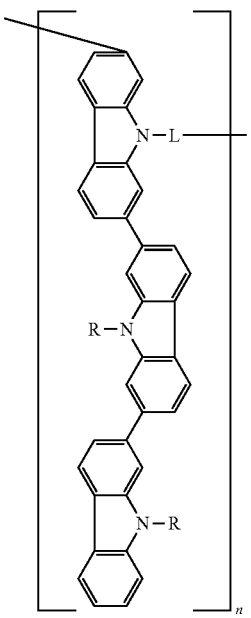
(33)
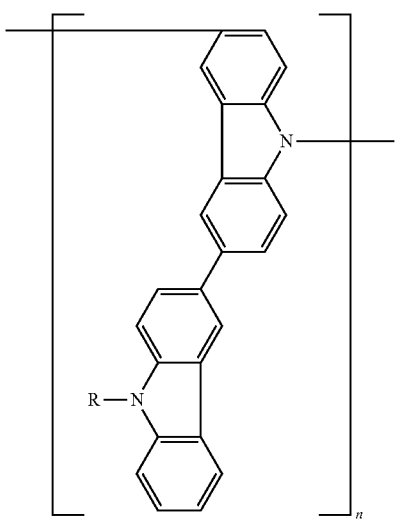
(34)
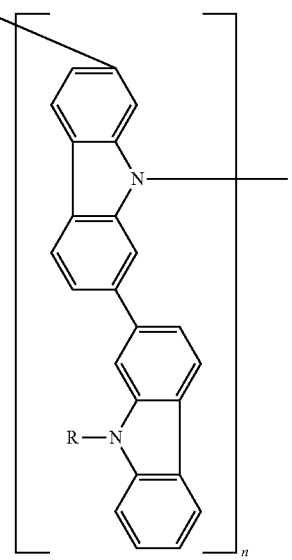

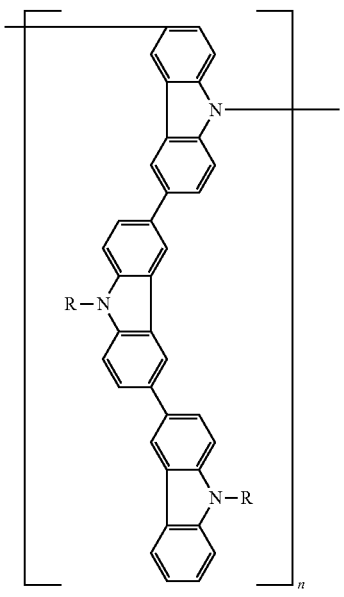

(35)

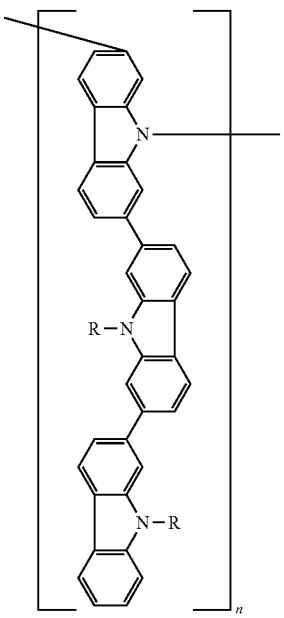

(36)

wherein in the formulas (8) to (36), R is independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or an arylsilyl group; and provided that, in each of the formulas, at least one R is independently represented by any of the following formulas (3) to (7):

(3)

![Formula 3: dibenzofuran with $(R_1)_a$, $(R_2)_b$, $T_1$]

(4)

![Formula 4: carbazole with $(R_3)_c$, $(R_4)_d$, N—$T_2$]

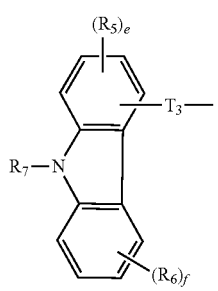

(5)

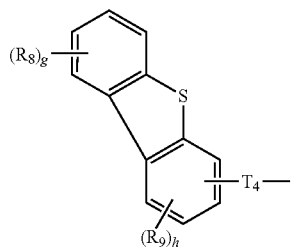

(6)

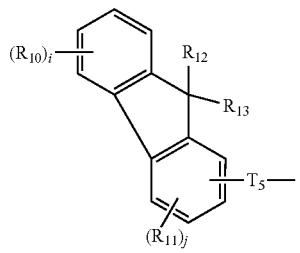

(7)

wherein $R_1$ to $R_{13}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 ring carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3;

$T_1$ to $T_5$ are independently a single bond or a substituted or unsubstituted arylene group including 6 to 50 ring carbon atoms;

l is 0 or 1;

n is the repeating number; and

L is a linkage group.

7. A coating liquid comprising the polymer according to any of 1 to 6 and a solvent.

8. The coating liquid according to 7, wherein at least one of the solvents is an organic solvent.

9. A method for producing an electronic device, wherein at least one film constituting an electronic device is formed into a film by a wet method by using the coating liquid according to 7 or 8.

10. The method for producing an electronic device according to 9, wherein the electronic device is an electroluminescence device, a photoelectronic conversion device or a transistor.

11. The method for producing an electronic device according to 9 or 10, wherein the electronic device is an organic electroluminecence device.

12. An organic electroluminecence device comprising:

an anode and a cathode;

one or more organic thin film layers including an emitting layer between the anode and the cathode; and at least one of the organic thin film layers comprising the polymer according to any of 1 to 6.

13. The organic electroluminecence device according to 12, wherein at least one of the organic thin film layers is a hole-injecting layer or a hole-transporting layer.

14. The organic electroluminecence device according to 13, wherein the hole-injecting layer or the hole-transporting layer is in contact with the emitting layer.

15. The organic electrolumnecence device according to any of 12 to 14, wherein the emitting layer is formed by a wet film formation method.

According to the invention, it is possible to provide a polymer suited to formation of a thin film by a coating method and is preferable as a material for organic EL device.

MODE FOR CARRYING OUT THE INVENTION

The polymer according to the invention has a structural unit represented by the following formula (A):

(A)

In the formula (A), P is independently a group represented by the following formula (P).

a is an integer of 2 to 5, and (P)a means that "a" Ps are bonded sequentially. a is preferably 2 or 3. When a is 2 or 3, two or three kinds of substituents (any one of the following formulas (3) to (7)) can be easily combined. Depending on the combination, the adhesiveness of the resulting thin film can be improved and, in addition, the electronic property thereof is adjustable.

"a" Ps may be the same or different.

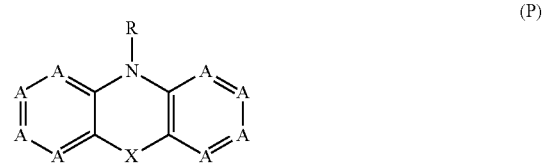
(P)

wherein in the formula (P), A is independently a nitrogen atom or CR.

X is a single bond, O, S, $C(R)_2$ or NR.

R is independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, a substituted or unsubstituted arylsily group or a single bond used for bonding to another P or L.

However, at least one R in (P)a is represented by any of the following formulas (3) to (7).

Meanwhile, P does not bond to another P (another P in the same structural unit or P in another structural unit) or L (L in the same structural unit or L in another structural unit) through a group represented by the following formulas (3) to (7).

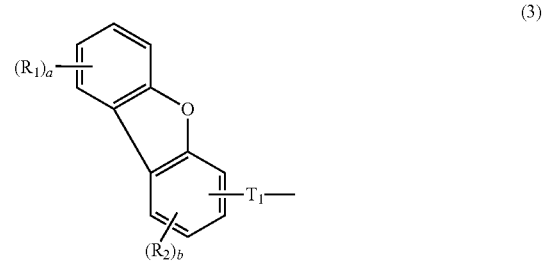
(3)

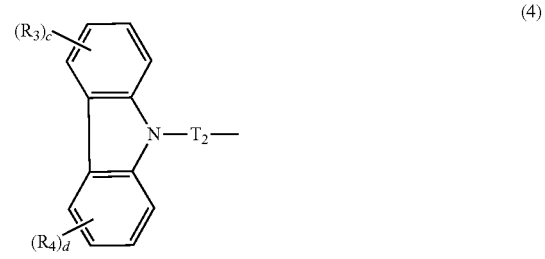
(4)

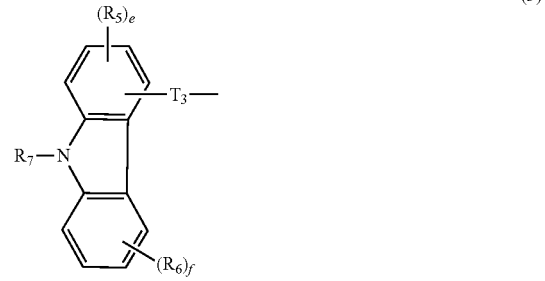
(5)

-continued (6)
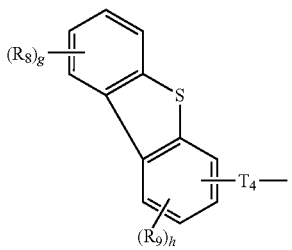

(7)
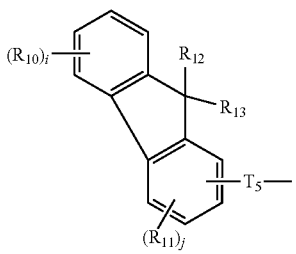

wherein in the formulas (3) to (7), $R_1$ to $R_{13}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group.

$R_7$ is preferably a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted amino group or a substituted silyl group.

As the group represented by the formula (3), a 2-dibenzofuranyl group and a 4-dibenzofuranyl group are preferable. As the group represented by the formula (6), a 2-dibenzothiophenyl group and a 4-dibenzothiophenyl group are preferable.

a, c, d, f, g and i are independently an integer of 0 to 4.
b, e, h and j are independently an integer of 0 to 3.

$T_1$ to $T_5$ are independently a single bond or a substituted or unsubstituted arylene group including 6 to 50 ring carbon atoms.

L is a linkage group. Preferably, L is independently a substituted or unsubstituted alkylene group having 1 to 20 carbon atoms, a substituted or unsubstituted cycloalkylene group having 3 to 10 ring carbon atoms, a substituted or unsubstituted aromatic hydrocarbon ring group having 6 to 30 ring carbon atoms, a substituted or unsubstituted aromatic heterocyclic group having 3 to 30 ring atoms, a substituted or unsubstituted arylamine residue or a substituted or unsubstituted arylsilane residue. It is more preferred that L be a substituted or unsubstituted phenyl group, a substituted or unsubstituted naphthyl group or a substituted or unsubstituted fluorenyl group. As the substituted fluorenyl group, a fluorenyl group substituted by one or two or more alkyl groups can be given, for example.

b is an integer of 0 to 5. Preferably, b is 0, 1 or 2. (L)b means that, when b is 2 or more, "b" Ls are bonded sequentially. In this case, "b" Ls may be the same or different. No specific restrictions are imposed on the bonding position of Ls. When b is 0, (L)b means a single bond.

In the formula (A), it is preferred that P be independently a substituted or unsubstituted carbazole residue.

In the formula (A), when P is independently a substituted or unsubstituted carbazole residue, the bonding position of adjacent carbazole residues in the "a" substituted or unsubstituted carbazole residues being bonded sequentially is preferably one selected from the $3^{rd}$ position-the $3'^{rd}$ position, the $3^{rd}$ position-$2'^{rd}$ position or the $2^{nd}$ position-$2'^{rd}$ position.

As examples, the bonding form that carbazole residues are bonded at the $3^{rd}$ position-the $3'^{rd}$ position is shown below.

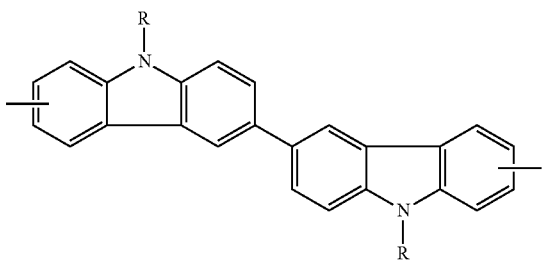

As examples, the bonding form that carbazole residues are bonded at the $3^{rd}$ position-the $2'^{rd}$ position is shown below.

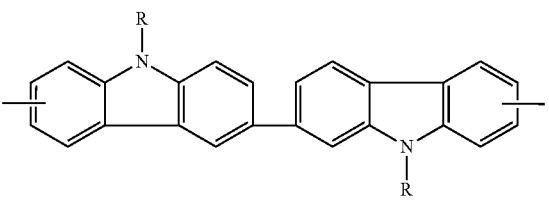

As examples, the bonding form that carbazole residues are bonded at the $2^{nd}$ position-the $2'^{rd}$ position is shown below.

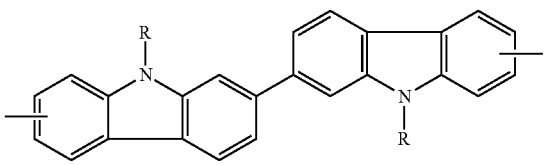

It is preferred that (P)a be "a" carbazole residues being bonded sequentially, and the carbazole residue is bonded with L at the $9^{th}$, $3^{rd}$ or $2^{nd}$ position of the carbazole residue.

As examples, the bonding form that a carbazole residue is bonded with L at the $9^{th}$ position of the carbazole residue is shown below.

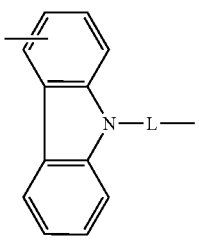

As examples, the bonding form that a carbazole residue is bonded with L at the 3$^{rd}$ position of the carbazole residue is shown below.

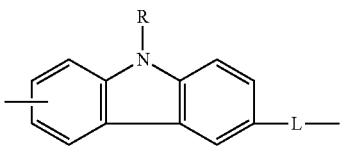

As examples, the bonding form that a carbazole residue is bonded with L at the 2$^{nd}$ position of the carbazole residue is shown below.

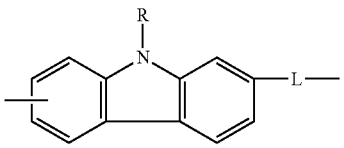

The polymer of the invention is normally an alternating co-polymer, which has regularity in a main chain skeleton. Hence, the polymer has a small amount of structural defects, whereby the performances (efficiency, lifetime) of the resulting organic EL device can be improved. In addition, the reproducibility of the device performance is excellent. In particular, since the polymer has a specific skeleton such as a carbazole skeleton as a repeating unit, the adhesiveness of the resulting thin film can be improved.

Therefore, the polymer of the invention can be formed into a good thin film stably and easily, thereby increasing the luminous efficiency and the life of an organic EL device using the polymer.

In addition, the polymer of the invention has a high surface flatness after film formation.

Hereinbelow, an explanation will be given on each of the above-mentioned groups.

The "hydrogen atom" in this application includes detrium and tritium. The "ring carbon atom" means carbon atoms that constitute a saturated ring, an unsaturated ring or an aromatic ring, and the "ring atom" means carbon atoms and hetero atoms that constitute a hetero ring (including a saturated ring, an unsaturated ring and an aromatic ring).

As the substituted or unsubstituted alkyl group having 1 to 20 carbon atoms, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decanyl group, an n-undecanyl group, an n-dodecanyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group or the like can be given. Of these, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group and an n-nonyl group are preferable.

As the alkylene group (alkane residue) of L, residues corresponding to the above-mentioned alkyl group can be given.

As the substituted or unsubstituted cycloalkyl group having 3 to 10 ring carbon atoms, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a 1-adamantyl group, a 2-adamantyl group, a 1-norbornyl group, a 2-norbornyl group or the like can be given. Of these, a cyclopentyl group and a cyclohexyl group are preferable.

As the cycloalkylene group (cycloalkane residue) of L, residues corresponding to the above-mentioned cycloalkyl group can be given.

As the substituted or unsubstituted aryl group (monovalent aromatic hydrocarbon group) having 6 to 50 (preferably 6 to 30) ring carbon atoms, a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a biphenyl-2-yl group, a biphenyl-3-yl group, a biphenyl-4-yl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, a o-tolyl group, a m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl-4-yl group, a 4"-t-butyl-p-terphenyl-4-yl group, a fluorene-1-yl group, a fluorene-2-yl group, a fluorene-3-yl group, a fluorene-4-yl group or the like can be given.

Of these, a phenyl group, a 1-naphthyl group, a 2-naphthyl group, a 1-anthryl group, a 2-anthryl group, a 9-anthryl group, a biphenyl-2-yl group, a biphenyl-3-yl group, a biphenyl-4-yl group, a p-terphenyl-4-yl group, a p-terphenyl-3-yl group, a p-terphenyl-2-yl group, an o-tolyl group, an m-tolyl group, a p-tolyl group, a fluorene-2-yl group, and a fluorene-3-yl group are preferable. A phenyl group, a 1-naphthyl group, a 2-naphthyl group, m-tolyl group, a p-tolyl group, a fluorene-2-yl group, and a fluorene-3-yl group are more preferable.

As a divalent of larger group of the aromatic hydrocarbon ring group, a group obtained by removing a hydrogen atom from the above-mentioned aryl group can be mentioned.

As the substituted or unsubstituted heteroaryl group (monovalent aromatic heterocyclic group) having 3 to 30 ring atoms, a 1-pyrrolyl group, 2-pyrrolyl group, 3-pyrrolyl group, pyrazinyl group, 2-pyridinyl group, 3-pyridinyl group, 4-pyridinyl group, 2-pyrimidyl group, 4-pyrimidyl group, triazinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-dibenzofuranyl group, 4-dibenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 2-thienyl group, 3-thienyl group, 2-benzothiphenyl group, 3-thiophenyl group, 4-thiophenyl group, 5-thiophenyl group, 6-thiophenyl group, 7-thiophenyl group, 1-isothiophenyl group, 3-isothiophenyl group, 4-isothiophenyl group, 5-isothiophenyl group, 6-isothiophenyl group, 7-isothiophenyl group, 2-dibenzothiophenyl group, 4-dibenzothiophenyl group or the like can be given.

A 1-pyrrolyl group, a 2-pyrrolyl group, a 3-pyrrolyl group, a 1-carbazolyl group, a 2-carbazolyl group, a 3-carbazolyl group, a 4-carbazolyl group, a 9-carbazolyl group, a 2-dibenzofuranyl group, a 4-dibenzofranyl group, a 2-dibenzothiophenyl group, and a 4-dibenzothiophenyl group are preferable.

As a divalent or larger group of the aromatic heterocyclic group, a group obtained by removing a hydrogen atom from the above-mentioned heteroaryl group can be given.

As the substituted amino group, a substituted or unsubstituted mono- or dialkylamino group or a substituted or unsubstituted mono- or diarylamino group can be given.

As the alkylamino group, a monoalkylamino group or a dialkylamino group can be given. In particular, an amino group of which the alkyl part is the above-mentioned alkyl group can be given. In the mono- or dialkylamino group, one of which the alkyl part has 1 to 20 carbon atoms is preferable.

As the arylamino group, a monoarylamino group, a diarylamino group and an alkylarylamino group can be given. In the mono- or diarylamino group, one of which the aryl part has 6 to 30 carbon atoms is preferable. As examples of the aryl group bonding to a nitrogen atom, the above-mentioned aryl group can be given.

As the arylamine residue of L, a triarylamine residue and an alkylarylamine residue can be given. As examples of the alkyl group and the aryl group bonding to the nitrogen atom, the aryl group and the alkyl group mentioned above can be given.

As the arylsilyl group, a monoarylsilyl group, a diarylsilyl group, a triarylsilyl group and an alkylarylsilyl group can be given. As examples of the aryl group and alkyl group bonding to the silicon atom, the aryl group and the alkyl group mentioned above can be given.

As the arylsilane residue of L, a monoarylsilane residue, a diarylsilane residue and an alkylarylsilane residue can be given. As examples of the aryl group and the alkyl group bonding to the silicon atom, the aryl group and the alkyl group mentioned above can be given.

As the substituted silyl group, a silyl group substituted by an alkyl group and/or an aryl group can be given. As examples of the alkyl group and the aryl group bonding to the silicon atom, the aryl group and the alkyl group mentioned above can be given. The alkyl groups substituting the silyl group may be the same or different. Similarly, the aryl groups substituting the silyl group may be the same or different.

Specifically, as the trialkylsilyl group, a trimethylsilyl group, a vinyldimethylsilyl group, a triethylsilyl group, a tripropylsilyl group, a propyldimethylsilyl group, a tributylsilyl group, a t-butyldimethylsilyl group, a tripentylsilyl group, a triheptylsilyl group, a trihexylsilyl group or the like can be given. A trimethylsilyl group and a triethylsilyl group are preferable.

As the triarylsilyl group, a triphenylsilyl group, a trinaphthylsilyl group or the like can be given. Of these, a triphenylsilyl group is preferable.

As the alkylarylsilyl group, a dimethylphenylsilyl group, a diethylphenylsilyl group, a diphenylmethylsilyl group, an ethyldiphenylsilyl group or the like can be given. Of these, a diphenylmethylsilyl group and an ethyldiphenylsilyl group are preferable.

The alkoxy group having 1 to 20 carbon atoms is represented by —OY. As examples of Y, the above-mentioned examples of the alkyl group can be given. The alkoxy group is, a methoxy group or an ethoxy group, for example.

The cycloalkoxy group having 3 to 10 ring carbon atoms is represented by —OY. As examples of Y, the above-mentioned examples of the cycloalkyl group can be given. The cycloalkyl group is, for example, a cyclopentyloxy group or a cyclohexyloxy group.

The aryloxy group having 6 to 30 ring carbon atoms is represented by —OY. As examples of Y, the above-mentioned examples of the aromatic hydrocarbon ring can be given. The aryloxy group is, for example, a phenoxy group.

The aralkyl group having 7 to 40 carbon atoms is represented by —Y—Z. As examples of Y, the above-mentioned examples of the alkylene group corresponding to the above-mentioned examples of the alkyl group can be given. As examples of Z, the above-mentioned examples of the aryl group can be given. The aryl part of the aralkyl group has preferably 6 to 30 carbon atoms. It is preferred that the alkyl part have 1 to 10 carbon atoms, with 1 to 6 carbon atoms being particularly preferable. A benzyl group, a phenylethyl group and a 2-phenylpropane-2-yl group can be given, for example.

As the halogen atom, a fluorine atom, a chlorine atom and a bromine atom can be given, with a fluorine atom being preferable.

The substituents of the above-mentioned various groups are independently a linear or branched alkyl group having 1 to 20 carbon atoms, an alkoxy group having 1 to 20 carbon atoms, a linear or branched alkenyl group having 2 to 20 carbon atoms, a cycloalkyl group having 3 to 20 ring carbon atoms, a trialkylsilyl group having an alkyl group having 1 to 20 carbon atoms, a triarylsilyl group having an aryl group having 6 to 24 ring carbon atoms, an alkylarylsilyl group having an alkyl group having 1 to 20 carbon atoms and an aryl group having 6 to 24 ring carbon atoms, an aryl group having 6 to 24 ring carbon atoms, a heteroaryl group having 5 to 24 ring atoms, a halogen atom or a cyano group. Specifically, the aryl group, the alkyl group, the cycloalkyl group, the trialkylsilyl group, the triarylsilyl group, the alkylarylsilyl group, the heteroaryl group, the halogen atom or the cyano group as mentioned above can be given. Further, these groups may have the same substituents.

As the alkenyl group, a substituent having an unsaturated bond within the molecule of the above-mentioned alkyl group can be given.

Suitable examples of the structure contained in the polymer of the invention are shown below:

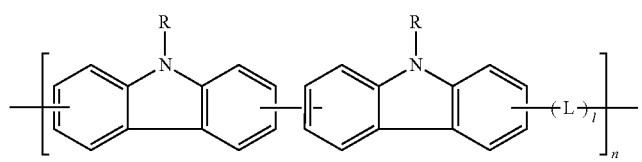

(8)

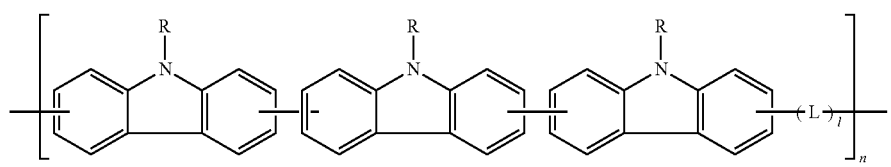

(9)

(10)

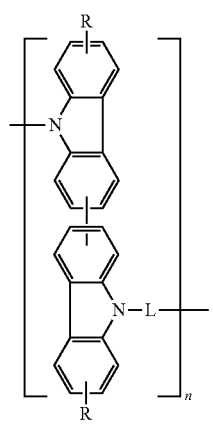

(11)

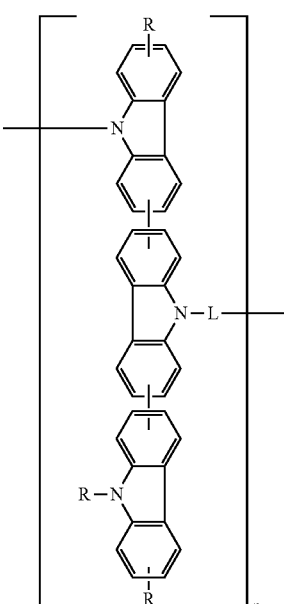

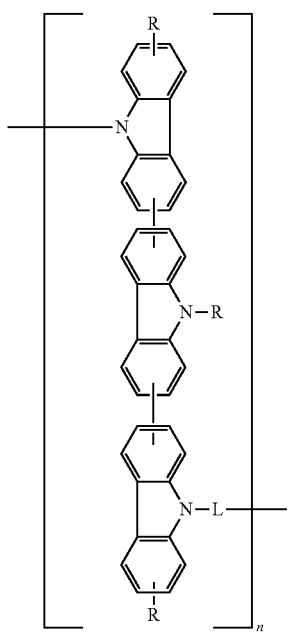
(12)
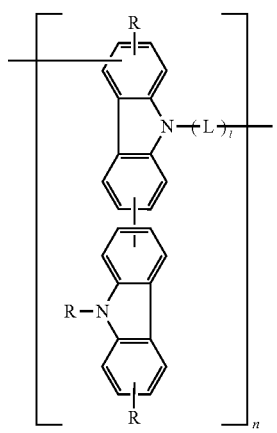
(13)
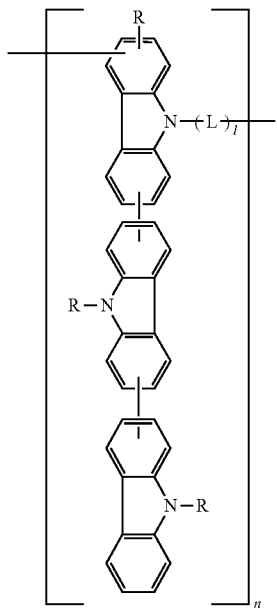
(14)
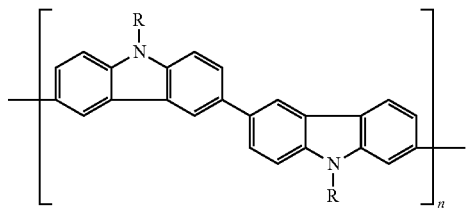
(15)
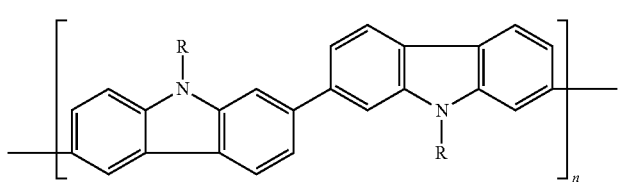
(16)

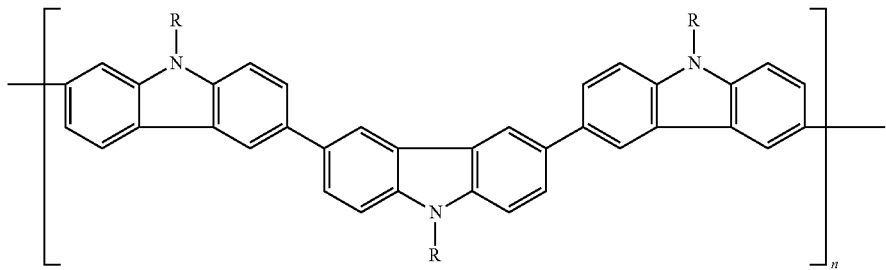
(17)
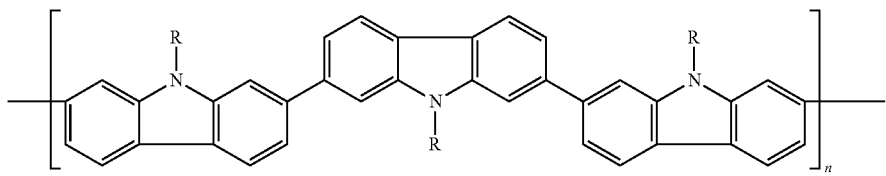
(18)
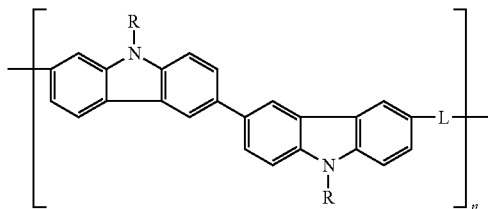
(19)
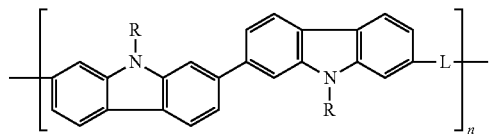
(20)
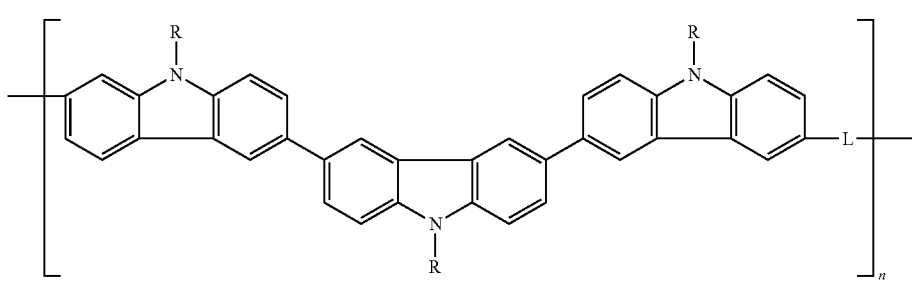
(21)
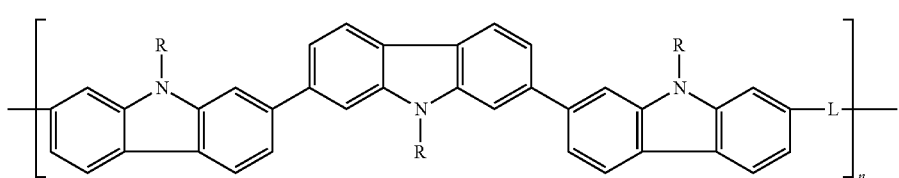
(22)

-continued
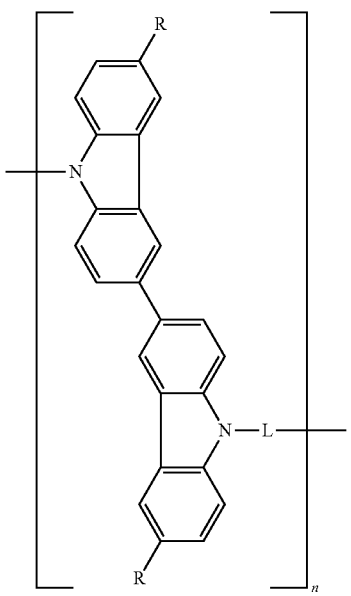 (23)
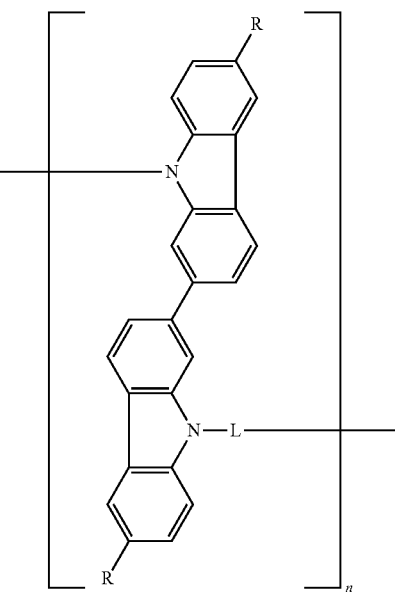 (24)
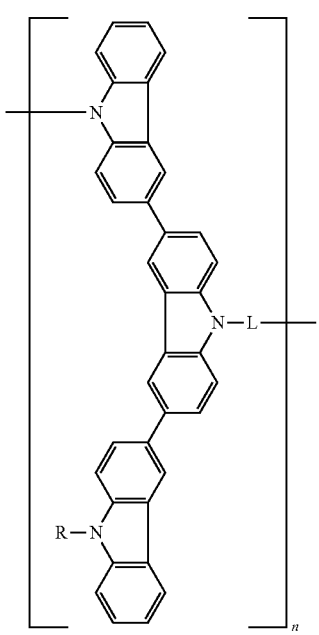 (25)
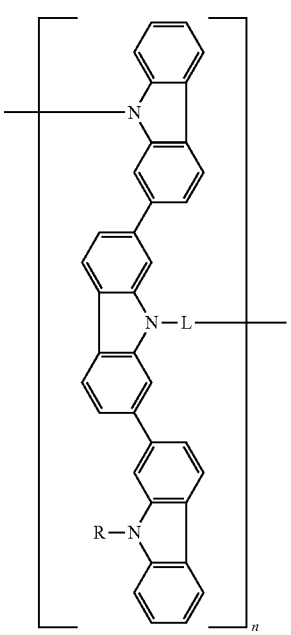 (26)

(27)
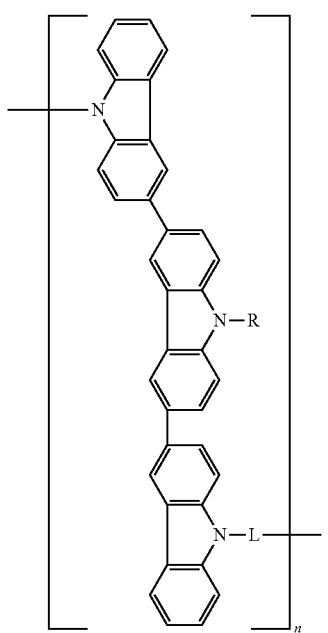
(28)
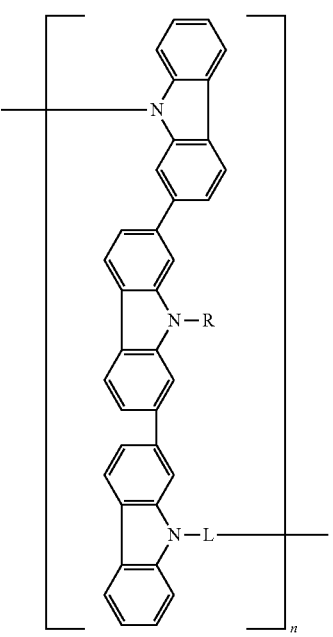
(29)
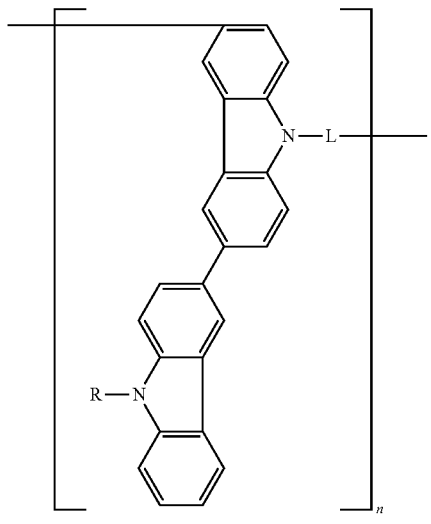
(30)
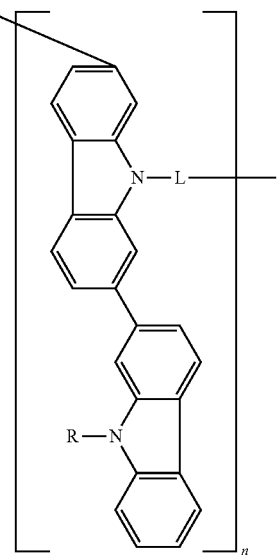

-continued
(31)
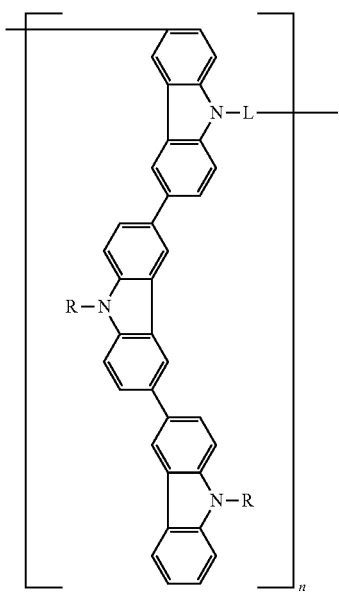
(32)
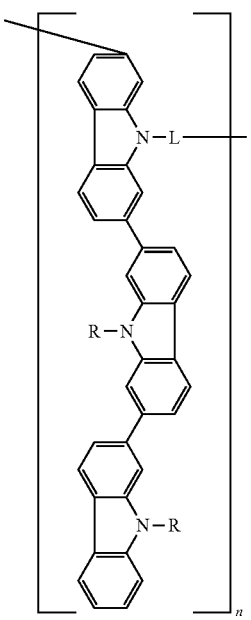
(33)
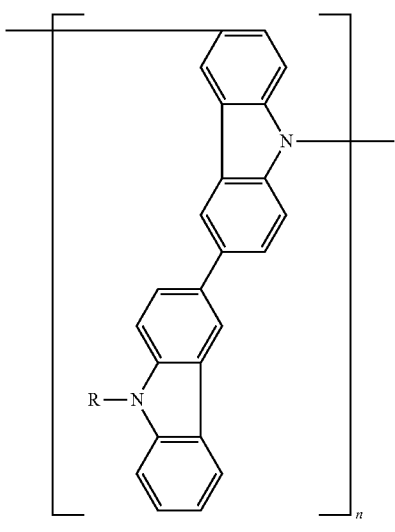
(34)
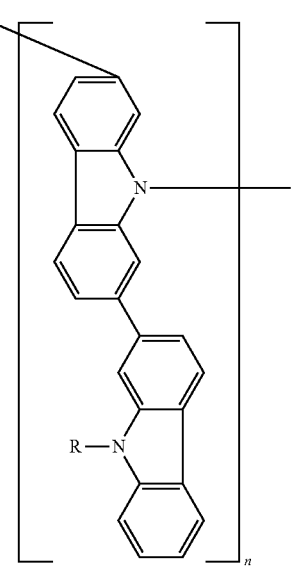

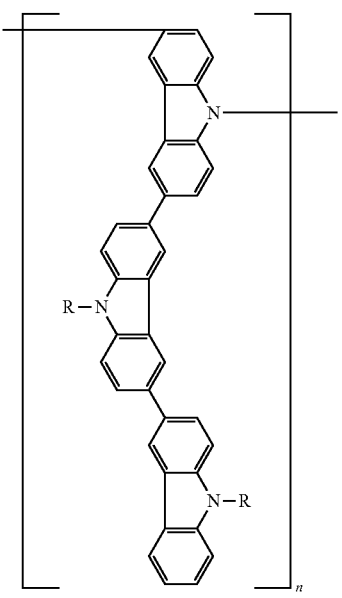

(35)

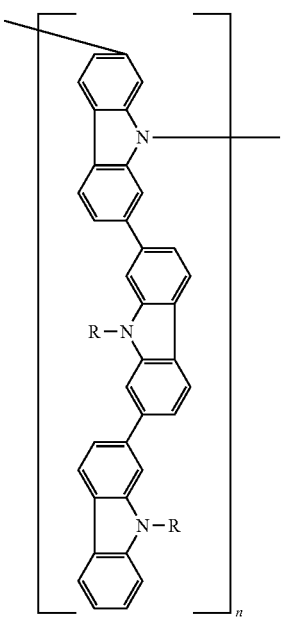

(36)

In the formulas (8) to (36), R and L are the same as in the formula (A). l is independently 0 or 1. n is the repeating number.

No specific restrictions are imposed on the molecular weight of the polymer of the invention, and the polymer includes an oligomer (larger than a dimer) to an ultra-high molecular weight polymer.

The polymer has a number average molecular weight (Mn) of preferably $10^3$ to $10^8$, more preferably $5\times10^3$ to $10^6$. The polymer has a weight average molecular weight (Mw) of preferably $10^3$ to $10^8$, more preferably $5\times10^3$ to $10^6$. Further, the molecular weight distribution represented by Mw/Mn is not particularly restricted, but preferably 10 or less, with 3 or less being particularly preferable.

If the molecular weight of the polymer is too large, a homogenous film cannot be formed during device fabrication due to gelation. On the other hand, if the molecular weight is too small, control of solubility may become difficult.

The number average molecular weight and the weight average molecular weight can be obtained by using size exclusion chromatography (SEC) and by calibrating with standard polystyrene.

The polymer of the invention can be obtained by polymerizing a polymerizable monomer corresponding to P of the structural unit (A) and, if necessary, a polymerizable monomer corresponding to L.

No specific restrictions are imposed on the polymerization method, and a Suzuki polymerization method in which a dihalide derivative and a diboronic acid derivative or a boronic acid ester derivative corresponding to each of the above groups are subjected to a coupling reaction with a palladium catalyst is desirable. As for the halogen of the dihalide derivative, Br or I is more preferable as compared with Cl. The dehalide derivative is more preferably coupled to a boronic acid ester derivative than boronic acid. In particular, a boronic acid ester derivative, a dipinacol ester derivative and a di-1,3-propane diol derivative are preferable.

As the polymer of the application, the following compounds can be given. However, the polymer is not restricted thereto.

Groups represented by H-1 to 11 are as below:

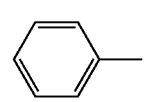

H-1

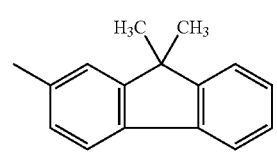

H-2

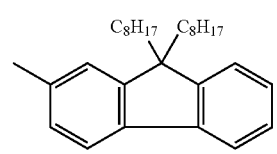

H-3

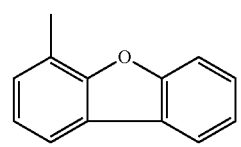

H-4

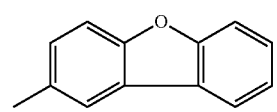

H-5

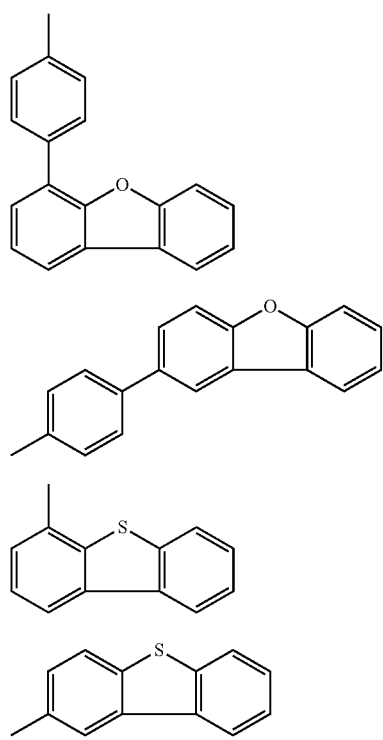
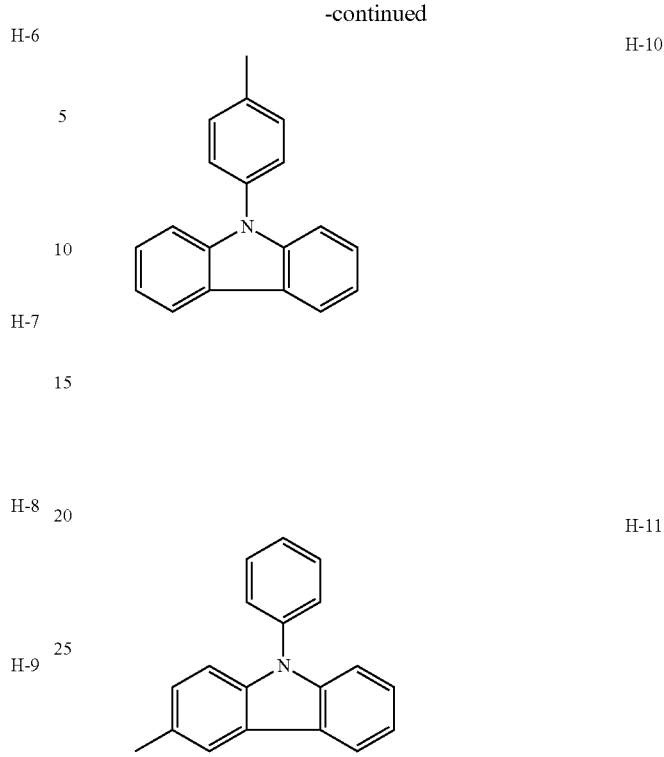
TABLE 1
(P1)
| Compound | R₁ = R₂ | Y | Compound | R₁ | R₂ | Y |
|---|---|---|---|---|---|---|
| P1-1 | H-2 | H-1 | P1-11 | H-2 | H-1 | H-1 |
| P1-2 | H-3 | | P1-12 | H-3 | | |
| P1-3 | H-4 | | P1-13 | H-4 | | |
| P1-4 | H-5 | | P1-14 | H-5 | | |
| P1-5 | H-6 | | P1-15 | H-6 | | |
| P1-6 | H-7 | | P1-16 | H-7 | | |
| P1-7 | H-8 | | P1-17 | H-8 | | |
| P1-8 | H-9 | | P1-18 | H-9 | | |
| P1-9 | H-10 | | P1-19 | H-10 | | |
| P1-10 | H-11 | | P1-20 | H-11 | | |
TABLE 2
(P2)
| Compound | R₁ = R₂ | Y | Compound | R₁ | R₂ | Y |
|---|---|---|---|---|---|---|
| P2-1 | H-2 | H-1 | P2-11 | H-2 | H-1 | H-1 |
| P2-2 | H-3 | | P2-12 | H-3 | | |

TABLE 2-continued (P2)

| Compound | $R_1 = R_2$ | Y | Compound | $R_1$ | $R_2$ | Y |
| --- | --- | --- | --- | --- | --- | --- |
| P2-3 | H-4 | | P2-13 | H-4 | | |
| P2-4 | H-5 | | P2-14 | H-5 | | |
| P2-5 | H-6 | | P2-15 | H-6 | | |
| P2-6 | H-7 | | P2-16 | H-7 | | |
| P2-7 | H-8 | | P2-17 | H-8 | | |
| P2-8 | H-9 | | P2-18 | H-9 | | |
| P2-9 | H-10 | | P2-19 | H-10 | | |
| P2-10 | H-11 | | P2-20 | H-11 | | |

TABLE 3

(P3)

| Compound | $R_1 = R_2$ | Y | Compound | $R_1$ | $R_2$ | Y |
| --- | --- | --- | --- | --- | --- | --- |
| P3-1 | H-2 | H-1 | P3-11 | H-2 | H-1 | H-1 |
| P3-2 | H-3 | | P3-12 | H-3 | | |
| P3-3 | H-4 | | P3-13 | H-4 | | |
| P3-4 | H-5 | | P3-14 | H-5 | | |
| P3-5 | H-6 | | P3-15 | H-6 | | |
| P3-6 | H-7 | | P3-16 | H-7 | | |
| P3-7 | H-8 | | 3-17 | H-8 | | |
| P3-8 | H-9 | | 3-18 | H-9 | | |
| P3-9 | H-10 | | P3-19 | H-10 | | |
| P3-10 | H-11 | | P3-20 | H-11 | | |

TABLE 4

(P4)

| Compound | $R_1 = R_2$ | Y | Compound | $R_1$ | $R_2$ | Y |
| --- | --- | --- | --- | --- | --- | --- |
| P4-1 | H-2 | H-1 | P4-11 | H-2 | H-1 | H-1 |
| P4-2 | H-3 | | P4-12 | H-3 | | |
| P4-3 | H-4 | | P4-13 | H-4 | | |
| P4-4 | H-5 | | P4-14 | H-5 | | |
| P4-5 | H-6 | | P4-15 | H-6 | | |
| P4-6 | H-7 | | P4-16 | H-7 | | |
| P4-7 | H-8 | | P4-17 | H-8 | | |
| P4-8 | H-9 | | P4-18 | H-9 | | |
| P4-9 | H-10 | | P4-19 | H-10 | | |
| P4-10 | H-11 | | P4-20 | H-11 | | |

TABLE 5
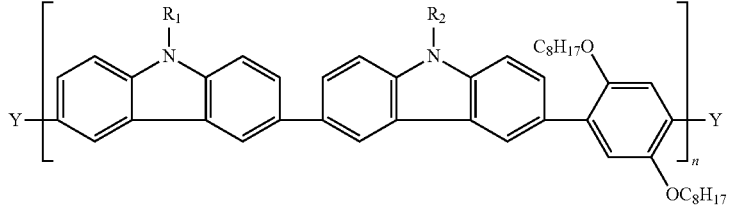
| Compound | R₁ = R₂ | Y | Compound | R₁ | R₂ | Y |
|---|---|---|---|---|---|---|
| P5-1 | H-2 | H-1 | P5-11 | H-2 | H-1 | H-1 |
| P5-2 | H-3 | | P5-12 | H-3 | | |
| P5-3 | H-4 | | P5-13 | H-4 | | |
| P5-4 | H-5 | | P5-14 | H-5 | | |
| P5-5 | H-6 | | P5-15 | H-6 | | |
| P5-6 | H-7 | | P5-16 | H-7 | | |
| P5-7 | H-8 | | P5-17 | H-8 | | |
| P5-8 | H-9 | | P5-18 | H-9 | | |
| P5-9 | H-10 | | P5-19 | H-10 | | |
| P5-10 | H-11 | | P5-20 | H-11 | | |
TABLE 6
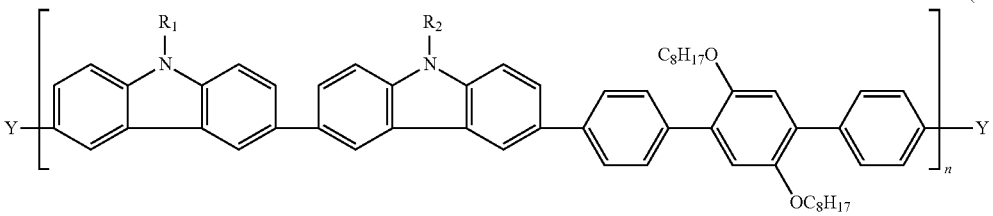
| Compound | R₁ = R₂ | Y | Compound | R₁ | R₂ | Y |
|---|---|---|---|---|---|---|
| P6-1 | H-2 | H-1 | P6-11 | H-2 | H-1 | H-1 |
| P6-2 | H-3 | | P6-12 | H-3 | | |
| P6-3 | H-4 | | P6-13 | H-4 | | |
| P6-4 | H-5 | | P6-14 | H-5 | | |
| P6-5 | H-6 | | P6-15 | H-6 | | |
| P6-6 | H-7 | | P6-16 | H-7 | | |
| P6-7 | H-8 | | P6-17 | H-8 | | |
| P6-8 | H-9 | | P6-18 | H-9 | | |
| P6-9 | H-10 | | P6-19 | H-10 | | |
| P6-10 | H-11 | | P6-20 | H-11 | | |
TABLE 7
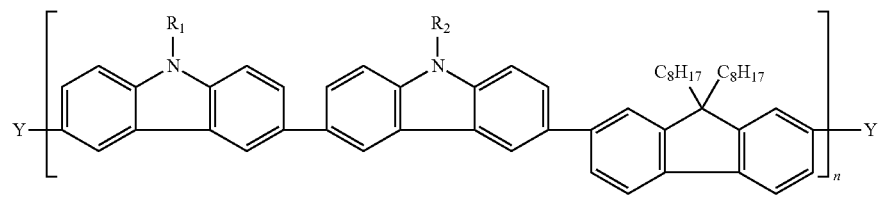
| Compound | R₁ = R₂ | Y | Compound | R₁ | R₂ | Y |
|---|---|---|---|---|---|---|
| P7-1 | H-2 | H-1 | P7-11 | H-2 | H-1 | H-1 |
| P7-2 | H-3 | | P7-12 | H-3 | | |
| P7-3 | H-4 | | P7-13 | H-4 | | |
| P7-4 | H-5 | | P7-14 | H-5 | | |

TABLE 7-continued

| | | | |
|---|---|---|---|
| P7-5 | H-6 | P7-15 | H-6 |
| P7-6 | H-7 | P7-16 | H-7 |
| P7-7 | H-8 | P7-17 | H-8 |
| P7-8 | H-9 | P7-18 | H-9 |
| P7-9 | H-10 | P7-19 | H-10 |
| P7-10 | H-11 | P7-20 | H-11 |

TABLE 8

(P8)

| Compound | $R_1 = R_2$ | Y | Compound | $R_1$ | $R_2$ | Y |
|---|---|---|---|---|---|---|
| P8-1 | H-2 | H-1 | P8-11 | H-2 | H-1 | H-1 |
| P8-2 | H-3 | | P8-12 | H-3 | | |
| P8-3 | H-4 | | P8-13 | H-4 | | |
| P8-4 | H-5 | | P8-14 | H-5 | | |
| P8-5 | H-6 | | P8-15 | H-6 | | |
| P8-6 | H-7 | | P8-16 | H-7 | | |
| P8-7 | H-8 | | P8-17 | H-8 | | |
| P8-8 | H-9 | | P8-18 | H-9 | | |
| P8-9 | H-10 | | P8-19 | H-10 | | |
| P8-10 | H-11 | | P8-20 | H-11 | | |

TABLE 9

(P9)

| Compound | $R_1 = R_2$ | Y | Compound | $R_1$ | $R_2$ | Y |
|---|---|---|---|---|---|---|
| P9-1 | H-2 | H-1 | P9-11 | H-2 | H-1 | H-1 |
| P9-2 | H-3 | | P9-12 | H-3 | | |
| P9-3 | H-4 | | P9-13 | H-4 | | |
| P9-4 | H-5 | | P9-14 | H-5 | | |
| P9-5 | H-6 | | P9-15 | H-6 | | |
| P9-6 | H-7 | | P9-16 | H-7 | | |
| P9-7 | H-8 | | P9-17 | H-8 | | |
| P9-8 | H-9 | | P9-18 | H-9 | | |
| P9-9 | H-10 | | P9-19 | H-10 | | |
| P9-10 | H-11 | | P9-20 | H-11 | | |

TABLE 10
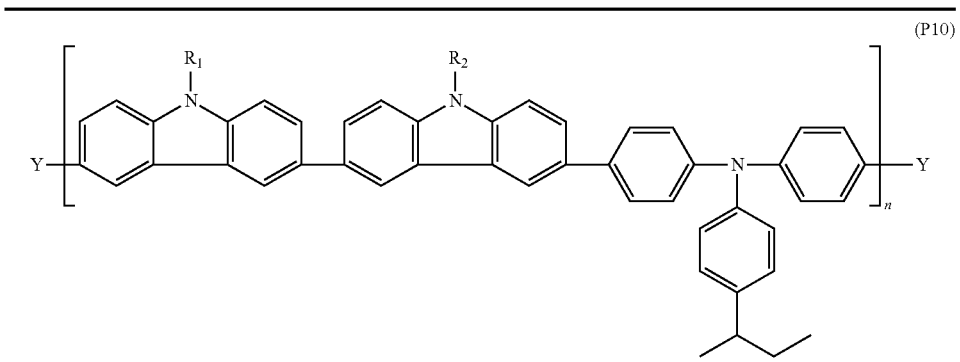
| Compound | R₁ = R₂ | Y | Compound | R₁ | R₂ | Y |
| --- | --- | --- | --- | --- | --- | --- |
| P10-1 | H-2 | H-1 | P10-11 | H-2 | H-1 | H-1 |
| P10-2 | H-3 | | P10-12 | H-3 | | |
| P10-3 | H-4 | | P10-13 | H-4 | | |
| P10-4 | H-5 | | P10-14 | H-5 | | |
| P10-5 | H-6 | | P10-15 | H-6 | | |
| P10-6 | H-7 | | P10-16 | H-7 | | |
| P10-7 | H-8 | | P10-17 | H-8 | | |
| P10-8 | H-9 | | P10-18 | H-9 | | |
| P10-9 | H-10 | | P10-19 | H-10 | | |
| P10-10 | H-11 | | P10-20 | H-11 | | |
TABLE 11
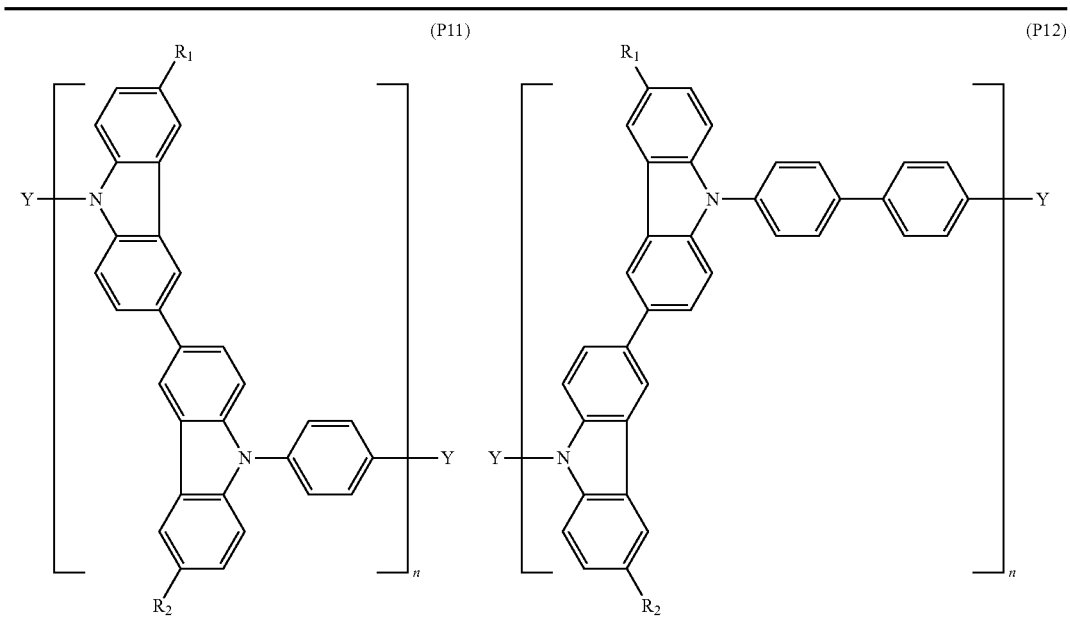
| Compound | R₁ = R₂ | Y | Compound | R₁ = R₂ | Y |
| --- | --- | --- | --- | --- | --- |
| P11-1 | H-2 | H-1 | P12-1 | H-2 | H-1 |
| P11-2 | H-3 | | P12-2 | H-3 | |
| P11-3 | H-4 | | P12-3 | H-4 | |
| P11-4 | H-5 | | P12-4 | H-5 | |
| P11-5 | H-6 | | P12-5 | H-6 | |
| P11-6 | H-7 | | P12-6 | H-7 | |
| P11-7 | H-8 | | P12-7 | H-8 | |
| P11-8 | H-9 | | P12-8 | H-9 | |
| P11-9 | H-10 | | P12-9 | H-10 | |
| P11-10 | H-11 | | P12-10 | H-11 | |

TABLE 12

(P13) (P14)

| Compound | R₁ = R₂ | Y | Compound | R₁ = R₂ | Y |
|---|---|---|---|---|---|
| P13-1 | H-2 | H-1 | P14-1 | H-2 | H-1 |
| P13-2 | H-3 | | P14-2 | H-3 | |
| P13-3 | H-4 | | P14-3 | H-4 | |
| P13-4 | H-5 | | P14-4 | H-5 | |
| P13-5 | H-6 | | P14-5 | H-6 | |
| P13-6 | H-7 | | P14-6 | H-7 | |
| P13-7 | H-8 | | P14-7 | H-8 | |
| P13-8 | H-9 | | P14-8 | H-9 | |
| P13-9 | H-10 | | P14-9 | H-10 | |
| P13-10 | H-11 | | P14-10 | H-11 | |

TABLE 13

(P15) (P16)

| Compound | R₁ = R₂ | Y | Compound | R₁ = R₂ | Y |
|---|---|---|---|---|---|
| P15-1 | H-2 | H-1 | P16-1 | H-2 | H-1 |
| P15-2 | H-3 | | P16-2 | H-3 | |

TABLE 13-continued
| | | | |
|---|---|---|---|
| P15-3 | H-4 | P16-3 | H-4 |
| P15-4 | H-5 | P16-4 | H-5 |
| P15-5 | H-6 | P16-5 | H-6 |
| P15-6 | H-7 | P16-6 | H-7 |
| P15-7 | H-8 | P16-7 | H-8 |
| P15-8 | H-9 | P16-8 | H-9 |
| P15-9 | H-10 | P16-9 | H-10 |
| P15-10 | H-11 | P16-10 | H-11 |
TABLE 14
(P17) (P18)
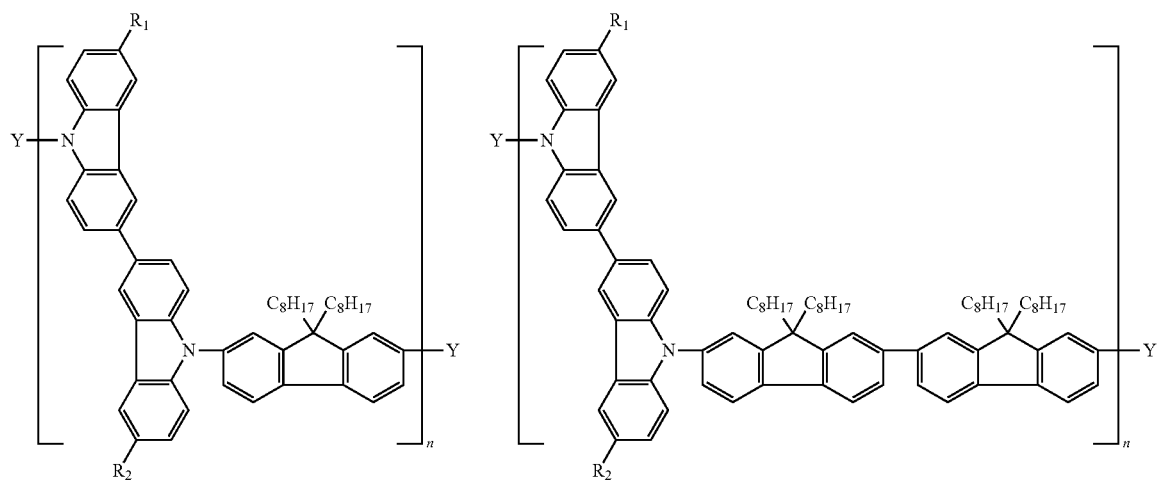
| Compound | R₁ = R₂ | Y | Compound | R₁ = R₂ | Y |
|---|---|---|---|---|---|
| P17-1 | H-2 | H-1 | P18-1 | H-2 | H-1 |
| P17-2 | H-3 | | P18-2 | H-3 | |
| P17-3 | H-4 | | P18-3 | H-4 | |
| P17-4 | H-5 | | P18-4 | H-5 | |
| P17-5 | H-6 | | P18-5 | H-6 | |
| P17-6 | H-7 | | P18-6 | H-7 | |
| P17-7 | H-8 | | P18-7 | H-8 | |
| P17-8 | H-9 | | P18-8 | H-9 | |
| P17-9 | H-10 | | P18-9 | H-10 | |
| P17-10 | H-11 | | P18-10 | H-11 | |
TABLE 15
(P19) (P20)
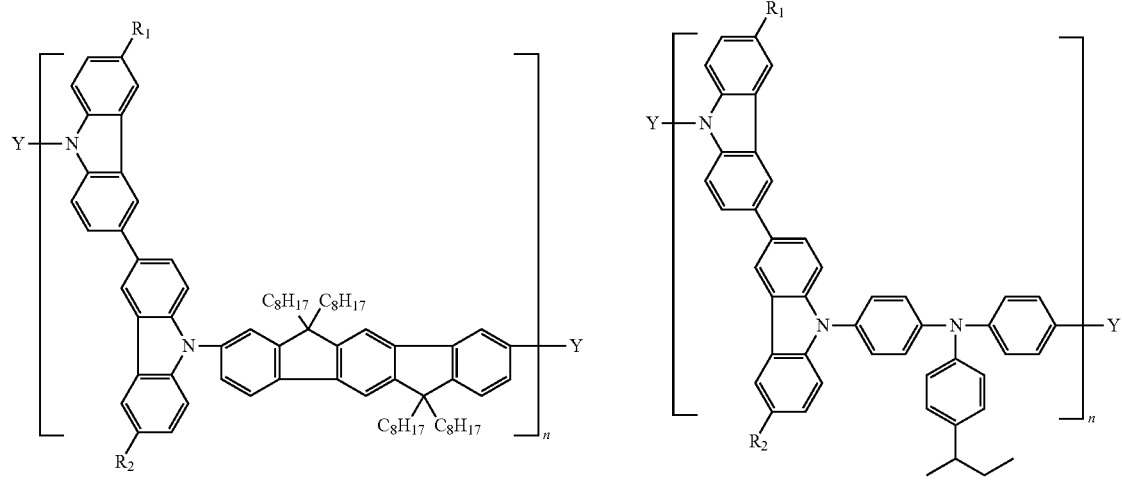

TABLE 15-continued
| Compound | R₁ = R₂ | Y | Compound | R₁ = R₂ | Y |
|---|---|---|---|---|---|
| P19-1 | H-2 | H-1 | P20-1 | H-2 | H-1 |
| P19-2 | H-3 | | P20-2 | H-3 | |
| P19-3 | H-4 | | P20-3 | H-4 | |
| P19-4 | H-5 | | P20-4 | H-5 | |
| P19-5 | H-6 | | P20-5 | H-6 | |
| P19-6 | H-7 | | P20-6 | H-7 | |
| P19-7 | H-8 | | P20-7 | H-8 | |
| P19-8 | H-9 | | P20-8 | H-9 | |
| P19-9 | H-10 | | P20-9 | H-10 | |
| P19-10 | H-11 | | P20-10 | H-11 | |
TABLE 16
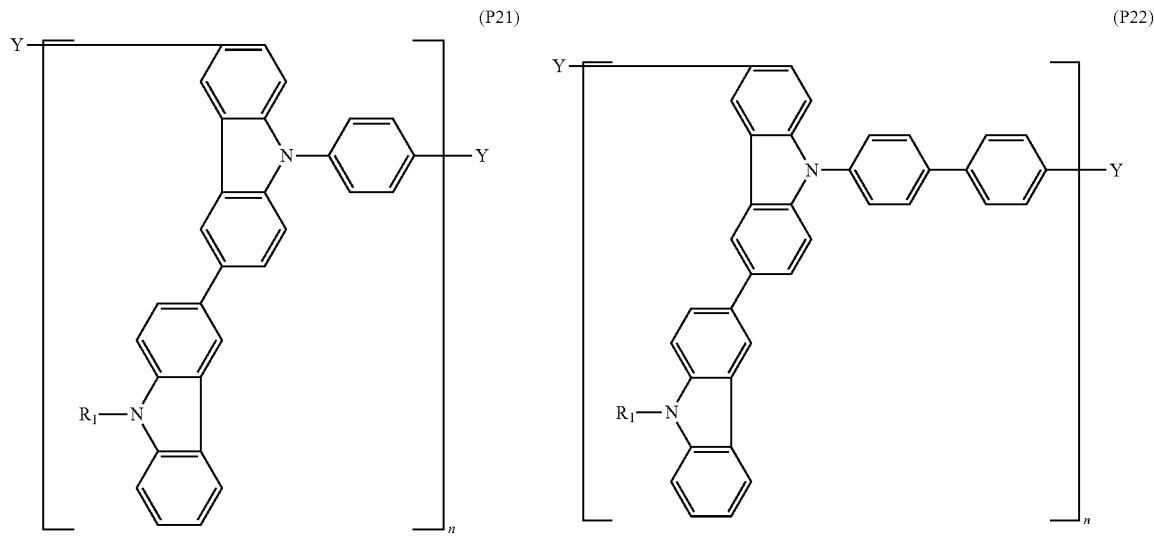
| Compound | R₁ | Y | Compound | R₁ | Y |
|---|---|---|---|---|---|
| P21-1 | H-2 | H-1 | P22-1 | H-2 | H-1 |
| P21-2 | H-3 | | P22-2 | H-3 | |
| P21-3 | H-4 | | P22-3 | H-4 | |
| P21-4 | H-5 | | P22-4 | H-5 | |
| P21-5 | H-6 | | P22-5 | H-6 | |
| P21-6 | H-7 | | P22-6 | H-7 | |
| P21-7 | H-8 | | P22-7 | H-8 | |
| P21-8 | H-9 | | P22-8 | H-9 | |
| P21-9 | H-10 | | P22-9 | H-10 | |
| P21-10 | H-11 | | P22-10 | H-11 | |

TABLE 17
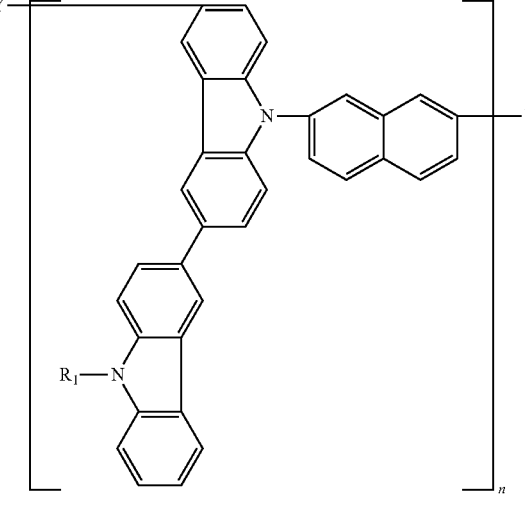
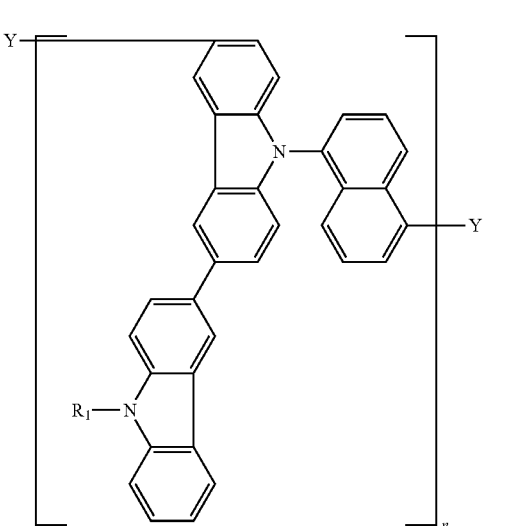
| Compound | R1 | Y |
|---|---|---|
| P23-1 | H-2 | H-1 |
| P23-2 | H-3 | |
| P23-3 | H-4 | |
| P23-4 | H-5 | |
| P23-5 | H-6 | |
| P23-6 | H-7 | |
| P23-7 | H-8 | |
| P23-8 | H-9 | |
| P23-9 | H-10 | |
| P23-10 | H-11 | |
| Compound | R1 | Y |
|---|---|---|
| P24-1 | H-2 | H-1 |
| P24-2 | H-3 | |
| P24-3 | H-4 | |
| P24-4 | H-5 | |
| P24-5 | H-6 | |
| P24-6 | H-7 | |
| P24-7 | H-8 | |
| P24-8 | H-9 | |
| P24-9 | H-10 | |
| P24-10 | H-11 | |
TABLE 18
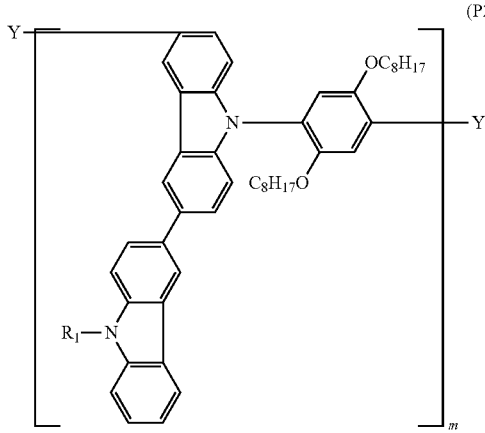
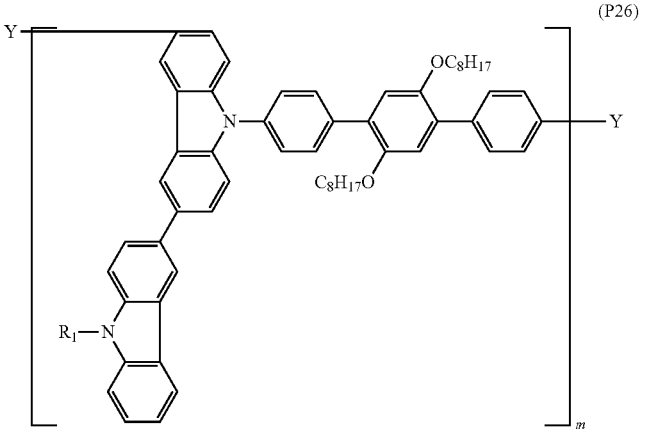
| Compound | R1 | Y |
|---|---|---|
| P25-1 | H-2 | H-1 |
| P25-2 | H-3 | |
| P25-3 | H-4 | |
| P25-4 | H-5 | |
| P25-5 | H-6 | |
| P25-6 | H-7 | |
| P25-7 | H-8 | |
| P25-8 | H-9 | |
| P25-9 | H-10 | |
| P25-10 | H-11 | |
| Compound | R1 | Y |
|---|---|---|
| P26-1 | H-2 | H-1 |
| P26-2 | H-3 | |
| P26-3 | H-4 | |
| P26-4 | H-5 | |
| P26-5 | H-6 | |
| P26-6 | H-7 | |
| P26-7 | H-8 | |
| P26-8 | H-9 | |
| P26-9 | H-10 | |
| P26-10 | H-11 | |

TABLE 19
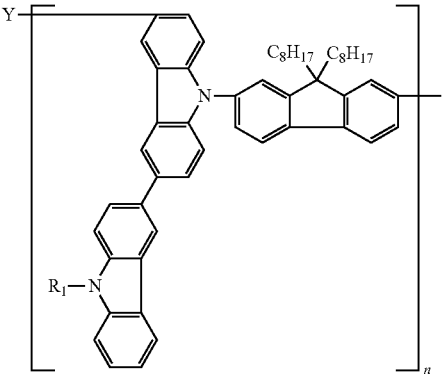
| Compound | R₁ | Y | Compound | R1 | Y |
|---|---|---|---|---|---|
| P27-1 | H-2 | H-1 | P28-1 | H-2 | H-1 |
| P27-2 | H-3 | | P28-2 | H-3 | |
| P27-3 | H-4 | | P28-3 | H-4 | |
| P27-4 | H-5 | | P28-4 | H-5 | |
| P27-5 | H-6 | | P28-5 | H-6 | |
| P27-6 | H-7 | | P28-6 | H-7 | |
| P27-7 | H-8 | | P28-7 | H-8 | |
| P27-8 | H-9 | | P28-8 | H-9 | |
| P27-9 | H-10 | | P28-9 | H-10 | |
| P27-10 | H-11 | | P28-10 | H-11 | |
TABLE 20
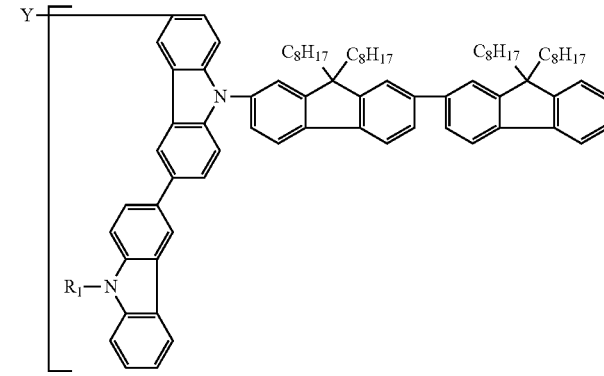
| Compound | R₁ | Y | Compound | R₁ | Y |
|---|---|---|---|---|---|
| P29-1 | H-2 | H-1 | P30-1 | H-2 | H-1 |
| P29-2 | H-3 | | P30-2 | H-3 | |
| P29-3 | H-4 | | P30-3 | H-4 | |
| P29-4 | H-5 | | P30-4 | H-5 | |
| P29-5 | H-6 | | P30-5 | H-6 | |
| P29-6 | H-7 | | P30-6 | H-7 | |
| P29-7 | H-8 | | P30-7 | H-8 | |
| P29-8 | H-9 | | P30-8 | H-9 | |
| P29-9 | H-10 | | P30-9 | H-10 | |
| P29-10 | H-11 | | P30-10 | H-11 | |

TABLE 21
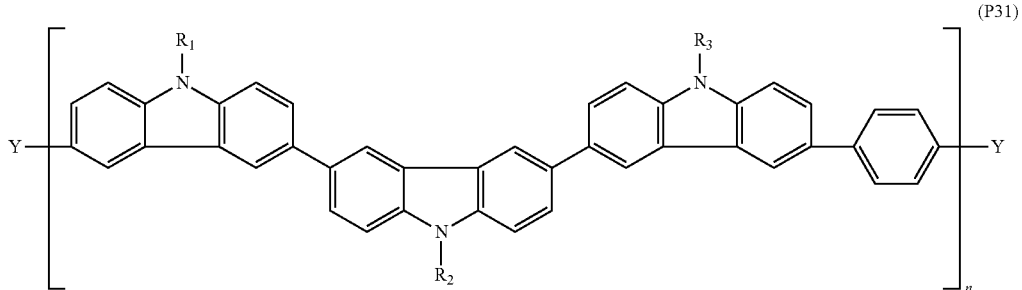
| Compound | R₁ = R₂ = R₃ | Y | Compound | R₁ = R₃ | R₂ | Y |
|---|---|---|---|---|---|---|
| P31-1 | H-2 | H-1 | P31-11 | H-2 | H-1 | H-1 |
| P31-2 | H-3 | | P31-12 | H-3 | | |
| P31-3 | H-4 | | P31-13 | H-4 | | |
| P31-4 | H-5 | | P31-14 | H-5 | | |
| P31-5 | H-6 | | P31-15 | H-6 | | |
| P31-6 | H-7 | | P31-16 | H-7 | | |
| P31-7 | H-8 | | P31-17 | H-8 | | |
| P31-8 | H-9 | | P31-18 | H-9 | | |
| P31-9 | H-10 | | P31-19 | H-10 | | |
| P31-10 | H-11 | | P31-20 | H-11 | | |
TABLE 22
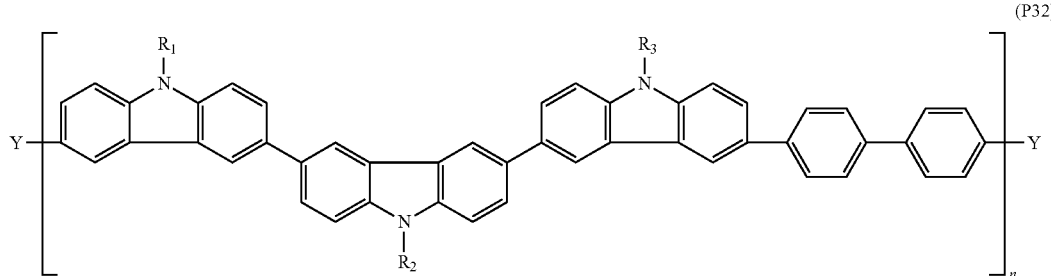
| Compound | R₁ = R₂ = R₃ | Y | Compound | R₁ = R₃ | R₂ | Y |
|---|---|---|---|---|---|---|
| P32-1 | H-2 | H-1 | P32-11 | H-2 | H-1 | H-1 |
| P32-2 | H-3 | | P32-12 | H-3 | | |
| P32-3 | H-4 | | P32-13 | H-4 | | |
| P32-4 | H-5 | | P32-14 | H-5 | | |
| P32-5 | H-6 | | P32-15 | H-6 | | |
| P32-6 | H-7 | | P32-16 | H-7 | | |
| P32-7 | H-8 | | P32-17 | H-8 | | |
| P32-8 | H-9 | | P32-18 | H-9 | | |
| P32-9 | H-10 | | P32-19 | H-10 | | |
| P32-10 | H-11 | | P32-20 | H-11 | | |

TABLE 23

(P33)

| Compound | R₁ = R₂ = R₃ | Y | Compound | R₁ = R₃ | R₂ | Y |
|---|---|---|---|---|---|---|
| P33-1 | H-2 | H-1 | P33-11 | H-2 | H-1 | H-1 |
| P33-2 | H-3 | | P33-12 | H-3 | | |
| P33-3 | H-4 | | P33-13 | H-4 | | |
| P33-4 | H-5 | | P33-14 | H-5 | | |
| P33-5 | H-6 | | P33-15 | H-6 | | |
| P33-6 | H-7 | | P33-16 | H-7 | | |
| P33-7 | H-8 | | P33-17 | H-8 | | |
| P33-8 | H-9 | | P33-18 | H-9 | | |
| P33-9 | H-10 | | P33-19 | H-10 | | |
| P33-10 | H-11 | | P33-20 | H-11 | | |

TABLE 24

(P34)

| Compound | R₁ = R₂ = R₃ | Y | Compound | R₁ = R₃ | R₂ | Y |
|---|---|---|---|---|---|---|
| P34-1 | H-2 | H-1 | P34-11 | H-2 | H-1 | H-1 |
| P34-2 | H-3 | | P34-12 | H-3 | | |
| P34-3 | H-4 | | P34-13 | H-4 | | |
| P34-4 | H-5 | | P34-14 | H-5 | | |
| P34-5 | H-6 | | P34-15 | H-6 | | |
| P34-6 | H-7 | | P34-16 | H-7 | | |
| P34-7 | H-8 | | P34-17 | H-8 | | |
| P34-8 | H-9 | | P34-18 | H-9 | | |
| P34-9 | H-10 | | P34-19 | H-10 | | |
| P34-10 | H-11 | | P34-20 | H-11 | | |

TABLE 25

(P35)

| Compound | R₁ = R₂ = R₃ | Y | Compound | R₁ = R₃ | R₂ | Y |
|---|---|---|---|---|---|---|
| P35-1 | H-2 | H-1 | P35-11 | H-2 | H-1 | H-1 |
| P35-2 | H-3 | | P35-12 | H-3 | | |
| P35-3 | H-4 | | P35-13 | H-4 | | |
| P35-4 | H-5 | | P35-14 | H-5 | | |
| P35-5 | H-6 | | P35-15 | H-6 | | |
| P35-6 | H-7 | | P35-16 | H-7 | | |
| P35-7 | H-8 | | P35-17 | H-8 | | |
| P35-8 | H-9 | | P35-18 | H-9 | | |
| P35-9 | H-10 | | P35-19 | H-10 | | |
| P35-10 | H-11 | | P35-20 | H-11 | | |

TABLE 26

(P36)

| Compound | R₁ = R₂ = R₃ | Y | Compound | R₁ = R₃ | R₂ | Y |
|---|---|---|---|---|---|---|
| P36-1 | H-2 | H-1 | P36-11 | H-2 | H-1 | H-1 |
| P36-2 | H-3 | | P36-12 | H-3 | | |
| P36-3 | H-4 | | P36-13 | H-4 | | |
| P36-4 | H-5 | | P36-14 | H-5 | | |
| P36-5 | H-6 | | P36-15 | H-6 | | |
| P36-6 | H-7 | | P36-16 | H-7 | | |
| P36-7 | H-8 | | P36-17 | H-8 | | |
| P36-8 | H-9 | | P36-18 | H-9 | | |
| P36-9 | H-10 | | P36-19 | H-10 | | |
| P36-10 | H-11 | | P36-20 | H-11 | | |

TABLE 27

(P37)

| Compound | R₁ = R₂ = R₃ | Y | Compound | R₁ = R₃ | R₂ | Y |
|---|---|---|---|---|---|---|
| P37-1 | H-2 | H-1 | P37-11 | H-2 | H-1 | H-1 |
| P37-2 | H-3 | | P37-12 | H-3 | | |
| P37-3 | H-4 | | P37-13 | H-4 | | |
| P37-4 | H-5 | | P37-14 | H-5 | | |
| P37-5 | H-6 | | P37-15 | H-6 | | |
| P37-6 | H-7 | | P37-16 | H-7 | | |
| P37-7 | H-8 | | P37-17 | H-8 | | |
| P37-8 | H-9 | | P37-18 | H-9 | | |
| P37-9 | H-10 | | P37-19 | H-10 | | |
| P37-10 | H-11 | | P37-20 | H-11 | | |

TABLE 28

(P38)

| Compound | R₁ = R₂ = R₃ | Y | Compound | R₁ = R₃ | R₂ | Y |
|---|---|---|---|---|---|---|
| P38-1 | H-2 | H-1 | P38-11 | H-2 | H-1 | H-1 |
| P38-2 | H-3 | | P38-12 | H-3 | | |
| P38-3 | H-4 | | P38-13 | H-4 | | |
| P38-4 | H-5 | | P38-14 | H-5 | | |
| P38-5 | H-6 | | P38-15 | H-6 | | |
| P38-6 | H-7 | | P38-16 | H-7 | | |
| P38-7 | H-8 | | P38-17 | H-8 | | |
| P38-8 | H-9 | | P38-18 | H-9 | | |
| P38-9 | H-10 | | P38-19 | H-10 | | |
| P38-10 | H-11 | | P38-20 | H-11 | | |

TABLE 29
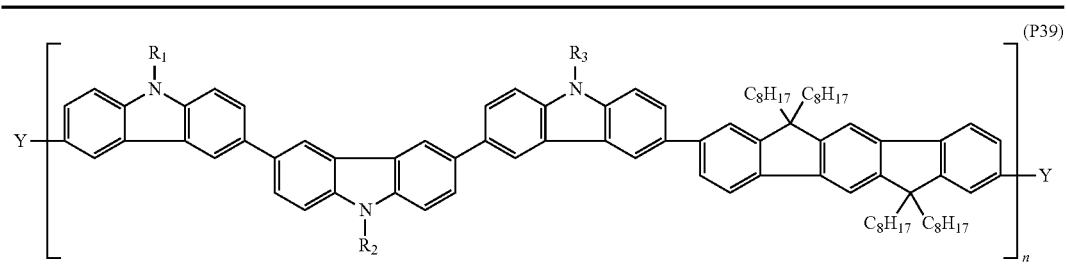
| Compound | R₁ = R₂ = R₃ | Y | Compound | R₁ = R₃ | R₂ | Y |
| --- | --- | --- | --- | --- | --- | --- |
| P39-1 | H-2 | H-1 | P39-11 | H-2 | H-1 | H-1 |
| P39-2 | H-3 | | P39-12 | H-3 | | |
| P39-3 | H-4 | | P39-13 | H-4 | | |
| P39-4 | H-5 | | P39-14 | H-5 | | |
| P39-5 | H-6 | | P39-15 | H-6 | | |
| P39-6 | H-7 | | P39-16 | H-7 | | |
| P39-7 | H-8 | | P39-17 | H-8 | | |
| P39-8 | H-9 | | P39-18 | H-9 | | |
| P39-9 | H-10 | | P39-19 | H-10 | | |
| P39-10 | H-11 | | P39-20 | H-11 | | |
TABLE 30
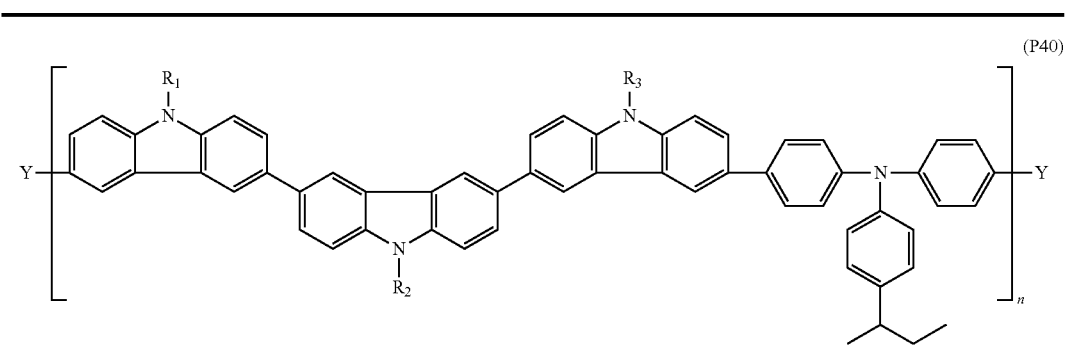
| Compound | R₁ = R₂ = R₃ | Y | Compound | R₁ = R₃ | R₂ | Y |
| --- | --- | --- | --- | --- | --- | --- |
| P40-1 | H-2 | H-1 | P40-11 | H-2 | H-1 | H-1 |
| P40-2 | H-3 | | P40-12 | H-3 | | |
| P40-3 | H-4 | | P40-13 | H-4 | | |
| P40-4 | H-5 | | P40-14 | H-5 | | |
| P40-5 | H-6 | | P40-15 | H-6 | | |
| P40-6 | H-7 | | P40-16 | H-7 | | |
| P40-7 | H-8 | | P40-17 | H-8 | | |
| P40-8 | H-9 | | P40-18 | H-9 | | |
| P40-9 | H-10 | | P40-19 | H-10 | | |
| P40-10 | H-11 | | P40-20 | H-11 | | |

TABLE 31
(P41)
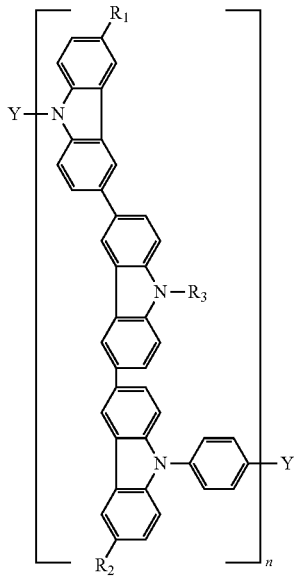
| Compound | R₁ = R₂ = R₃ | Y | Compound | R₁ = R₂ | R₃ | Y |
|---|---|---|---|---|---|---|
| P41-1 | H-2 | H-1 | P41-11 | H-2 | H-1 | H-1 |
| P41-2 | H-3 | | P41-12 | H-3 | | |
| P41-3 | H-4 | | P41-13 | H-4 | | |
| P41-4 | H-5 | | P41-14 | H-5 | | |
| P41-5 | H-6 | | P41-15 | H-6 | | |
| P41-6 | H-7 | | P41-16 | H-7 | | |
| P41-7 | H-8 | | P41-17 | H-8 | | |
| P41-8 | H-9 | | P41-18 | H-9 | | |
| P41-9 | H-10 | | P41-19 | H-10 | | |
| P41-10 | H-11 | | P41-20 | H-11 | | |
TABLE 32
(P42)
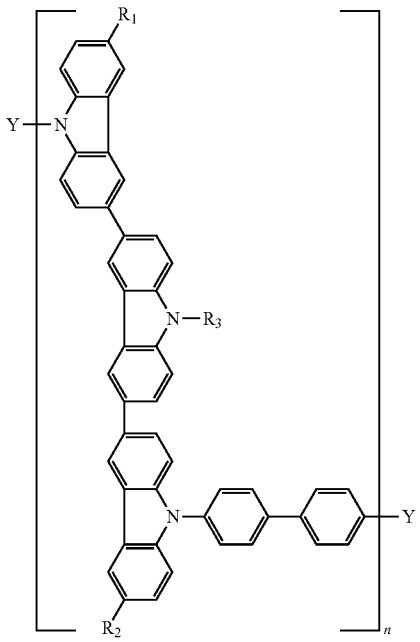
| Compound | R₁ = R₂ = R₃ | Y | Compound | R₁ = R₂ | R₃ | Y |
|---|---|---|---|---|---|---|
| P42-1 | H-2 | H-1 | P42-11 | H-2 | H-1 | H-1 |
| P42-2 | H-3 | | P42-12 | H-3 | | |
TABLE 32-continued
| Compound | | | Compound | | |
|---|---|---|---|---|---|
| P42-3 | H-4 | | P42-13 | H-4 | |
| P42-4 | H-5 | | P42-14 | H-5 | |
| P42-5 | H-6 | | P42-15 | H-6 | |
| P42-6 | H-7 | | P42-16 | H-7 | |
| P42-7 | H-8 | | P42-17 | H-8 | |
| P42-8 | H-9 | | P42-18 | H-9 | |
| P42-9 | H-10 | | P42-19 | H-10 | |
| P42-10 | H-11 | | P42-20 | H-11 | |
TABLE 33
(P43)
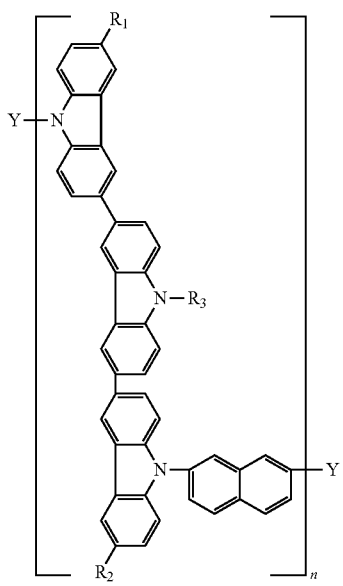
| Compound | R₁ = R₂ = R₃ | Y | Compound | R₁ = R₂ | R₃ | Y |
|---|---|---|---|---|---|---|
| P43-1 | H-2 | H-1 | P43-11 | H-2 | H-1 | H-1 |
| P43-2 | H-3 | | P43-12 | H-3 | | |
| P43-3 | H-4 | | P43-13 | H-4 | | |
| P43-4 | H-5 | | P43-14 | H-5 | | |
| P43-5 | H-6 | | P43-15 | H-6 | | |
| P43-6 | H-7 | | P43-16 | H-7 | | |
| P43-7 | H-8 | | P43-17 | H-8 | | |
| P43-8 | H-9 | | P43-18 | H-9 | | |
| P43-9 | H-10 | | P43-19 | H-10 | | |
| P43-10 | H-11 | | P43-20 | H-11 | | |

TABLE 34
(P44)
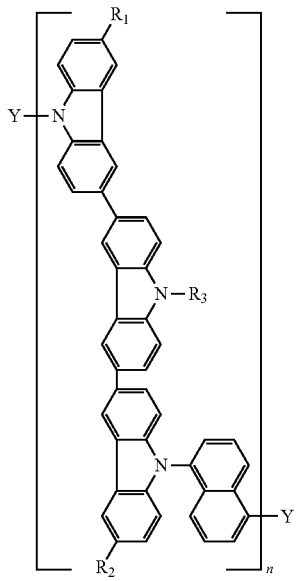
| Compound | R₁ = R₂ = R₃ | Y | Compound | R₁ = R₂ | R₃ | Y |
|---|---|---|---|---|---|---|
| P44-1 | H-2 | H-1 | P44-11 | H-2 | H-1 | H-1 |
| P44-2 | H-3 | | P44-12 | H-3 | | |
| P44-3 | H-4 | | P44-13 | H-4 | | |
| P44-4 | H-5 | | P44-14 | H-5 | | |
| P44-5 | H-6 | | P44-15 | H-6 | | |
| P44-6 | H-7 | | P44-16 | H-7 | | |
| P44-7 | H-8 | | P44-17 | H-8 | | |
| P44-8 | H-9 | | P44-18 | H-9 | | |
| P44-9 | H-10 | | P44-19 | H-10 | | |
| P44-10 | H-11 | | P44-20 | H-11 | | |
TABLE 35
(P45)
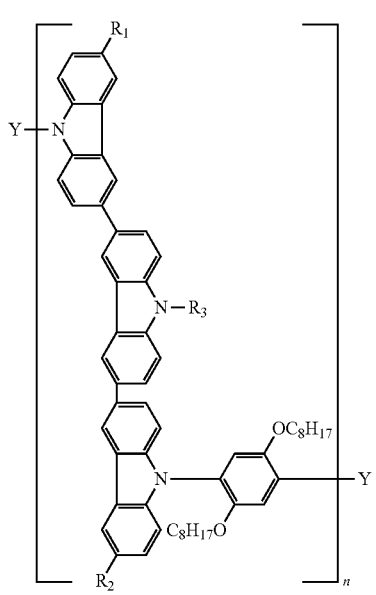
| Compound | R₁ = R₂ = R₃ | Y | Compound | R₁ = R₂ | R₃ | Y |
|---|---|---|---|---|---|---|
| P45-1 | H-2 | H-1 | P45-11 | H-2 | H-1 | H-1 |
| P45-2 | H-3 | | P45-12 | H-3 | | |
TABLE 35-continued
| P45-3 | H-4 | | P45-13 | H-4 | | |
|---|---|---|---|---|---|---|
| P45-4 | H-5 | | P45-14 | H-5 | | |
| P45-5 | H-6 | | P45-15 | H-6 | | |
| P45-6 | H-7 | | P45-16 | H-7 | | |
| P45-7 | H-8 | | P45-17 | H-8 | | |
| P45-8 | H-9 | | P45-18 | H-9 | | |
| P45-9 | H-10 | | P45-19 | H-10 | | |
| P45-10 | H-11 | | P45-20 | H-11 | | |
TABLE 36
(P46)
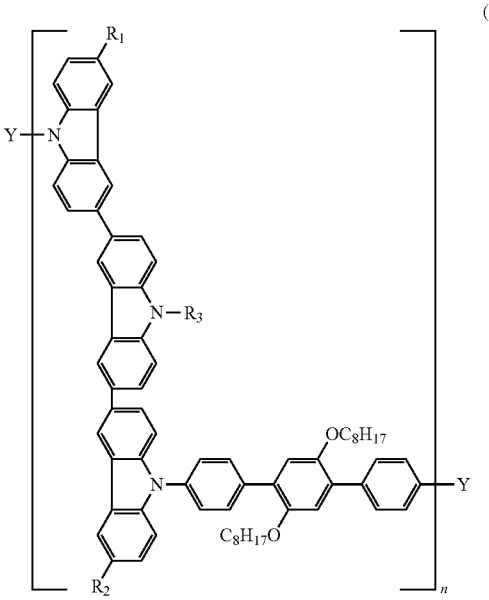
| Compound | R₁ = R₂ = R₃ | Y | Compound | R₁ = R₂ | R₃ | Y |
|---|---|---|---|---|---|---|
| P46-1 | H-2 | H-1 | P46-11 | H-2 | H-1 | H-1 |
| P46-2 | H-3 | | P46-12 | H-3 | | |
| P46-3 | H-4 | | P46-13 | H-4 | | |
| P46-4 | H-5 | | P46-14 | H-5 | | |
| P46-5 | H-6 | | P46-15 | H-6 | | |
| P46-6 | H-7 | | P46-16 | H-7 | | |
| P46-7 | H-8 | | P46-17 | H-8 | | |
| P46-8 | H-9 | | P46-18 | H-9 | | |
| P46-9 | H-10 | | P46-19 | H-10 | | |
| P46-10 | H-11 | | P46-20 | H-11 | | |

TABLE 37
(P47)
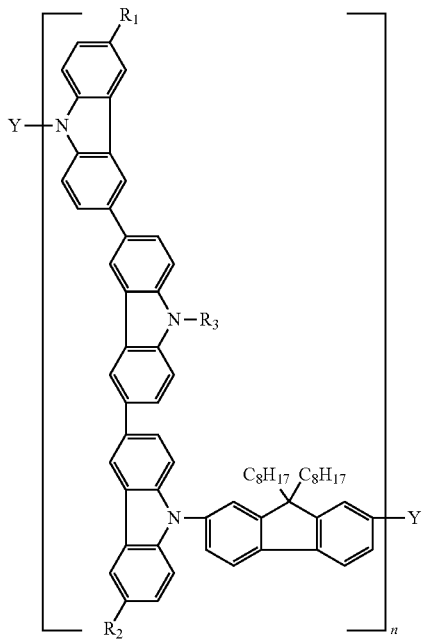
| Compound | R₁ = R₂ = R₃ | Y | Compound | R₁ = R₂ | R₃ | Y |
|---|---|---|---|---|---|---|
| P47-1 | H-2 | H-1 | P47-11 | H-2 | H-1 | H-1 |
| P47-2 | H-3 | | P47-12 | H-3 | | |
| P47-3 | H-4 | | P47-13 | H-4 | | |
| P47-4 | H-5 | | P47-14 | H-5 | | |
| P47-5 | H-6 | | P47-15 | H-6 | | |
| P47-6 | H-7 | | P47-16 | H-7 | | |
| P47-7 | H-8 | | P47-17 | H-8 | | |
| P47-8 | H-9 | | P47-18 | H-9 | | |
| P47-9 | H-10 | | P47-19 | H-10 | | |
| P47-10 | H-11 | | P47-20 | H-11 | | |
TABLE 38
(P48)
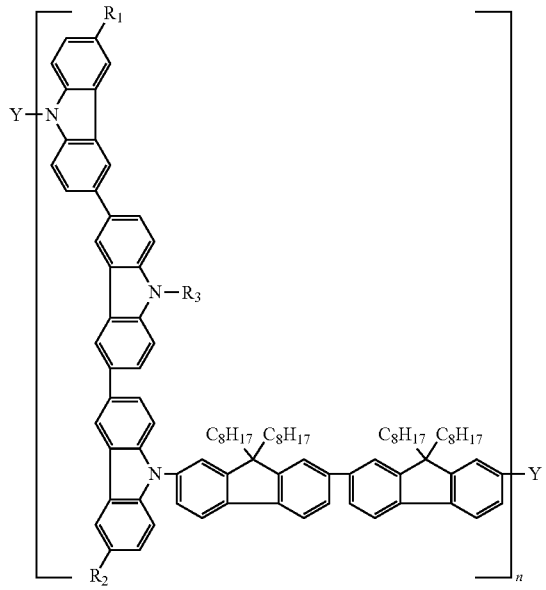
TABLE 38-continued
| Compound | R₁ = R₂ = R₃ | Y | Compound | R₁ = R₂ | R₃ | Y |
|---|---|---|---|---|---|---|
| P48-1 | H-2 | H-1 | P48-11 | H-2 | H-1 | H-1 |
| P48-2 | H-3 | | P48-12 | H-3 | | |
| P48-3 | H-4 | | P48-13 | H-4 | | |
| P48-4 | H-5 | | P48-14 | H-5 | | |
| P48-5 | H-6 | | P48-15 | H-6 | | |
| P48-6 | H-7 | | P48-16 | H-7 | | |
| P48-7 | H-8 | | P48-17 | H-8 | | |
| P48-8 | H-9 | | P48-18 | H-9 | | |
| P48-9 | H-10 | | P48-19 | H-10 | | |
| P48-10 | H-11 | | P48-20 | H-11 | | |
TABLE 39
(P49)
| Compound | R₁ = R₂ = R₃ | Y | Compound | R₁ = R₂ | R₃ | Y |
|---|---|---|---|---|---|---|
| P49-1 | H-2 | H-1 | P49-11 | H-2 | H-1 | H-1 |
| P49-2 | H-3 | | P49-12 | H-3 | | |
| P49-3 | H-4 | | P49-13 | H-4 | | |
| P49-4 | H-5 | | P49-14 | H-5 | | |
| P49-5 | H-6 | | P49-15 | H-6 | | |
| P49-6 | H-7 | | P49-16 | H-7 | | |
| P49-7 | H-8 | | P49-17 | H-8 | | |
| P49-8 | H-9 | | P49-18 | H-9 | | |
| P49-9 | H-10 | | P49-19 | H-10 | | |
| P49-10 | H-11 | | P49-20 | H-11 | | |

TABLE 40
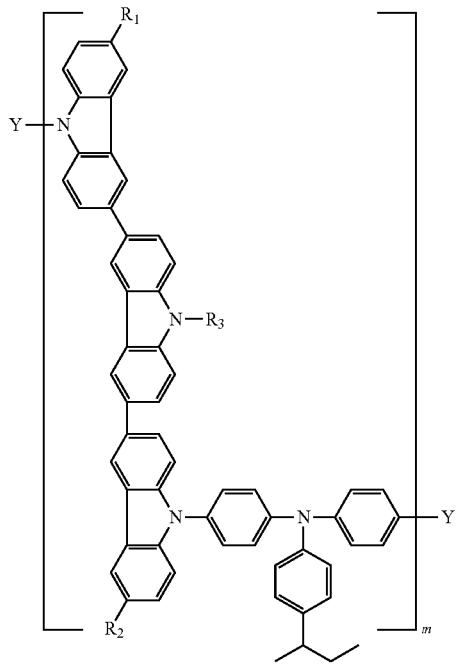
(P50)
| Compound | R₁ = R₂ = R₃ | Y | Compound | R₁ = R₂ | R₃ | Y |
|---|---|---|---|---|---|---|
| P50-1 | H-2 | H-1 | P50-11 | H-2 | H-1 | H-1 |
| P50-2 | H-3 | | P50-12 | H-3 | | |
| P50-3 | H-4 | | P50-13 | H-4 | | |
| P50-4 | H-5 | | P50-14 | H-5 | | |
| P50-5 | H-6 | | P50-15 | H-6 | | |
| P50-6 | H-7 | | P50-16 | H-7 | | |
| P50-7 | H-8 | | P50-17 | H-8 | | |
| P50-8 | H-9 | | P50-18 | H-9 | | |
| P50-9 | H-10 | | P50-19 | H-10 | | |
| P50-10 | H-11 | | P50-20 | H-11 | | |
TABLE 41
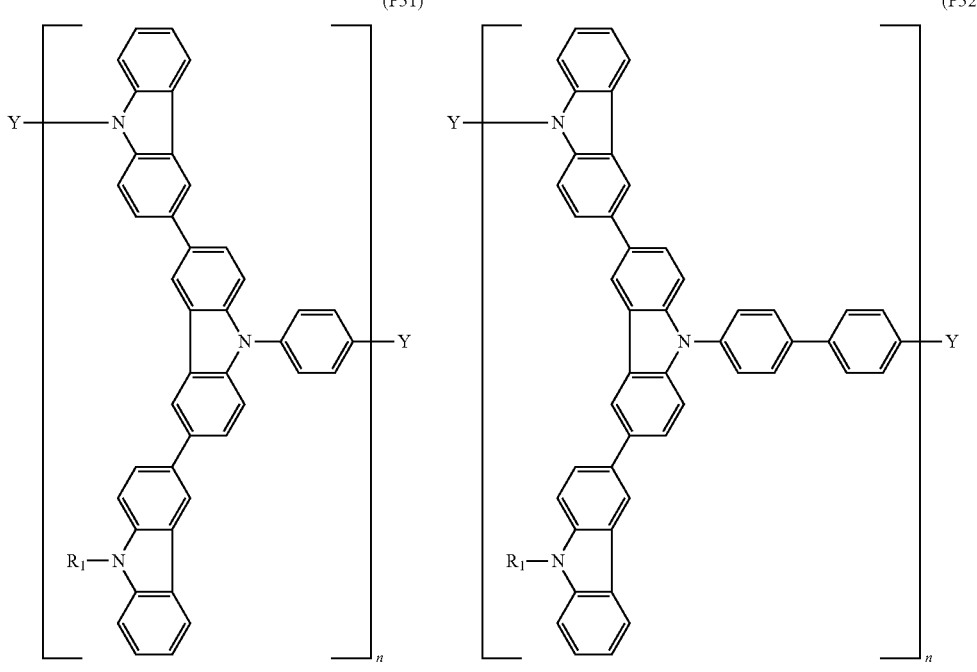
| Compound | R₁ | Y | Compound | R₁ | Y |
|---|---|---|---|---|---|
| P51-1 | H-2 | H-1 | P52-1 | H-2 | H-1 |
| P51-2 | H-3 | | P52-2 | H-3 | |
| P51-3 | H-4 | | P52-3 | H-4 | |
| P51-4 | H-5 | | P52-4 | H-5 | |

TABLE 41-continued
| | | | |
|---|---|---|---|
| P51-5 | H-6 | P52-5 | H-6 |
| P51-6 | H-7 | P52-6 | H-7 |
| P51-7 | H-8 | P52-7 | H-8 |
| P51-8 | H-9 | P52-8 | H-9 |
| P51-9 | H-10 | P52-9 | H-10 |
| P51-10 | H-11 | P52-10 | H-11 |
TABLE 42
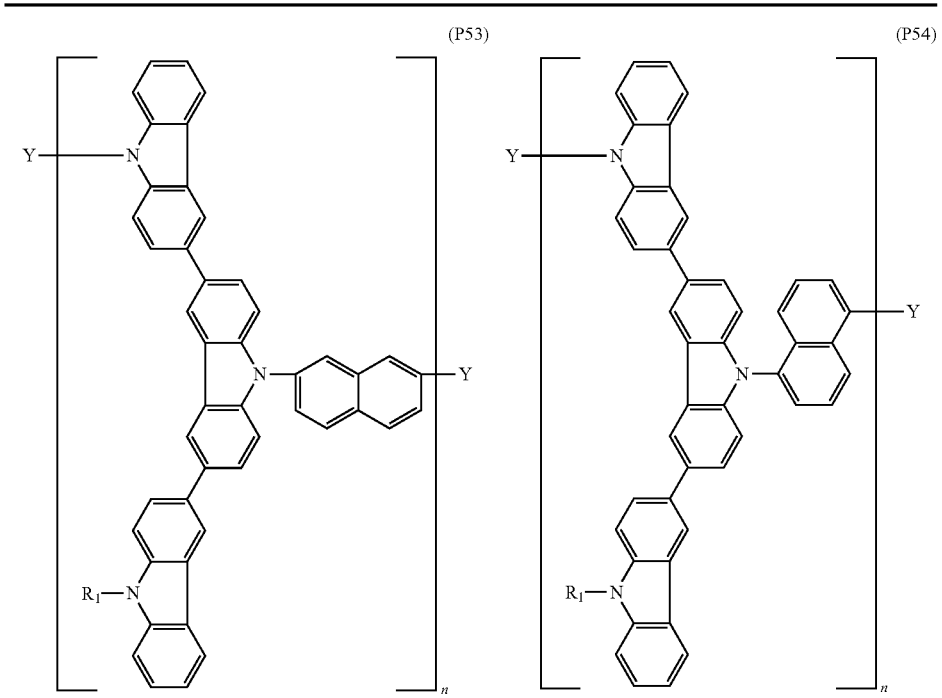
| Compound | R₁ | Y | Compound | R₁ | Y |
|---|---|---|---|---|---|
| P53-1 | H-2 | H-1 | P54-1 | H-2 | H-1 |
| P53-2 | H-3 | | P54-2 | H-3 | |
| P53-3 | H-4 | | P54-3 | H-4 | |
| P53-4 | H-5 | | P54-4 | H-5 | |
| P53-5 | H-6 | | P54-5 | H-6 | |
| P53-6 | H-7 | | P54-6 | H-7 | |
| P53-7 | H-8 | | P54-7 | H-8 | |
| P53-8 | H-9 | | P54-8 | H-9 | |
| P53-9 | H-10 | | P54-9 | H-10 | |
| P53-10 | H-11 | | P54-10 | H-11 | |

TABLE 43

(P55) and (P56) structures shown.

| Compound | R₁ | Y | Compound | R₁ | Y |
|---|---|---|---|---|---|
| P55-1 | H-2 | H-1 | P56-1 | H-2 | H-1 |
| P55-2 | H-3 | | P56-2 | H-3 | |
| P55-3 | H-4 | | P56-3 | H-4 | |
| P55-4 | H-5 | | P56-4 | H-5 | |
| P55-5 | H-6 | | P56-5 | H-6 | |
| P55-6 | H-7 | | P56-6 | H-7 | |
| P55-7 | H-8 | | P56-7 | H-8 | |
| P55-8 | H-9 | | P56-8 | H-9 | |
| P55-9 | H-10 | | P56-9 | H-10 | |
| P55-10 | H-11 | | P56-10 | H-11 | |

TABLE 44

(P57) and (P58) structures shown.

TABLE 44-continued
| Compound | R₁ | Y | Compound | R₁ | Y |
|---|---|---|---|---|---|
| P57-1 | H-2 | H-1 | P58-1 | H-2 | H-1 |
| P57-2 | H-3 | | P58-2 | H-3 | |
| P57-3 | H-4 | | P58-3 | H-4 | |
| P57-4 | H-5 | | P58-4 | H-5 | |
| P57-5 | H-6 | | P58-5 | H-6 | |
| P57-6 | H-7 | | P58-6 | H-7 | |
| P57-7 | H-8 | | P58-7 | H-8 | |
| P57-8 | H-9 | | P58-8 | H-9 | |
| P57-9 | H-10 | | P58-9 | H-10 | |
| P57-10 | H-11 | | P58-10 | H-11 | |
TABLE 45
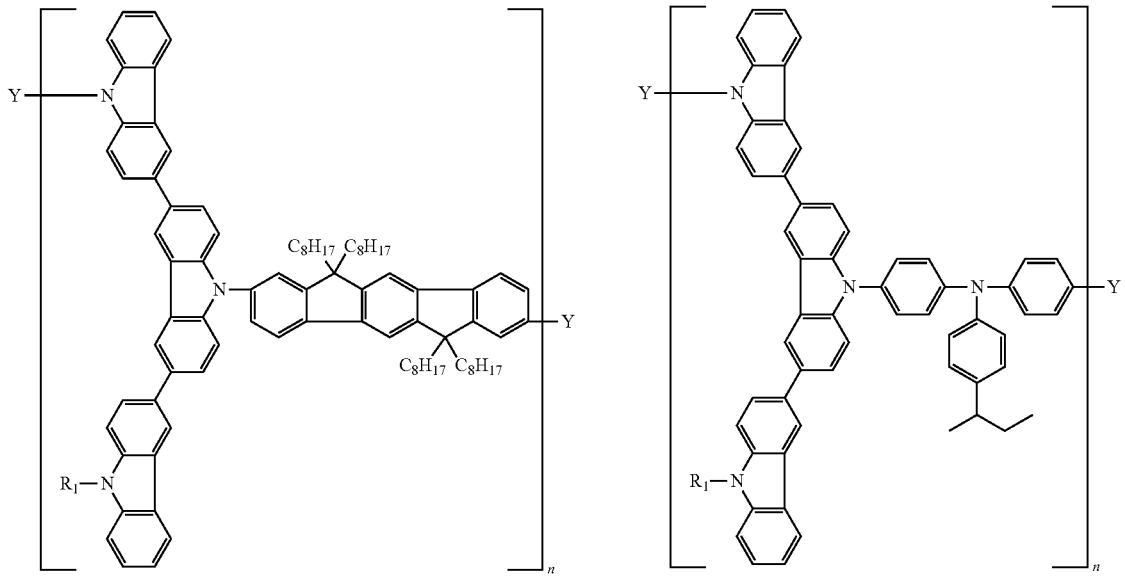
| Compound | R₁ | Y | Compound | R₁ | Y |
|---|---|---|---|---|---|
| P59-1 | H-2 | H-1 | P60-1 | H-2 | H-1 |
| P59-2 | H-3 | | P60-2 | H-3 | |
| P59-3 | H-4 | | P60-3 | H-4 | |
| P59-4 | H-5 | | P60-4 | H-5 | |
| P59-5 | H-6 | | P60-5 | H-6 | |
| P59-6 | H-7 | | P60-6 | H-7 | |
| P59-7 | H-8 | | P60-7 | H-8 | |
| P59-8 | H-9 | | P60-8 | H-9 | |
| P59-9 | H-10 | | P60-9 | H-10 | |
| P59-10 | H-11 | | P60-10 | H-11 | |

TABLE 46
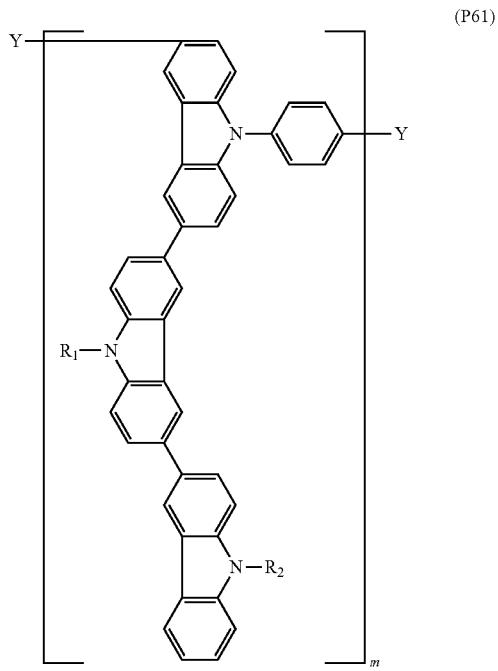
(P61)
| Compound | $R_1 = R_2$ | Y | Compound | $R_1$ | $R_2$ | Y |
|---|---|---|---|---|---|---|
| P61-1 | H-2 | H-1 | P61-11 | H-2 | H-1 | H-1 |
| P61-2 | H-3 | | P61-12 | H-3 | | |
| P61-3 | H-4 | | P61-13 | H-4 | | |
| P61-4 | H-5 | | P61-14 | H-5 | | |
| P61-5 | H-6 | | P61-15 | H-6 | | |
| P61-6 | H-7 | | P61-16 | H-7 | | |
| P61-7 | H-8 | | P61-17 | H-8 | | |
| P61-8 | H-9 | | P61-18 | H-9 | | |
| P61-9 | H-10 | | P61-19 | H-10 | | |
| P61-10 | H-11 | | P61-20 | H-11 | | |
TABLE 47
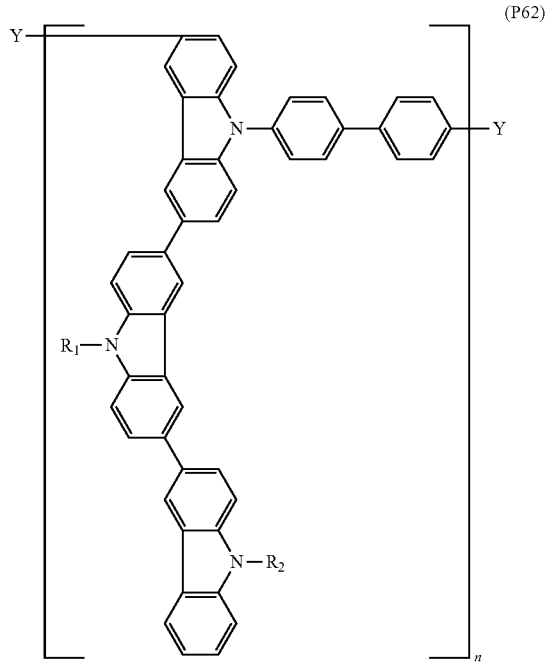
(P62)
TABLE 47-continued
| Compound | $R_1 = R_2$ | Y | Compound | $R_1$ | $R_2$ | Y |
|---|---|---|---|---|---|---|
| P62-1 | H-2 | H-1 | P62-11 | H-2 | H-1 | H-1 |
| P62-2 | H-3 | | P62-12 | H-3 | | |
| P62-3 | H-4 | | P62-13 | H-4 | | |
| P62-4 | H-5 | | P62-14 | H-5 | | |
| P62-5 | H-6 | | P62-15 | H-6 | | |
| P62-6 | H-7 | | P62-16 | H-7 | | |
| P62-7 | H-8 | | P62-17 | H-8 | | |
| P62-8 | H-9 | | P62-18 | H-9 | | |
| P62-9 | H-10 | | P62-19 | H-10 | | |
| P62-10 | H-11 | | P62-20 | H-11 | | |
TABLE 48
(P63)
| Compound | $R_1 = R_2$ | Y | Compound | $R_1$ | $R_2$ | Y |
|---|---|---|---|---|---|---|
| P63-1 | H-2 | H-1 | P63-11 | H-2 | H-1 | H-1 |
| P63-2 | H-3 | | P63-12 | H-3 | | |
| P63-3 | H-4 | | P63-13 | H-4 | | |
| P63-4 | H-5 | | P63-14 | H-5 | | |
| P63-5 | H-6 | | P63-15 | H-6 | | |
| P63-6 | H-7 | | P63-16 | H-7 | | |
| P63-7 | H-8 | | P63-17 | H-8 | | |
| P63-8 | H-9 | | P63-18 | H-9 | | |
| P63-9 | H-10 | | P63-19 | H-10 | | |
| P63-10 | H-11 | | P63-20 | H-11 | | |

TABLE 49
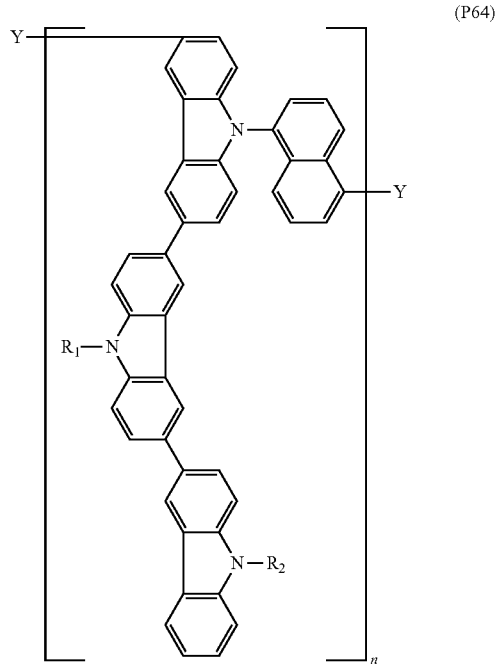
(P64)
| Compound | R₁ = R₂ | Y | Compound | R₁ | R₂ | Y |
|---|---|---|---|---|---|---|
| P64-1 | H-2 | H-1 | P64-11 | H-2 | H-1 | H-1 |
| P64-2 | H-3 | | P64-12 | H-3 | | |
| P64-3 | H-4 | | P64-13 | H-4 | | |
| P64-4 | H-5 | | P64-14 | H-5 | | |
| P64-5 | H-6 | | P64-15 | H-6 | | |
| P64-6 | H-7 | | P64-16 | H-7 | | |
| P64-7 | H-8 | | P64-17 | H-8 | | |
| P64-8 | H-9 | | P64-18 | H-9 | | |
| P64-9 | H-10 | | P64-19 | H-10 | | |
| P64-10 | H-11 | | P64-20 | H-11 | | |
TABLE 50
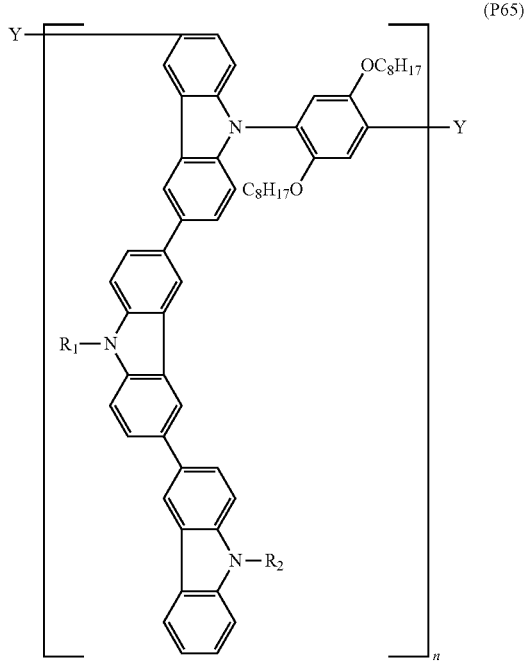
(P65)
TABLE 50-continued
| Compound | R₁ = R₂ | Y | Compound | R₁ | R₂ | Y |
|---|---|---|---|---|---|---|
| P65-1 | H-2 | H-1 | P65-11 | H-2 | H-1 | H-1 |
| P65-2 | H-3 | | P65-12 | H-3 | | |
| P65-3 | H-4 | | P65-13 | H-4 | | |
| P65-4 | H-5 | | P65-14 | H-5 | | |
| P65-5 | H-6 | | P65-15 | H-6 | | |
| P65-6 | H-7 | | P65-16 | H-7 | | |
| P65-7 | H-8 | | P65-17 | H-8 | | |
| P65-8 | H-9 | | P65-18 | H-9 | | |
| P65-9 | H-10 | | P65-19 | H-10 | | |
| P65-10 | H-11 | | P65-20 | H-11 | | |
TABLE 51
(P66)
| Compound | R₁ = R₂ | Y | Compound | R₁ | R₂ | Y |
|---|---|---|---|---|---|---|
| P66-1 | H-2 | H-1 | P66-11 | H-2 | H-1 | H-1 |
| P66-2 | H-3 | | P66-12 | H-3 | | |
| P66-3 | H-4 | | P66-13 | H-4 | | |
| P66-4 | H-5 | | P66-14 | H-5 | | |
| P66-5 | H-6 | | P66-15 | H-6 | | |
| P66-6 | H-7 | | P66-16 | H-7 | | |
| P66-7 | H-8 | | P66-17 | H-8 | | |
| P66-8 | H-9 | | P66-18 | H-9 | | |
| P66-9 | H-10 | | P66-19 | H-10 | | |
| P66-10 | H-11 | | P66-20 | H-11 | | |

TABLE 52
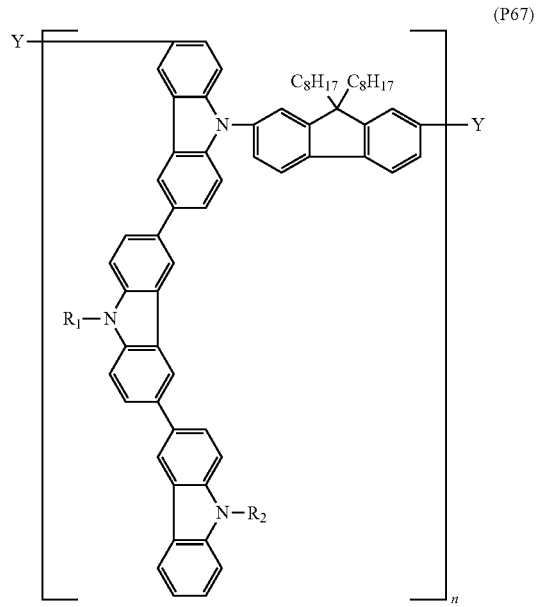
(P67)
TABLE 52-continued
| Compound | R₁ = R₂ | Y | Compound | R₁ | R₂ | Y |
|---|---|---|---|---|---|---|
| P67-1 | H-2 | H-1 | P67-11 | H-2 | H-1 | H-1 |
| P67-2 | H-3 | | P67-12 | H-3 | | |
| P67-3 | H-4 | | P67-13 | H-4 | | |
| P67-4 | H-5 | | P67-14 | H-5 | | |
| P67-5 | H-6 | | P67-15 | H-6 | | |
| P67-6 | H-7 | | P67-16 | H-7 | | |
| P67-7 | H-8 | | P67-17 | H-8 | | |
| P67-8 | H-9 | | P67-18 | H-9 | | |
| P67-9 | H-10 | | P67-19 | H-10 | | |
| P67-10 | H-11 | | P67-20 | H-11 | | |
TABLE 53
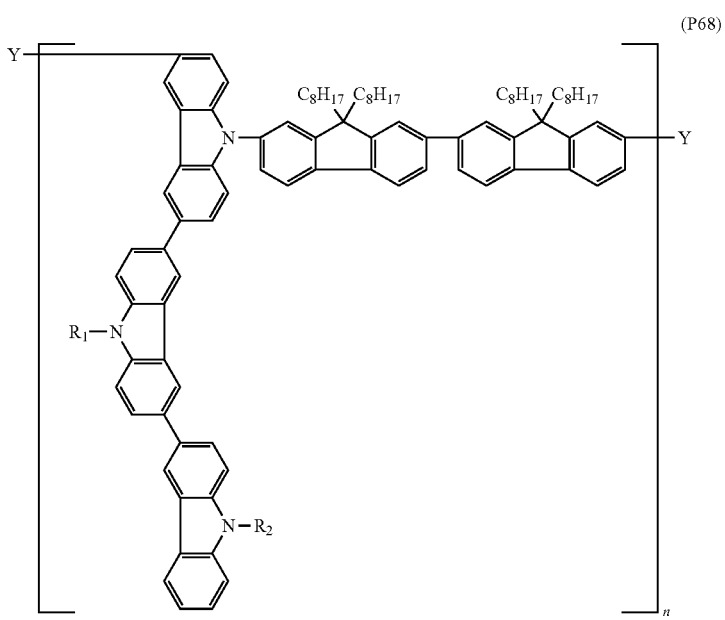
(P68)
| Compound | R₁ = R₂ | Y | Compound | R₁ | R₂ | Y |
|---|---|---|---|---|---|---|
| P68-1 | H-2 | H-1 | P68-11 | H-2 | H-1 | H-1 |
| P68-2 | H-3 | | P68-12 | H-3 | | |
| P68-3 | H-4 | | P68-13 | H-4 | | |
| P68-4 | H-5 | | P68-14 | H-5 | | |
| P68-5 | H-6 | | P68-15 | H-6 | | |
| P68-6 | H-7 | | P68-16 | H-7 | | |
| P68-7 | H-8 | | P68-17 | H-8 | | |
| P68-8 | H-9 | | P68-18 | H-9 | | |
| P68-9 | H-10 | | P68-19 | H-10 | | |
| P68-10 | H-11 | | P68-20 | H-11 | | |

TABLE 54
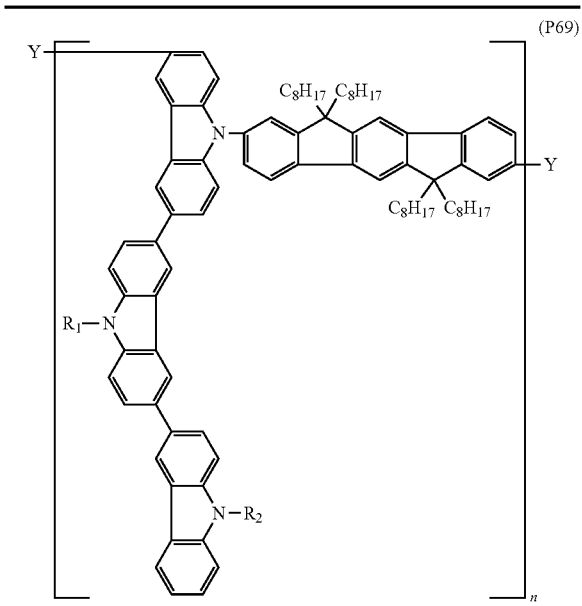
(P69)
| Compound | R₁ = R₂ | Y | Compound | R₁ | R₂ | Y |
|---|---|---|---|---|---|---|
| P69-1 | H-2 | H-1 | P69-11 | H-2 | H-1 | H-1 |
| P69-2 | H-3 | | P69-12 | H-3 | | |
| P69-3 | H-4 | | P69-13 | H-4 | | |
| P69-4 | H-5 | | P69-14 | H-5 | | |
| P69-5 | H-6 | | P69-15 | H-6 | | |
| P69-6 | H-7 | | P69-16 | H-7 | | |
| P69-7 | H-8 | | P69-17 | H-8 | | |
| P69-8 | H-9 | | P69-18 | H-9 | | |
| P69-9 | H-10 | | P69-19 | H-10 | | |
| P69-10 | H-11 | | P69-20 | H-11 | | |
TABLE 55
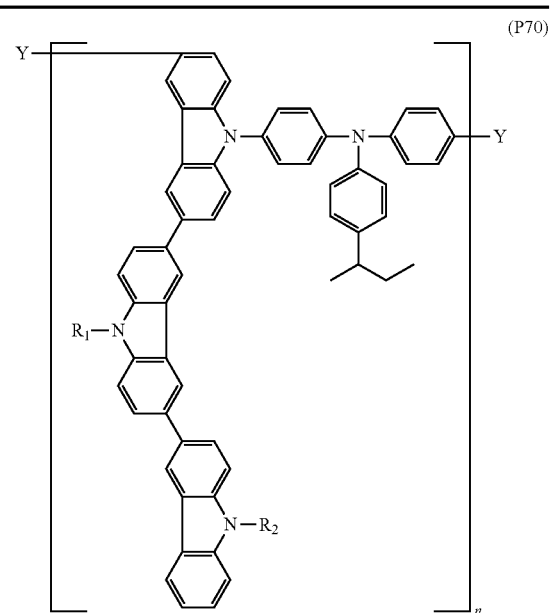
(P70)
| Compound | R₁ = R₂ | Y | Compound | R₁ | R₂ | Y |
|---|---|---|---|---|---|---|
| P70-1 | H-2 | H-1 | P70-11 | H-2 | H-1 | H-1 |
| P70-2 | H-3 | | P70-12 | H-3 | | |
| P70-3 | H-4 | | P70-13 | H-4 | | |
| P70-4 | H-5 | | P70-14 | H-5 | | |
| P70-5 | H-6 | | P70-15 | H-6 | | |
| P70-6 | H-7 | | P70-16 | H-7 | | |
| P70-7 | H-8 | | P70-17 | H-8 | | |
| P70-8 | H-9 | | P70-18 | H-9 | | |
| P70-9 | H-10 | | P70-19 | H-10 | | |
| P70-10 | H-11 | | P70-20 | H-11 | | |
TABLE 56
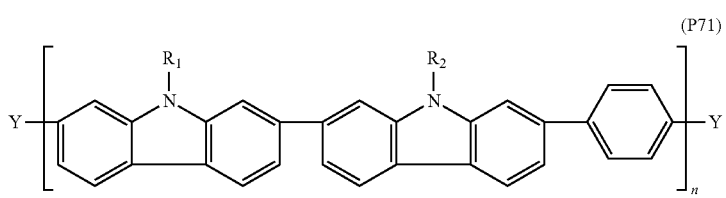
(P71)
| Compound | R₁ = R₂ | Y | Compound | R₁ | R₂ | Y |
|---|---|---|---|---|---|---|
| P71-1 | H-2 | H-1 | P71-11 | H-2 | H-1 | H-1 |
| P71-2 | H-3 | | P71-12 | H-3 | | |
| P71-3 | H-4 | | P71-13 | H-4 | | |
| P71-4 | H-5 | | P71-14 | H-5 | | |
| P71-5 | H-6 | | P71-15 | H-6 | | |
| P71-6 | H-7 | | P71-16 | H-7 | | |
| P71-7 | H-8 | | P71-17 | H-8 | | |
| P71-8 | H-9 | | P71-18 | H-9 | | |
| P71-9 | H-10 | | P71-19 | H-10 | | |
| P71-10 | H-11 | | P71-20 | H-11 | | |

TABLE 57

(P72)

| Compound | R₁ = R₂ | Y | Compound | R₁ | R₂ | Y |
|---|---|---|---|---|---|---|
| P72-1 | H-2 | H-1 | P72-11 | H-2 | H-1 | H-1 |
| P72-2 | H-3 | | P72-12 | H-3 | | |
| P72-3 | H-4 | | P72-13 | H-4 | | |
| P72-4 | H-5 | | P72-14 | H-5 | | |
| P72-5 | H-6 | | P72-15 | H-6 | | |
| P72-6 | H-7 | | P72-16 | H-7 | | |
| P72-7 | H-8 | | P72-17 | H-8 | | |
| P72-8 | H-9 | | P72-18 | H-9 | | |
| P72-9 | H-10 | | P72-19 | H-10 | | |
| P72-10 | H-11 | | P72-20 | H-11 | | |

TABLE 58

(P73)

| Compound | R₁ = R₂ | Y | Compound | R₁ | R₂ | Y |
|---|---|---|---|---|---|---|
| P73-1 | H-2 | H-1 | P73-11 | H-2 | H-1 | H-1 |
| P73-2 | H-3 | | P73-12 | H-3 | | |
| P73-3 | H-4 | | P73-13 | H-4 | | |
| P73-4 | H-5 | | P73-14 | H-5 | | |
| P73-5 | H-6 | | P73-15 | H-6 | | |
| P73-6 | H-7 | | P73-16 | H-7 | | |
| P73-7 | H-8 | | P73-17 | H-8 | | |
| P73-8 | H-9 | | P73-18 | H-9 | | |
| P73-9 | H-10 | | P73-19 | H-10 | | |
| P73-10 | H-11 | | P73-20 | H-11 | | |

TABLE 59

(P74)

| Compound | R₁ = R₂ | Y | Compound | R₁ | R₂ | Y |
|---|---|---|---|---|---|---|
| P74-1 | H-2 | H-1 | P74-11 | H-2 | H-1 | H-1 |
| P74-2 | H-3 | | P74-12 | H-3 | | |
| P74-3 | H-4 | | P74-13 | H-4 | | |
| P74-4 | H-5 | | P74-14 | H-5 | | |
| P74-5 | H-6 | | P74-15 | H-6 | | |
| P74-6 | H-7 | | P74-16 | H-7 | | |
| P74-7 | H-8 | | P74-17 | H-8 | | |
| P74-8 | H-9 | | P74-18 | H-9 | | |
| P74-9 | H-10 | | P74-19 | H-10 | | |
| P74-10 | H-11 | | P74-20 | H-11 | | |

TABLE 60
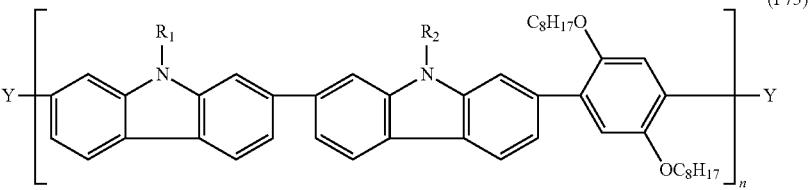
(P75)
| Compound | R₁ = R₂ | Y | Compound | R₁ | R₂ | Y |
|---|---|---|---|---|---|---|
| P75-1 | H-2 | H-1 | P75-11 | H-2 | H-1 | H-1 |
| P75-2 | H-3 | | P75-12 | H-3 | | |
| P75-3 | H-4 | | P75-13 | H-4 | | |
| P75-4 | H-5 | | P75-14 | H-5 | | |
| P75-5 | H-6 | | P75-15 | H-6 | | |
| P75-6 | H-7 | | P75-16 | H-7 | | |
| P75-7 | H-8 | | P75-17 | H-8 | | |
| P75-8 | H-9 | | P75-18 | H-9 | | |
| P75-9 | H-10 | | P75-19 | H-10 | | |
| P75-10 | H-11 | | P75-20 | H-11 | | |
TABLE 61
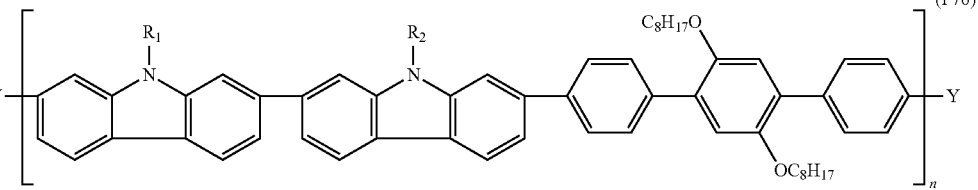
(P76)
| Compound | R₁ = R₂ | Y | Compound | R₁ | R₂ | Y |
|---|---|---|---|---|---|---|
| P76-1 | H-2 | H-1 | P76-11 | H-2 | H-1 | H-1 |
| P76-2 | H-3 | | P76-12 | H-3 | | |
| P76-3 | H-4 | | P76-13 | H-4 | | |
| P76-4 | H-5 | | P76-14 | H-5 | | |
| P76-5 | H-6 | | P76-15 | H-6 | | |
| P76-6 | H-7 | | P76-16 | H-7 | | |
| P76-7 | H-8 | | P76-17 | H-8 | | |
| P76-8 | H-9 | | P76-18 | H-9 | | |
| P76-9 | H-10 | | P76-19 | H-10 | | |
| P76-10 | H-11 | | P76-20 | H-11 | | |
TABLE 62
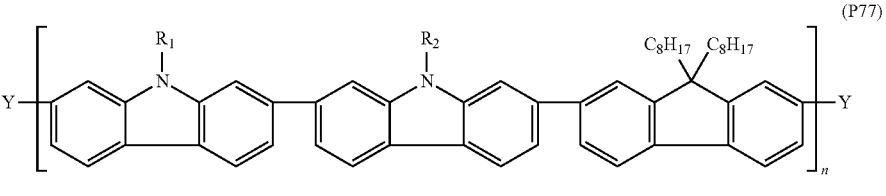
(P77)
| Compound | R₁ = R₂ | Y | Compound | R₁ | R₂ | Y |
|---|---|---|---|---|---|---|
| P77-1 | H-2 | H-1 | P77-11 | H-2 | H-1 | H-1 |
| P77-2 | H-3 | | P77-12 | H-3 | | |
| P77-3 | H-4 | | P77-13 | H-4 | | |
| P77-4 | H-5 | | P77-14 | H-5 | | |
| P77-5 | H-6 | | P77-15 | H-6 | | |
| P77-6 | H-7 | | P77-16 | H-7 | | |
| P77-7 | H-8 | | P77-17 | H-8 | | |

TABLE 62-continued (P77)

| Compound | R₁ = R₂ | Y | Compound | R₁ | R₂ | Y |
|---|---|---|---|---|---|---|
| P77-8 | H-9 | | P77-18 | H-9 | | |
| P77-9 | H-10 | | P77-19 | H-10 | | |
| P77-10 | H-11 | | P77-20 | H-11 | | |

TABLE 63

(P78)

| Compound | R₁ = R₂ | Y | Compound | R₁ | R₂ | Y |
|---|---|---|---|---|---|---|
| P78-1 | H-2 | H-1 | P78-11 | H-2 | H-1 | H-1 |
| P78-2 | H-3 | | P78-12 | H-3 | | |
| P78-3 | H-4 | | P78-13 | H-4 | | |
| P78-4 | H-5 | | P78-14 | H-5 | | |
| P78-5 | H-6 | | P78-15 | H-6 | | |
| P78-6 | H-7 | | P78-16 | H-7 | | |
| P78-7 | H-8 | | P78-17 | H-8 | | |
| P78-8 | H-9 | | P78-18 | H-9 | | |
| P78-9 | H-10 | | P78-19 | H-10 | | |
| P78-10 | H-11 | | P78-20 | H-11 | | |

TABLE 64

(P79)

| Compound | R₁ = R₂ | Y | Compound | R₁ | R₂ | Y |
|---|---|---|---|---|---|---|
| P79-1 | H-2 | H-1 | P79-11 | H-2 | H-1 | H-1 |
| P79-2 | H-3 | | P79-12 | H-3 | | |
| P79-3 | H-4 | | P79-13 | H-4 | | |
| P79-4 | H-5 | | P79-14 | H-5 | | |
| P79-5 | H-6 | | P79-15 | H-6 | | |
| P79-6 | H-7 | | P79-16 | H-7 | | |
| P79-7 | H-8 | | P79-17 | H-8 | | |
| P79-8 | H-9 | | P79-18 | H-9 | | |
| P79-9 | H-10 | | P79-19 | H-10 | | |
| P79-10 | H-11 | | P79-20 | H-11 | | |

TABLE 65
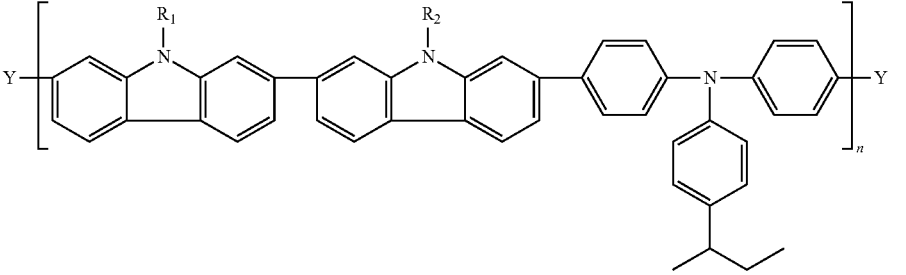
| Compound | R₁ = R₂ | Y | Compound | R₁ | R₂ | Y |
|---|---|---|---|---|---|---|
| P80-1 | H-2 | H-1 | P80-11 | H-2 | H-1 | H-1 |
| P80-2 | H-3 | | P80-12 | H-3 | | |
| P80-3 | H-4 | | P80-13 | H-4 | | |
| P80-4 | H-5 | | P80-14 | H-5 | | |
| P80-5 | H-6 | | P80-15 | H-6 | | |
| P80-6 | H-7 | | P80-16 | H-7 | | |
| P80-7 | H-8 | | P80-17 | H-8 | | |
| P80-8 | H-9 | | P80-18 | H-9 | | |
| P80-9 | H-10 | | P80-19 | H-10 | | |
| P80-10 | H-11 | | P80-20 | H-11 | | |
TABLE 66
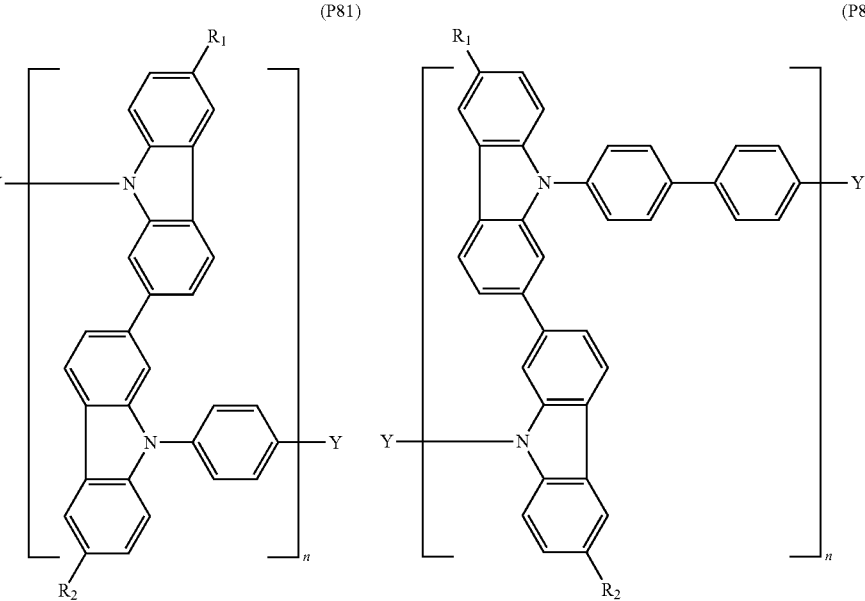
| Compound | R₁ = R₂ | Y | Compound | R₁ = R₂ | Y |
|---|---|---|---|---|---|
| P81-1 | H-2 | H-1 | P82-1 | H-2 | H-1 |
| P81-2 | H-3 | | P82-2 | H-3 | |
| P81-3 | H-4 | | P82-3 | H-4 | |
| P81-4 | H-5 | | P82-4 | H-5 | |
| P81-5 | H-6 | | P82-5 | H-6 | |
| P81-6 | H-7 | | P82-6 | H-7 | |
| P81-7 | H-8 | | P82-7 | H-8 | |
| P81-8 | H-9 | | P82-8 | H-9 | |
| P81-9 | H-10 | | P82-9 | H-10 | |
| P81-10 | H-11 | | P82-10 | H-11 | |

TABLE 67

(P83) (P84)

| Compound | R₁ = R₂ | Y | Compound | R₁ = R₂ | Y |
|---|---|---|---|---|---|
| P83-1 | H-2 | H-1 | P84-1 | H-2 | H-1 |
| P83-2 | H-3 | | P84-2 | H-3 | |
| P83-3 | H-4 | | P84-3 | H-4 | |
| P83-4 | H-5 | | P84-4 | H-5 | |
| P83-5 | H-6 | | P84-5 | H-6 | |
| P83-6 | H-7 | | P84-6 | H-7 | |
| P83-7 | H-8 | | P84-7 | H-8 | |
| P83-8 | H-9 | | P84-8 | H-9 | |
| P83-9 | H-10 | | P84-9 | H-10 | |
| P83-10 | H-11 | | P84-10 | H-11 | |

TABLE 68

(P85) (P86)

| Compound | R₁ = R₂ | Y | Compound | R₁ = R₂ | Y |
|---|---|---|---|---|---|
| P85-1 | H-2 | H-1 | P86-1 | H-2 | H-1 |
| P85-2 | H-3 | | P86-2 | H-3 | |

TABLE 68-continued

| | | | |
|---|---|---|---|
| P85-3 | H-4 | P86-3 | H-4 |
| P85-4 | H-5 | P86-4 | H-5 |
| P85-5 | H-6 | P86-5 | H-6 |
| P85-6 | H-7 | P86-6 | H-7 |
| P85-7 | H-8 | P86-7 | H-8 |
| P85-8 | H-9 | P86-8 | H-9 |
| P85-9 | H-10 | P86-9 | H-10 |
| P85-10 | H-11 | P86-10 | H-11 |

TABLE 69

| Compound | R₁ = R₂ | Y | Compound | R₁ = R₂ | Y |
|---|---|---|---|---|---|
| P87-1 | H-2 | H-1 | P88-1 | H-2 | H-1 |
| P87-2 | H-3 | | P88-2 | H-3 | |
| P87-3 | H-4 | | P88-3 | H-4 | |
| P87-4 | H-5 | | P88-4 | H-5 | |
| P87-5 | H-6 | | P88-5 | H-6 | |
| P87-6 | H-7 | | P88-6 | H-7 | |
| P87-7 | H-8 | | P88-7 | H-8 | |
| P87-8 | H-9 | | P88-8 | H-9 | |
| P87-9 | H-10 | | P88-9 | H-10 | |
| P87-10 | H-11 | | P88-10 | H-11 | |

TABLE 70

(P89) (P90)

| Compound | R₁ = R₂ | Y | Compound | R₁ = R₂ | Y |
| --- | --- | --- | --- | --- | --- |
| P89-1 | H-2 | H-1 | P90-1 | H-2 | H-1 |
| P89-2 | H-3 | | P90-2 | H-3 | |
| P89-3 | H-4 | | P90-3 | H-4 | |
| P89-4 | H-5 | | P90-4 | H-5 | |
| P89-5 | H-6 | | P90-5 | H-6 | |
| P89-6 | H-7 | | P90-6 | H-7 | |
| P89-7 | H-8 | | P90-7 | H-8 | |
| P89-8 | H-9 | | P90-8 | H-9 | |
| P89-9 | H-10 | | P90-9 | H-10 | |
| P89-10 | H-11 | | P90-10 | H-11 | |

TABLE 71

(P91) (P92)

| Compound | R₁ | Y | Compound | R₁ | Y |
| --- | --- | --- | --- | --- | --- |
| P91-1 | H-2 | H-1 | P92-1 | H-2 | H-1 |
| P91-2 | H-3 | | P92-2 | H-3 | |

TABLE 71-continued
| | | | |
|---|---|---|---|
| P91-3 | H-4 | P92-3 | H-4 |
| P91-4 | H-5 | P92-4 | H-5 |
| P91-5 | H-6 | P92-5 | H-6 |
| P91-6 | H-7 | P92-6 | H-7 |
| P91-7 | H-8 | P92-7 | H-8 |
| P91-8 | H-9 | P92-8 | H-9 |
| P91-9 | H-10 | P92-9 | H-10 |
| P91-10 | H-11 | P92-10 | H-11 |
TABLE 72
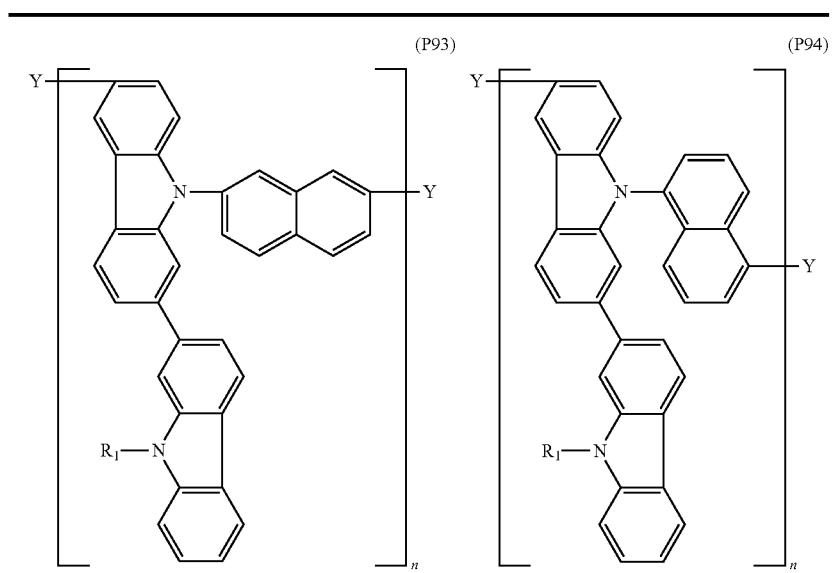
| Compound | R₁ | Y | Compound | R₁ | Y |
|---|---|---|---|---|---|
| P93-1 | H-2 | H-1 | P94-1 | H-2 | H-1 |
| P93-2 | H-3 | | P94-2 | H-3 | |
| P93-3 | H-4 | | P94-3 | H-4 | |
| P93-4 | H-5 | | P94-4 | H-5 | |
| P93-5 | H-6 | | P94-5 | H-6 | |
| P93-6 | H-7 | | P94-6 | H-7 | |
| P93-7 | H-8 | | P94-7 | H-8 | |
| P93-8 | H-9 | | P94-8 | H-9 | |
| P93-9 | H-10 | | P94-9 | H-10 | |
| P93-10 | H-11 | | P94-10 | H-11 | |

TABLE 73
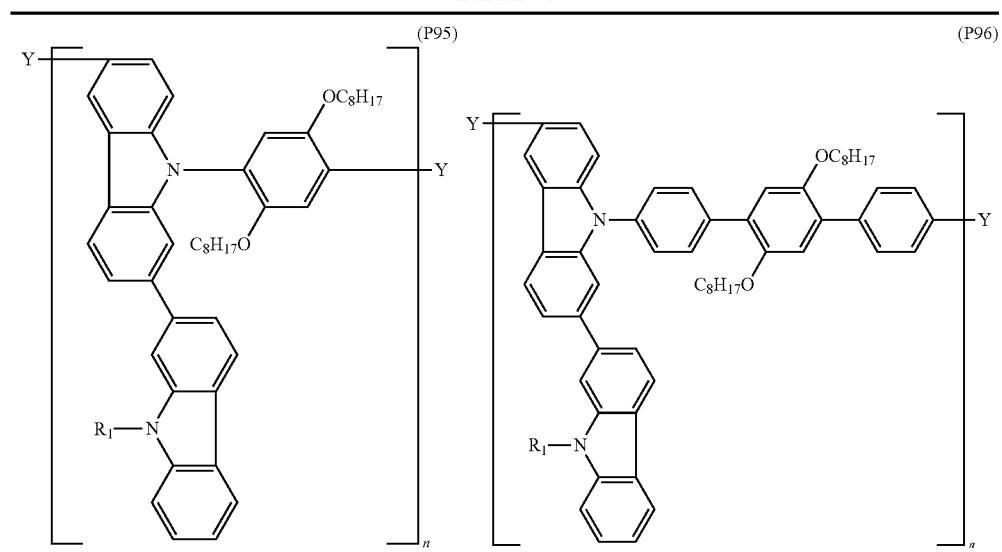
| Compound | R₁ | Y | Compound | R₁ | Y |
|---|---|---|---|---|---|
| P95-1 | H-2 | H-1 | P96-1 | H-2 | H-1 |
| P95-2 | H-3 | | P96-2 | H-3 | |
| P95-3 | H-4 | | P96-3 | H-4 | |
| P95-4 | H-5 | | P96-4 | H-5 | |
| P95-5 | H-6 | | P96-5 | H-6 | |
| P95-6 | H-7 | | P96-6 | H-7 | |
| P95-7 | H-8 | | P96-7 | H-8 | |
| P95-8 | H-9 | | P96-8 | H-9 | |
| P95-9 | H-10 | | P96-9 | H-10 | |
| P95-10 | H-11 | | P96-10 | H-11 | |
TABLE 74
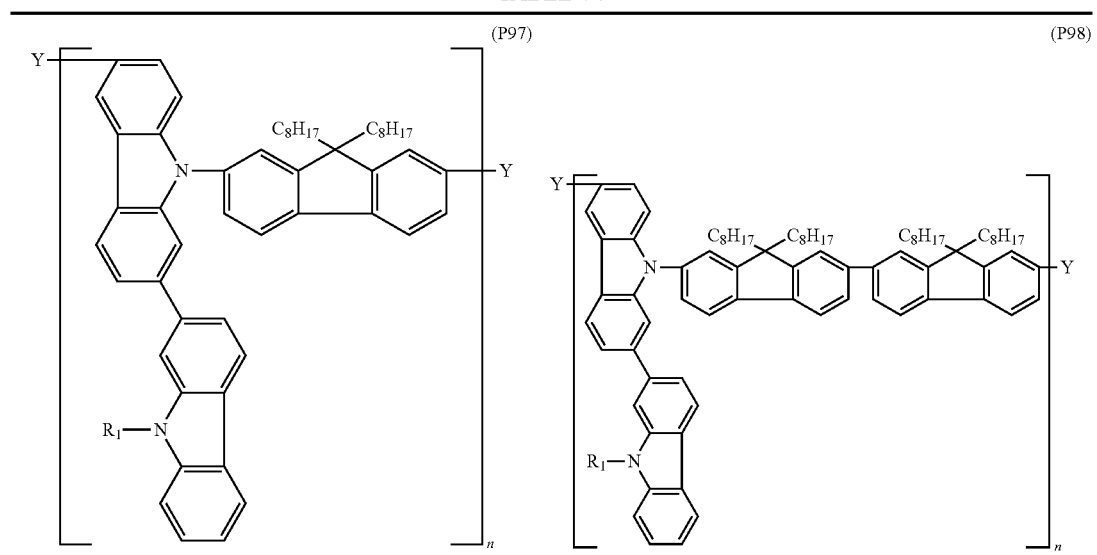
| Compound | R₁ | Y | Compound | R₁ | Y |
|---|---|---|---|---|---|
| P97-1 | H-2 | H-1 | P98-1 | H-2 | H-1 |
| P97-2 | H-3 | | P98-2 | H-3 | |
| P97-3 | H-4 | | P98-3 | H-4 | |
| P97-4 | H-5 | | P98-4 | H-5 | |
| P97-5 | H-6 | | P98-5 | H-6 | |
| P97-6 | H-7 | | P98-6 | H-7 | |
| P97-7 | H-8 | | P98-7 | H-8 | |

TABLE 74-continued

| | | | |
|---|---|---|---|
| P97-8 | H-9 | P98-8 | H-9 |
| P97-9 | H-10 | P98-9 | H-10 |
| P97-10 | H-11 | P98-10 | H-11 |

TABLE 75

(P99) (P100)

| Compound | R₁ | Y | Compound | R₁ | Y |
|---|---|---|---|---|---|
| P99-1 | H-2 | H-1 | P100-1 | H-2 | H-1 |
| P99-2 | H-3 | | P100-2 | H-3 | |
| P99-3 | H-4 | | P100-3 | H-4 | |
| P99-4 | H-5 | | P100-4 | H-5 | |
| P99-5 | H-6 | | P100-5 | H-6 | |
| P99-6 | H-7 | | P100-6 | H-7 | |
| P99-7 | H-8 | | P100-7 | H-8 | |
| P99-8 | H-9 | | P100-8 | H-9 | |
| P99-9 | H-10 | | P100-9 | H-10 | |
| P99-10 | H-11 | | P100-10 | H-11 | |

TABLE 76

(P101)

| Compound | $R_1 = R_2 = R_3$ | Y | Compound | $R_1 = R_3$ | $R_2$ | Y |
|---|---|---|---|---|---|---|
| P101-1 | H-2 | H-1 | P101-11 | H-2 | H-1 | H-1 |
| P101-2 | H-3 | | P101-12 | H-3 | | |
| P101-3 | H-4 | | P101-13 | H-4 | | |
| P101-4 | H-5 | | P101-14 | H-5 | | |
| P101-5 | H-6 | | P101-15 | H-6 | | |
| P101-6 | H-7 | | P101-16 | H-7 | | |
| P101-7 | H-8 | | P101-17 | H-8 | | |
| P101-8 | H-9 | | P101-18 | H-9 | | |
| P101-9 | H-10 | | P101-19 | H-10 | | |
| P101-10 | H-11 | | P101-20 | H-11 | | |

TABLE 77
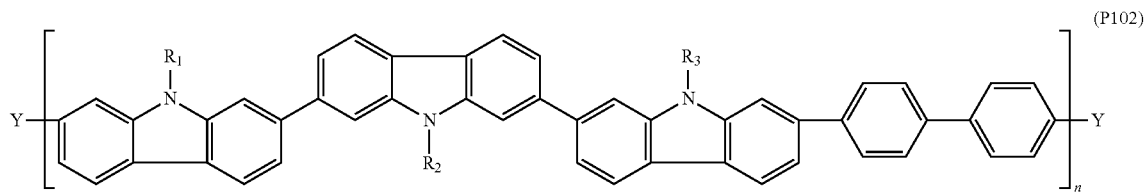
(P102)
| Compound | R₁ = R₂ = R₃ | Y | Compound | R₁ = R₃ | R₂ | Y |
|---|---|---|---|---|---|---|
| P102-1 | H-2 | H-1 | P102-11 | H-2 | H-1 | H-1 |
| P102-2 | H-3 | | P102-12 | H-3 | | |
| P102-3 | H-4 | | P102-13 | H-4 | | |
| P102-4 | H-5 | | P102-14 | H-5 | | |
| P102-5 | H-6 | | P102-15 | H-6 | | |
| P102-6 | H-7 | | P102-16 | H-7 | | |
| P102-7 | H-8 | | P102-17 | H-8 | | |
| P102-8 | H-9 | | P102-18 | H-9 | | |
| P102-9 | H-10 | | P102-19 | H-10 | | |
| P102-10 | H-11 | | P102-20 | H-11 | | |
TABLE 78
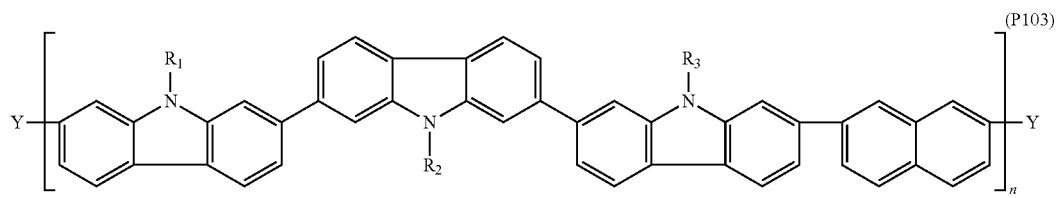
(P103)
| Compound | R₁ = R₂ = R₃ | Y | Compound | R₁ = R₃ | R₂ | Y |
|---|---|---|---|---|---|---|
| P103-1 | H-2 | H-1 | P103-11 | H-2 | H-1 | H-1 |
| P103-2 | H-3 | | P103-12 | H-3 | | |
| P103-3 | H-4 | | P103-13 | H-4 | | |
| P103-4 | H-5 | | P103-14 | H-5 | | |
| P103-5 | H-6 | | P103-15 | H-6 | | |
| P103-6 | H-7 | | P103-16 | H-7 | | |
| P103-7 | H-8 | | P103-17 | H-8 | | |
| P103-8 | H-9 | | P103-18 | H-9 | | |
| P103-9 | H-10 | | P103-19 | H-10 | | |
| P103-10 | H-11 | | P103-20 | H-11 | | |
TABLE 79
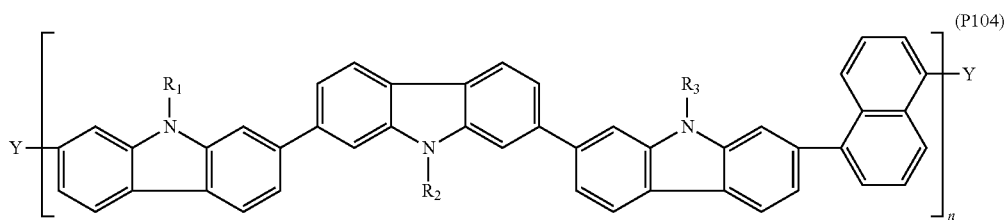
(P104)
| Compound | R₁ = R₂ = R₃ | Y | Compound | R₁ = R₃ | R₂ | Y |
|---|---|---|---|---|---|---|
| P104-1 | H-2 | H-1 | P104-11 | H-2 | H-1 | H-1 |
| P104-2 | H-3 | | P104-12 | H-3 | | |
| P104-3 | H-4 | | P104-13 | H-4 | | |
| P104-4 | H-5 | | P104-14 | H-5 | | |
| P104-5 | H-6 | | P104-15 | H-6 | | |
| P104-6 | H-7 | | P104-16 | H-7 | | |
| P104-7 | H-8 | | P104-17 | H-8 | | |
| P104-8 | H-9 | | P104-18 | H-9 | | |

TABLE 79-continued
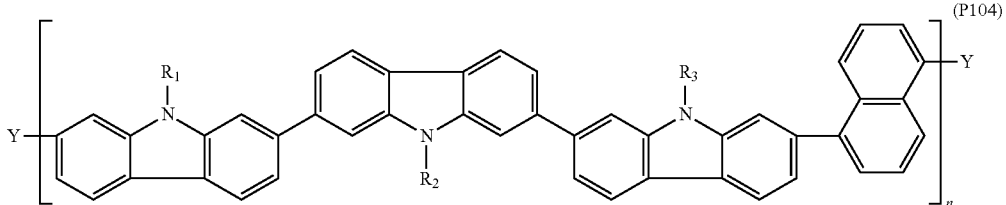
| Compound | $R_1 = R_2 = R_3$ | Y | Compound | $R_1 = R_3$ | $R_2$ | Y |
|---|---|---|---|---|---|---|
| P104-9 | H-10 | | P104-19 | H-10 | | |
| P104-10 | H-11 | | P104-20 | H-11 | | |
TABLE 80
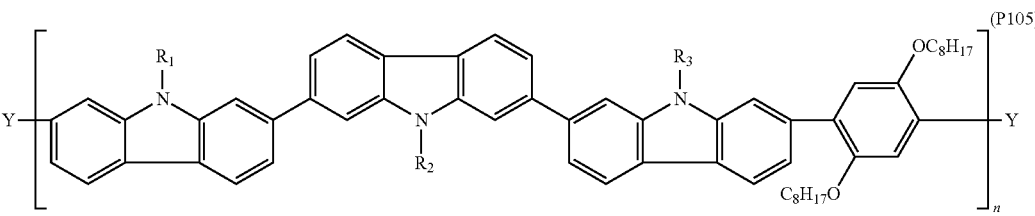
| Compound | $R_1 = R_2 = R_3$ | Y | Compound | $R_1 = R_3$ | $R_2$ | Y |
|---|---|---|---|---|---|---|
| P105-1 | H-2 | H-1 | P105-11 | H-2 | H-1 | H-1 |
| P105-2 | H-3 | | P105-12 | H-3 | | |
| P105-3 | H-4 | | P105-13 | H-4 | | |
| P105-4 | H-5 | | P105-14 | H-5 | | |
| P105-5 | H-6 | | P105-15 | H-6 | | |
| P105-6 | H-7 | | P105-16 | H-7 | | |
| P105-7 | H-8 | | P105-17 | H-8 | | |
| P105-8 | H-9 | | P105-18 | H-9 | | |
| P105-9 | H-10 | | P105-19 | H-10 | | |
| P105-10 | H-11 | | P105-20 | H-11 | | |
TABLE 81
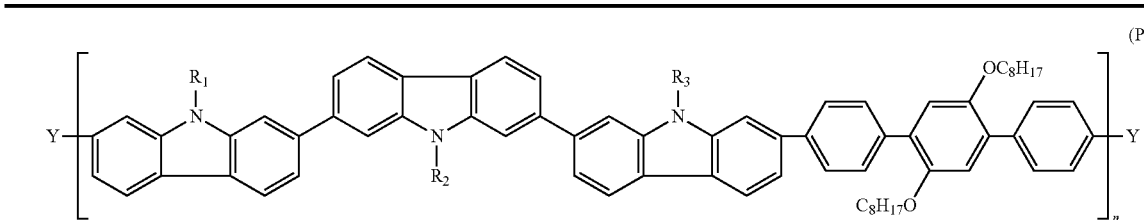
| Compound | $R_1 = R_2 = R_3$ | Y | Compound | $R_1 = R_3$ | $R_2$ | Y |
|---|---|---|---|---|---|---|
| P106-1 | H-2 | H-1 | P106-11 | H-2 | H-1 | H-1 |
| P106-2 | H-3 | | P106-12 | H-3 | | |
| P106-3 | H-4 | | P106-13 | H-4 | | |
| P106-4 | H-5 | | P106-14 | H-5 | | |
| P106-5 | H-6 | | P106-15 | H-6 | | |
| P106-6 | H-7 | | P106-16 | H-7 | | |
| P106-7 | H-8 | | P106-17 | H-8 | | |
| P106-8 | H-9 | | P106-18 | H-9 | | |
| P106-9 | H-10 | | P106-19 | H-10 | | |
| P106-10 | H-11 | | P106-20 | H-11 | | |

TABLE 82
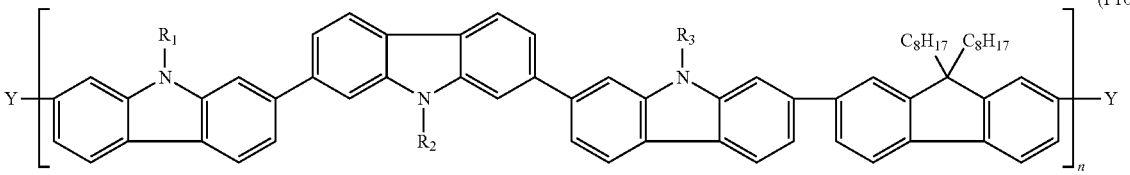
(P107)
| Compound | R₁=R₂=R₃ | Y | Compound | R₁=R₃ | R₂ | Y |
|---|---|---|---|---|---|---|
| P107-1 | H-2 | H-1 | P107-11 | H-2 | H-1 | H-1 |
| P107-2 | H-3 | | P107-12 | H-3 | | |
| P107-3 | H-4 | | P107-13 | H-4 | | |
| P107-4 | H-5 | | P107-14 | H-5 | | |
| P107-5 | H-6 | | P107-15 | H-6 | | |
| P107-6 | H-7 | | P107-16 | H-7 | | |
| P107-7 | H-8 | | P107-17 | H-8 | | |
| P107-8 | H-9 | | P107-18 | H-9 | | |
| P107-9 | H-10 | | P107-19 | H-10 | | |
| P107-10 | H-11 | | P107-20 | H-11 | | |
TABLE 83
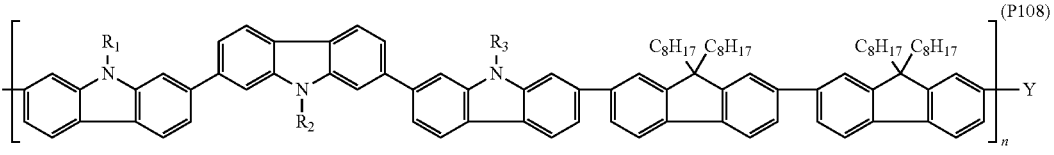
(P108)
| Compound | R₁=R₂=R₃ | Y | Compound | R₁=R₃ | R₂ | Y |
|---|---|---|---|---|---|---|
| P108-1 | H-2 | H-1 | P108-11 | H-2 | H-1 | H-1 |
| P108-2 | H-3 | | P108-12 | H-3 | | |
| P108-3 | H-4 | | P108-13 | H-4 | | |
| P108-4 | H-5 | | P108-14 | H-5 | | |
| P108-5 | H-6 | | P108-15 | H-6 | | |
| P108-6 | H-7 | | P108-16 | H-7 | | |
| P108-7 | H-8 | | P108-17 | H-8 | | |
| P108-8 | H-9 | | P108-18 | H-9 | | |
| P108-9 | H-10 | | P108-19 | H-10 | | |
| P108-10 | H-11 | | P108-20 | H-11 | | |
TABLE 84
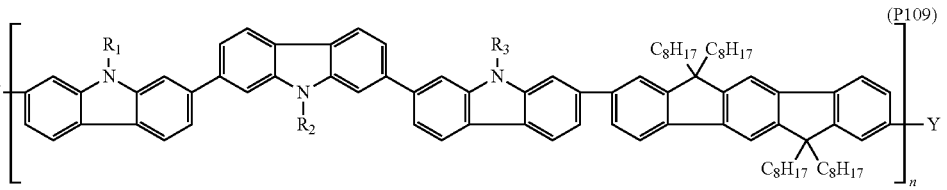
(P109)
| Compound | R₁=R₂=R₃ | Y | Compound | R₁=R₃ | R₂ | Y |
|---|---|---|---|---|---|---|
| P109-1 | H-2 | H-1 | P109-11 | H-2 | H-1 | H-1 |
| P109-2 | H-3 | | P109-12 | H-3 | | |
| P109-3 | H-4 | | P109-13 | H-4 | | |
| P109-4 | H-5 | | P109-14 | H-5 | | |
| P109-5 | H-6 | | P109-15 | H-6 | | |
| P109-6 | H-7 | | P109-16 | H-7 | | |
| P109-7 | H-8 | | P109-17 | H-8 | | |
| P109-8 | H-9 | | P109-18 | H-9 | | |
| P109-9 | H-10 | | P109-19 | H-10 | | |
| P109-10 | H-11 | | P109-20 | H-11 | | |

TABLE 85
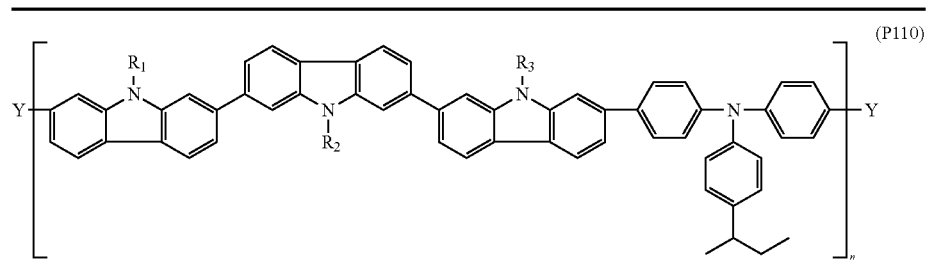
(P110)
| Compound | R₁=R₂=R₃ | Y | Compound | R₁=R₃ | R₂ | Y |
|---|---|---|---|---|---|---|
| P110-1 | H-2 | H-1 | P110-11 | H-2 | H-1 | H-1 |
| P110-2 | H-3 | | P110-12 | H-3 | | |
| P110-3 | H-4 | | P110-13 | H-4 | | |
| P110-4 | H-5 | | P110-14 | H-5 | | |
| P110-5 | H-6 | | P110-15 | H-6 | | |
| P110-6 | H-7 | | P110-16 | H-7 | | |
| P110-7 | H-8 | | P110-17 | H-8 | | |
| P110-8 | H-9 | | P110-18 | H-9 | | |
| P110-9 | H-10 | | P110-19 | H-10 | | |
| P110-10 | H-11 | | P110-20 | H-11 | | |
TABLE 86
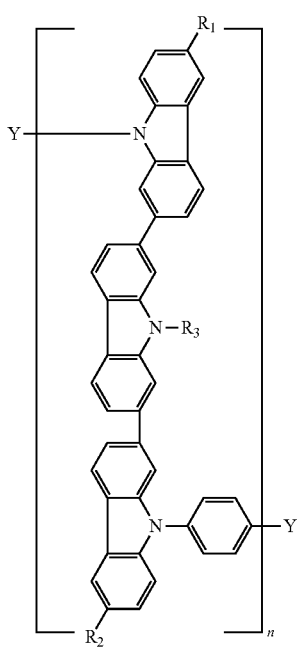
(P111)
TABLE 87
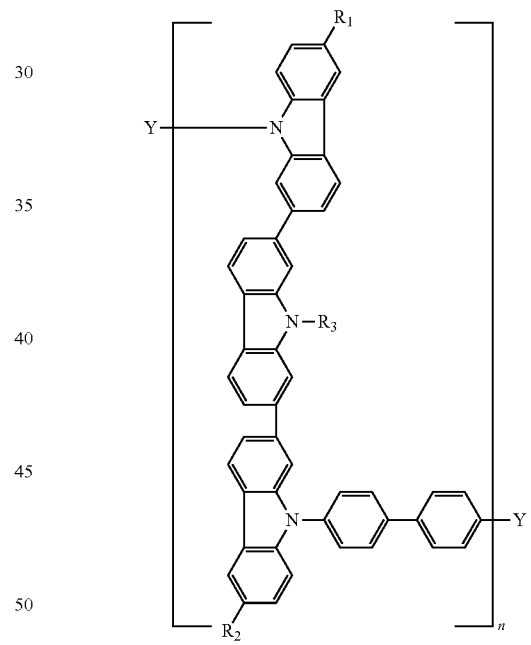
(P112)
| Compound | R₁=R₂=R₃ | Y | Compound | R₁=R₂ | R₃ | Y | Compound | R₁=R₂=R₃ | Y | Compound | R₁=R₂ | R₃ | Y |
|---|---|---|---|---|---|---|---|---|---|---|---|---|---|
| P111-1 | H-2 | H-1 | P111-11 | H-2 | H-1 | H-1 | P112-1 | H-2 | H-1 | P112-11 | H-2 | H-1 | H-1 |
| P111-2 | H-3 | | P111-12 | H-3 | | | P112-2 | H-3 | | P112-12 | H-3 | | |
| P111-3 | H-4 | | P111-13 | H-4 | | | P112-3 | H-4 | | P112-13 | H-4 | | |
| P111-4 | H-5 | | P111-14 | H-5 | | | P112-4 | H-5 | | P112-14 | H-5 | | |
| P111-5 | H-6 | | P111-15 | H-6 | | | P112-5 | H-6 | | P112-15 | H-6 | | |
| P111-6 | H-7 | | P111-16 | H-7 | | | P112-6 | H-7 | | P112-16 | H-7 | | |
| P111-7 | H-8 | | P111-17 | H-8 | | | P112-7 | H-8 | | P112-17 | H-8 | | |
| P111-8 | H-9 | | P111-18 | H-9 | | | P112-8 | H-9 | | P112-18 | H-9 | | |
| P111-9 | H-10 | | P111-19 | H-10 | | | P112-9 | H-10 | | P112-19 | H-10 | | |
| P111-10 | H-11 | | P111-20 | H-11 | | | P112-10 | H-11 | | P112-20 | H-11 | | |

TABLE 88
(P113)
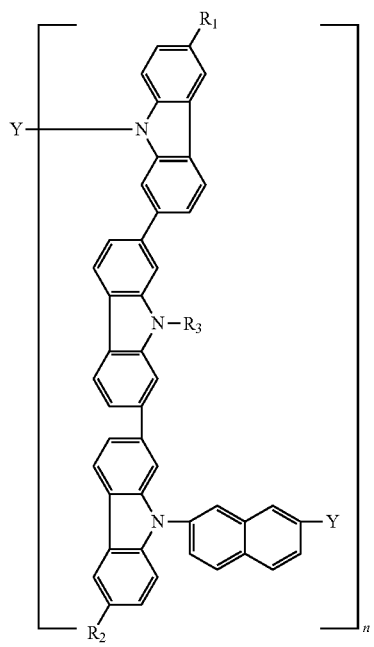
| Compound | R₁=R₂=R₃ | Y | Compound | R₁=R₂ | R₃ | Y |
|---|---|---|---|---|---|---|
| P113-1 | H-2 | H-1 | P113-11 | H-2 | H-1 | H-1 |
| P113-2 | H-3 | | P113-12 | H-3 | | |
| P113-3 | H-4 | | P113-13 | H-4 | | |
| P113-4 | H-5 | | P113-14 | H-5 | | |
| P113-5 | H-6 | | P113-15 | H-6 | | |
| P113-6 | H-7 | | P113-16 | H-7 | | |
| P113-7 | H-8 | | P113-17 | H-8 | | |
| P113-8 | H-9 | | P113-18 | H-9 | | |
| P113-9 | H-10 | | P113-19 | H-10 | | |
| P113-10 | H-11 | | P113-20 | H-11 | | |
TABLE 89
(P114)
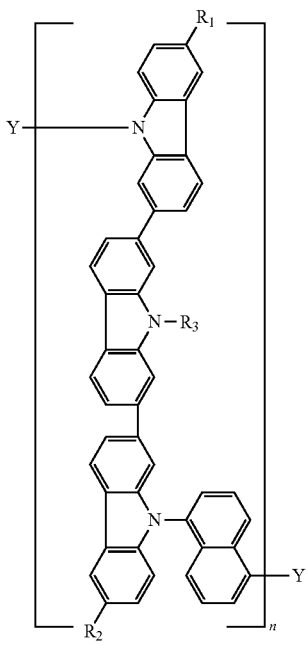
TABLE 89-continued
| Compound | R₁=R₂=R₃ | Y | Compound | R₁=R₂ | R₃ | Y |
|---|---|---|---|---|---|---|
| P114-1 | H-2 | H-1 | P114-11 | H-2 | H-1 | H-1 |
| P114-2 | H-3 | | P114-12 | H-3 | | |
| P114-3 | H-4 | | P114-13 | H-4 | | |
| P114-4 | H-5 | | P114-14 | H-5 | | |
| P114-5 | H-6 | | P114-15 | H-6 | | |
| P114-6 | H-7 | | P114-16 | H-7 | | |
| P114-7 | H-8 | | P114-17 | H-8 | | |
| P114-8 | H-9 | | P114-18 | H-9 | | |
| P114-9 | H-10 | | P114-19 | H-10 | | |
| P114-10 | H-11 | | P114-20 | H-11 | | |
TABLE 90
(P115)
| Compound | R₁=R₂=R₃ | Y | Compound | R₁=R₂ | R₃ | Y |
|---|---|---|---|---|---|---|
| P115-1 | H-2 | H-1 | P115-11 | H-2 | H-1 | H-1 |
| P115-2 | H-3 | | P115-12 | H-3 | | |
| P115-3 | H-4 | | P115-13 | H-4 | | |
| P115-4 | H-5 | | P115-14 | H-5 | | |
| P115-5 | H-6 | | P115-15 | H-6 | | |
| P115-6 | H-7 | | P115-16 | H-7 | | |
| P115-7 | H-8 | | P115-17 | H-8 | | |
| P115-8 | H-9 | | P115-18 | H-9 | | |
| P115-9 | H-10 | | P115-19 | H-10 | | |
| P115-10 | H-11 | | P115-20 | H-11 | | |

TABLE 91
(P116)
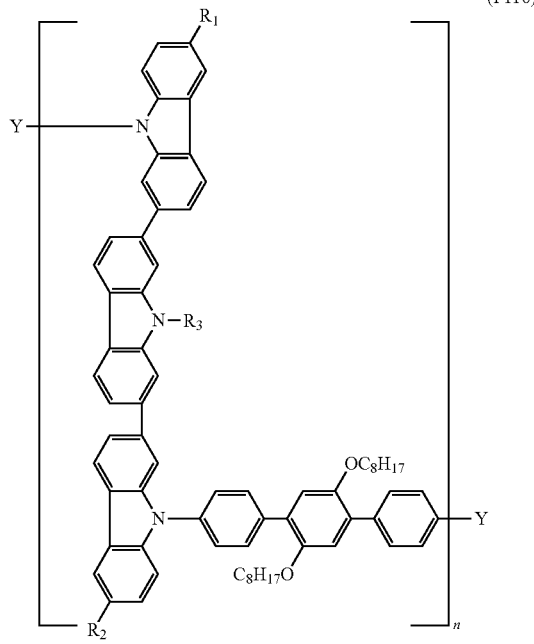
| Compound | R₁=R₂=R₃ | Y | Compound | R₁=R₂ | R₃ | Y |
|---|---|---|---|---|---|---|
| P116-1 | H-2 | H-1 | P116-11 | H-2 | H-1 | H-1 |
| P116-2 | H-3 | | P116-12 | H-3 | | |
| P116-3 | H-4 | | P116-13 | H-4 | | |
| P116-4 | H-5 | | P116-14 | H-5 | | |
| P116-5 | H-6 | | P116-15 | H-6 | | |
| P116-6 | H-7 | | P116-16 | H-7 | | |
| P116-7 | H-8 | | P116-17 | H-8 | | |
| P116-8 | H-9 | | P116-18 | H-9 | | |
| P116-9 | H-10 | | P116-19 | H-10 | | |
| P116-10 | H-11 | | P116-20 | H-11 | | |
TABLE 92
(P117)
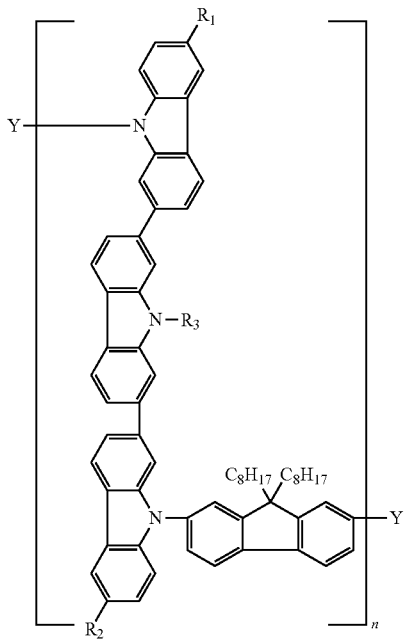
TABLE 92-continued
| Compound | R₁=R₂=R₃ | Y | Compound | R₁=R₂ | R₃ | Y |
|---|---|---|---|---|---|---|
| P117-1 | H-2 | H-1 | P117-11 | H-2 | H-1 | H-1 |
| P117-2 | H-3 | | P117-12 | H-3 | | |
| P117-3 | H-4 | | P117-13 | H-4 | | |
| P117-4 | H-5 | | P117-14 | H-5 | | |
| P117-5 | H-6 | | P117-15 | H-6 | | |
| P117-6 | H-7 | | P117-16 | H-7 | | |
| P117-7 | H-8 | | P117-17 | H-8 | | |
| P117-8 | H-9 | | P117-18 | H-9 | | |
| P117-9 | H-10 | | P117-19 | H-10 | | |
| P117-10 | H-11 | | P117-20 | H-11 | | |
TABLE 93
(P118)
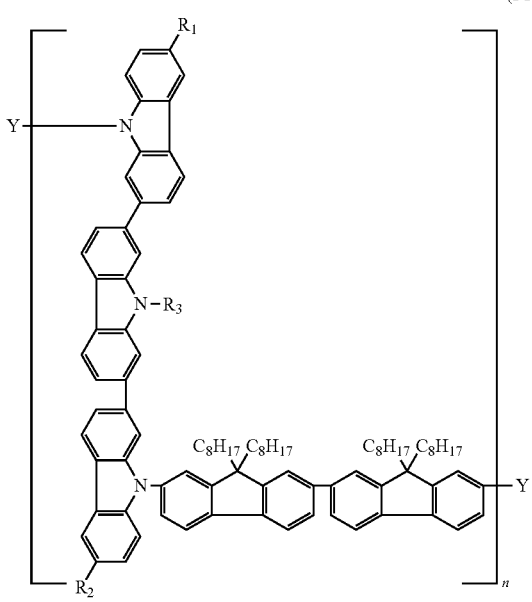
| Compound | R₁=R₂=R₃ | Y | Compound | R₁=R₂ | R₃ | Y |
|---|---|---|---|---|---|---|
| P118-1 | H-2 | H-1 | P118-11 | H-2 | H-1 | H-1 |
| P118-2 | H-3 | | P118-12 | H-3 | | |
| P118-3 | H-4 | | P118-13 | H-4 | | |
| P118-4 | H-5 | | P118-14 | H-5 | | |
| P118-5 | H-6 | | P118-15 | H-6 | | |
| P118-6 | H-7 | | P118-16 | H-7 | | |
| P118-7 | H-8 | | P118-17 | H-8 | | |
| P118-8 | H-9 | | P118-18 | H-9 | | |
| P118-9 | H-10 | | P118-19 | H-10 | | |
| P118-10 | H-11 | | P118-20 | H-11 | | |

TABLE 94
(P119)
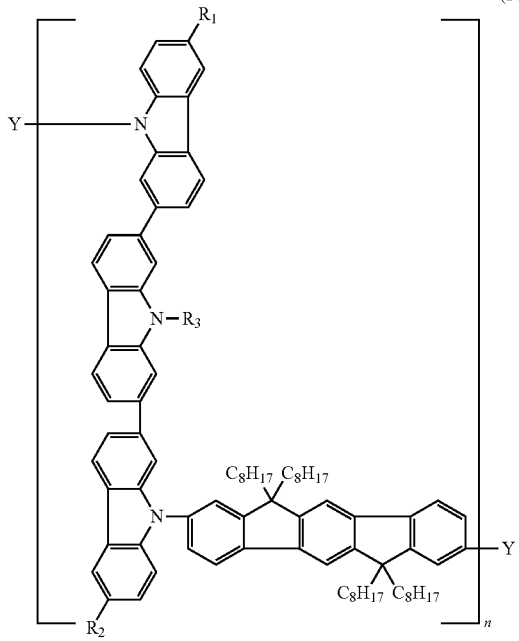
| Compound | R₁=R₂=R₃ | Y | Compound | R₁=R₂ | R₃ | Y |
|---|---|---|---|---|---|---|
| P119-1 | H-2 | H-1 | P119-11 | H-2 | H-1 | H-1 |
| P119-2 | H-3 | | P119-12 | H-3 | | |
| P119-3 | H-4 | | P119-13 | H-4 | | |
| P119-4 | H-5 | | P119-14 | H-5 | | |
| P119-5 | H-6 | | P119-15 | H-6 | | |
| P119-6 | H-7 | | P119-16 | H-7 | | |
| P119-7 | H-8 | | P119-17 | H-8 | | |
| P119-8 | H-9 | | P119-18 | H-9 | | |
| P119-9 | H-10 | | P119-19 | H-10 | | |
| P119-10 | H-11 | | P119-20 | H-11 | | |
TABLE 95
(P120)
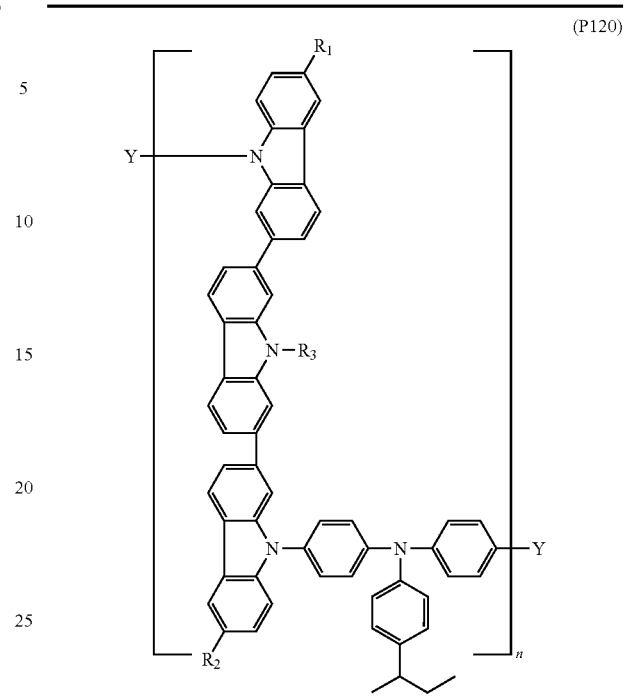
| Compound | R₁=R₂=R₃ | Y | Compound | R₁=R₂ | R₃ | Y |
|---|---|---|---|---|---|---|
| P120-1 | H-2 | H-1 | P120-11 | H-2 | H-1 | H-1 |
| P120-2 | H-3 | | P120-12 | H-3 | | |
| P120-3 | H-4 | | P120-13 | H-4 | | |
| P120-4 | H-5 | | P120-14 | H-5 | | |
| P120-5 | H-6 | | P120-15 | H-6 | | |
| P120-6 | H-7 | | P120-16 | H-7 | | |
| P120-7 | H-8 | | P120-17 | H-8 | | |
| P120-8 | H-9 | | P120-18 | H-9 | | |
| P120-9 | H-10 | | P120-19 | H-10 | | |
| P120-10 | H-11 | | P120-20 | H-11 | | |
TABLE 96
(P121) 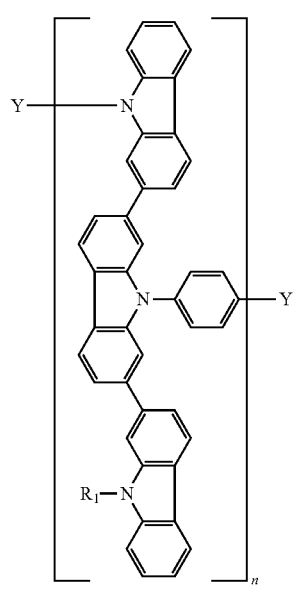 (P122) 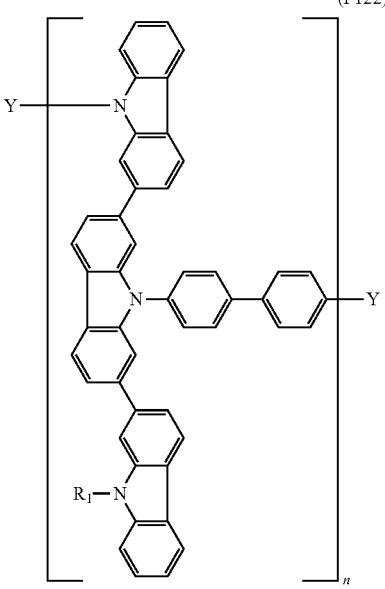

TABLE 96-continued
| Compound | R₁ | Y | Compound | R₁ | Y |
|---|---|---|---|---|---|
| P121-1 | H-2 | H-1 | P122-1 | H-2 | H-1 |
| P121-2 | H-3 | | P122-2 | H-3 | |
| P121-3 | H-4 | | P122-3 | H-4 | |
| P121-4 | H-5 | | P122-4 | H-5 | |
| P121-5 | H-6 | | P122-5 | H-6 | |
| P121-6 | H-7 | | P122-6 | H-7 | |
| P121-7 | H-8 | | P122-7 | H-8 | |
| P121-8 | H-9 | | P122-8 | H-9 | |
| P121-9 | H-10 | | P122-9 | H-10 | |
| P121-10 | H-11 | | P122-10 | H-11 | |
TABLE 97
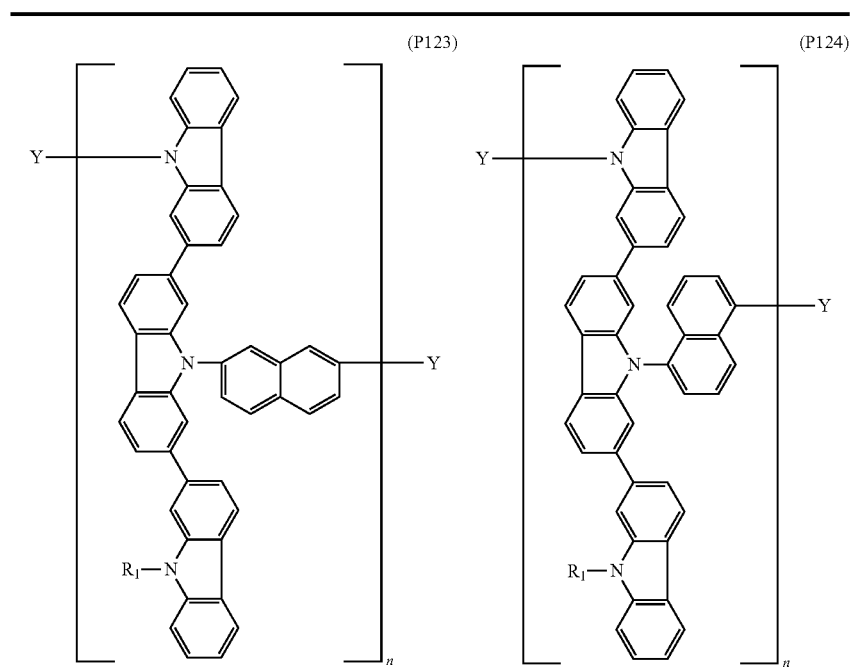
| Compound | R₁ | Y | Compound | R₁ | Y |
|---|---|---|---|---|---|
| P123-1 | H-2 | H-1 | P124-1 | H-2 | H-1 |
| P123-2 | H-3 | | P124-2 | H-3 | |
| P123-3 | H-4 | | P124-3 | H-4 | |
| P123-4 | H-5 | | P124-4 | H-5 | |
| P123-5 | H-6 | | P124-5 | H-6 | |
| P123-6 | H-7 | | P124-6 | H-7 | |
| P123-7 | H-8 | | P124-7 | H-8 | |
| P123-8 | H-9 | | P124-8 | H-9 | |
| P123-9 | H-10 | | P124-9 | H-10 | |
| P123-10 | H-11 | | P124-10 | H-11 | |

TABLE 98
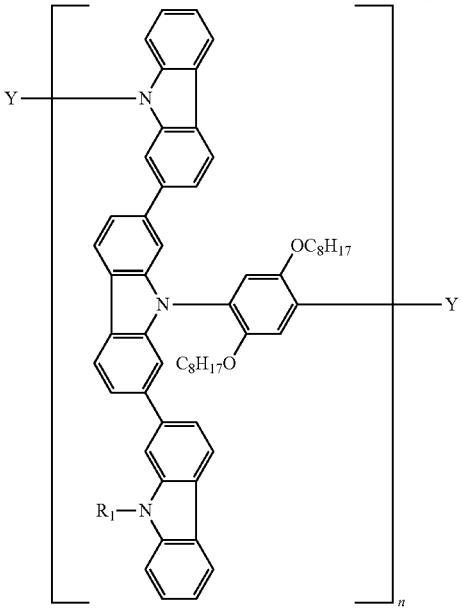
| Compound | R₁ | Y |
|---|---|---|
| P125-1 | H-2 | H-1 |
| P125-2 | H-3 | |
| P125-3 | H-4 | |
| P125-4 | H-5 | |
| P125-5 | H-6 | |
| P125-6 | H-7 | |
| P125-7 | H-8 | |
| P125-8 | H-9 | |
| P125-9 | H-10 | |
| P125-10 | H-11 | |
| Compound | R₁ | Y |
|---|---|---|
| P126-1 | H-2 | H-1 |
| P126-2 | H-3 | |
| P126-3 | H-4 | |
| P126-4 | H-5 | |
| P126-5 | H-6 | |
| P126-6 | H-7 | |
| P126-7 | H-8 | |
| P126-8 | H-9 | |
| P126-9 | H-10 | |
| P126-10 | H-11 | |
TABLE 99
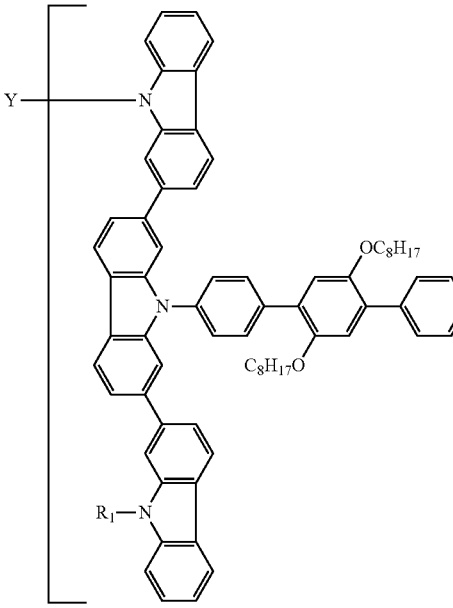

TABLE 99-continued
| Compound | R₁ | Y | Compound | R₁ | Y |
|---|---|---|---|---|---|
| P127-1 | H-2 | H-1 | P128-1 | H-2 | H-1 |
| P127-2 | H-3 | | P128-2 | H-3 | |
| P127-3 | H-4 | | P128-3 | H-4 | |
| P127-4 | H-5 | | P128-4 | H-5 | |
| P127-5 | H-6 | | P128-5 | H-6 | |
| P127-6 | H-7 | | P128-6 | H-7 | |
| P127-7 | H-8 | | P128-7 | H-8 | |
| P127-8 | H-9 | | P128-8 | H-9 | |
| P127-9 | H-10 | | P128-9 | H-10 | |
| P127-10 | H-11 | | P128-10 | H-11 | |
TABLE 100
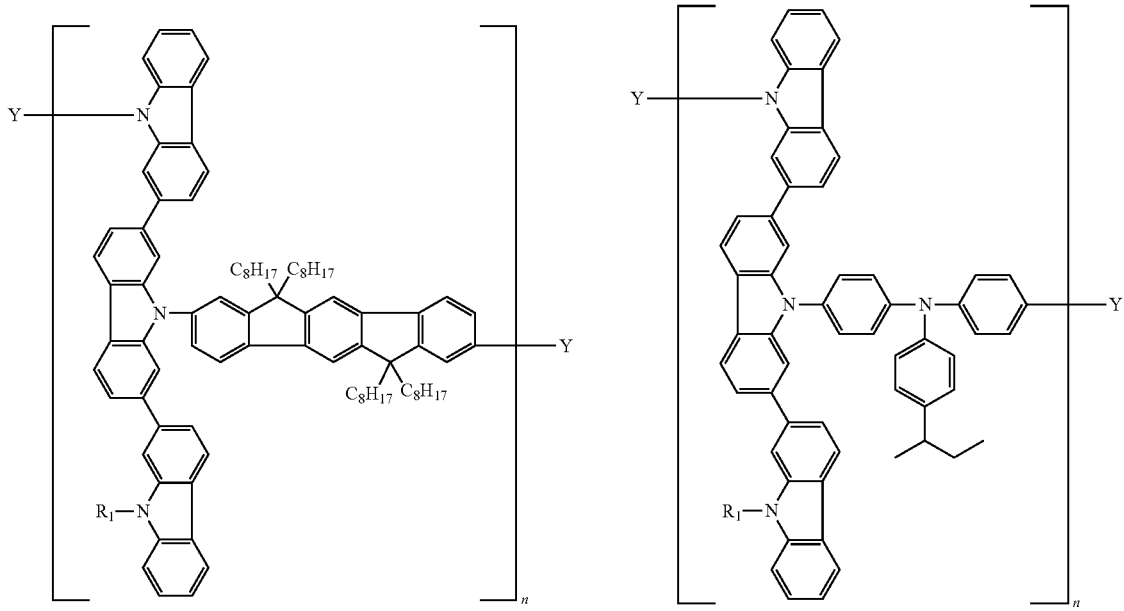
| Compound | R₁ | Y | Compound | R₁ | Y |
|---|---|---|---|---|---|
| P129-1 | H-2 | H-1 | P130-1 | H-2 | H-1 |
| P129-2 | H-3 | | P130-2 | H-3 | |
| P129-3 | H-4 | | P130-3 | H-4 | |
| P129-4 | H-5 | | P130-4 | H-5 | |
| P129-5 | H-6 | | P130-5 | H-6 | |
| P129-6 | H-7 | | P130-6 | H-7 | |
| P129-7 | H-8 | | P130-7 | H-8 | |
| P129-8 | H-9 | | P130-8 | H-9 | |
| P129-9 | H-10 | | P130-9 | H-10 | |
| P129-10 | H-11 | | P130-10 | H-11 | |

TABLE 101
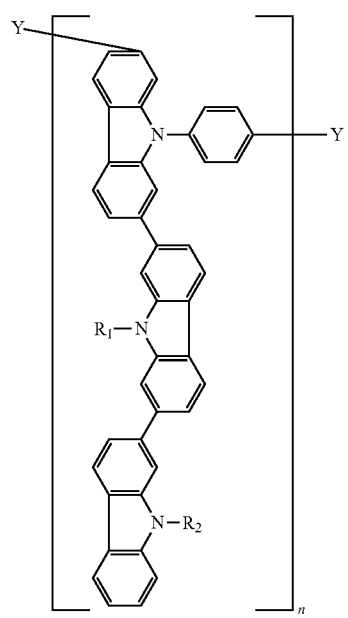
(P131)
| Compound | R₁ = R₂ | Y | Compound | R₁ | R₂ | Y |
|---|---|---|---|---|---|---|
| P131-1 | H-2 | H-1 | P131-11 | H-2 | H-1 | H-1 |
| P131-2 | H-3 | | P131-12 | H-3 | | |
| P131-3 | H-4 | | P131-13 | H-4 | | |
| P131-4 | H-5 | | P131-14 | H-5 | | |
| P131-5 | H-6 | | P131-15 | H-6 | | |
| P131-6 | H-7 | | P131-16 | H-7 | | |
| P131-7 | H-8 | | P131-17 | H-8 | | |
| P131-8 | H-9 | | P131-18 | H-9 | | |
| P131-9 | H-10 | | P131-19 | H-10 | | |
| P131-10 | H-11 | | P131-20 | H-11 | | |
TABLE 102
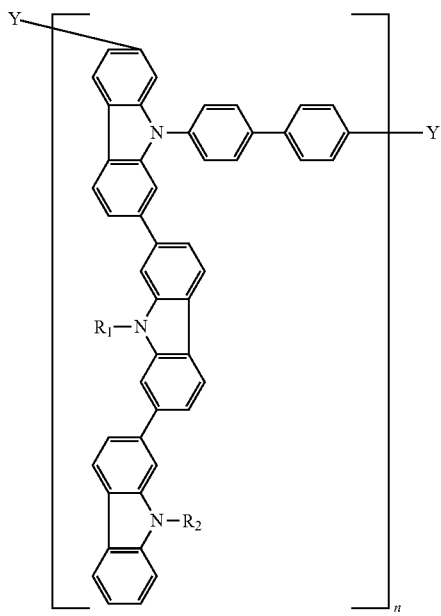
(P132)
| Compound | R₁ = R₂ | Y | Compound | R₁ | R₂ | Y |
|---|---|---|---|---|---|---|
| P132-1 | H-2 | H-1 | P132-11 | H-2 | H-1 | H-1 |
| P132-2 | H-3 | | P132-12 | H-3 | | |
| P132-3 | H-4 | | P132-13 | H-4 | | |
| P132-4 | H-5 | | P132-14 | H-5 | | |
| P132-5 | H-6 | | P132-15 | H-6 | | |
| P132-6 | H-7 | | P132-16 | H-7 | | |
| P132-7 | H-8 | | P132-17 | H-8 | | |
| P132-8 | H-9 | | P132-18 | H-9 | | |
| P132-9 | H-10 | | P132-19 | H-10 | | |
| P132-10 | H-11 | | P132-20 | H-11 | | |
TABLE 103
(P133)
| Compound | R₁ = R₂ | Y | Compound | R₁ | R₂ |
|---|---|---|---|---|---|
| P133-1 | H-2 | H-1 | P133-11 | H-2 | H-1 Y |
| P133-2 | H-3 | | P133-12 | H-3 | H-1 |
| P133-3 | H-4 | | P133-13 | H-4 | |
| P133-4 | H-5 | | P133-14 | H-5 | |
| P133-5 | H-6 | | P133-15 | H-6 | |
| P133-6 | H-7 | | P133-16 | H-7 | |
| P133-7 | H-8 | | P133-17 | H-8 | |
| P133-8 | H-9 | | P133-18 | H-9 | |
| P133-9 | H-10 | | P133-19 | H-10 | |
| P133-10 | H-11 | | P133-20 | H-11 | |

TABLE 104
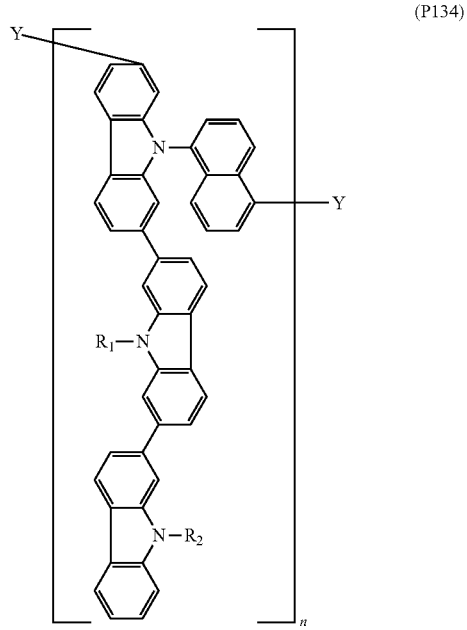
(P134)
| Compound | R₁ = R₂ | Y | Compound | R₁ | R₂ | Y |
|---|---|---|---|---|---|---|
| P134-1 | H-2 | H-1 | P134-11 | H-2 | H-1 | H-1 |
| P134-2 | H-3 | | P134-12 | H-3 | | |
| P134-3 | H-4 | | P134-13 | H-4 | | |
| P134-4 | H-5 | | P134-14 | H-5 | | |
| P134-5 | H-6 | | P134-15 | H-6 | | |
| P134-6 | H-7 | | P134-16 | H-7 | | |
| P134-7 | H-8 | | P134-17 | H-8 | | |
| P134-8 | H-9 | | P134-18 | H-9 | | |
| P134-9 | H-10 | | P134-19 | H-10 | | |
| P134-10 | H-11 | | P134-20 | H-11 | | |
TABLE 105
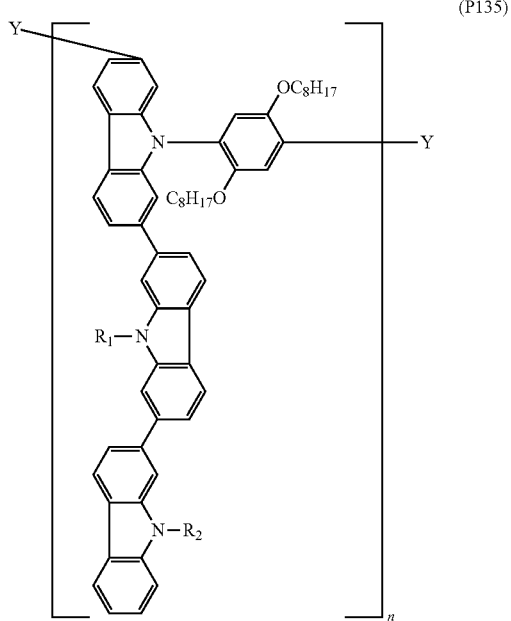
(P135)
TABLE 105-continued
| Compound | R₁ = R₂ | Y | Compound | R₁ | R₂ | Y |
|---|---|---|---|---|---|---|
| P135-1 | H-2 | H-1 | P135-11 | H-2 | H-1 | H-1 |
| P135-2 | H-3 | | P135-12 | H-3 | | |
| P135-3 | H-4 | | P135-13 | H-4 | | |
| P135-4 | H-5 | | P135-14 | H-5 | | |
| P135-5 | H-6 | | P135-15 | H-6 | | |
| P135-6 | H-7 | | P135-16 | H-7 | | |
| P135-7 | H-8 | | P135-17 | H-8 | | |
| P135-8 | H-9 | | P135-18 | H-9 | | |
| P135-9 | H-10 | | P135-19 | H-10 | | |
| P135-10 | H-11 | | P135-20 | H-11 | | |
TABLE 106
(P136)
| Compound | R₁ = R₂ | Y | Compound | R₁ | R₂ | Y |
|---|---|---|---|---|---|---|
| P136-1 | H-2 | H-1 | P136-11 | H-2 | H-1 | H-1 |
| P136-2 | H-3 | | P136-12 | H-3 | | |
| P136-3 | H-4 | | P136-13 | H-4 | | |
| P136-4 | H-5 | | P136-14 | H-5 | | |
| P136-5 | H-6 | | P136-15 | H-6 | | |
| P136-6 | H-7 | | P136-16 | H-7 | | |
| P136-7 | H-8 | | P136-17 | H-8 | | |
| P136-8 | H-9 | | P136-18 | H-9 | | |
| P136-9 | H-10 | | P136-19 | H-10 | | |
| P136-10 | H-11 | | P136-20 | H-11 | | |

TABLE 107
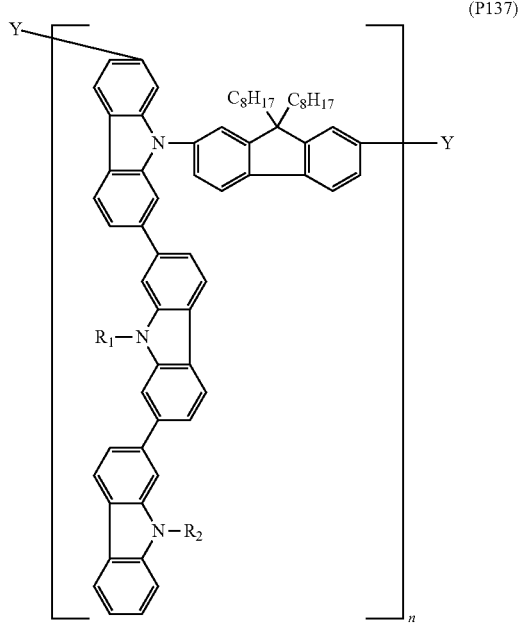
(P137)
| Compound | R₁ = R₂ | Y | Compound | R₁ | R₂ | Y |
|---|---|---|---|---|---|---|
| P137-1 | H-2 | H-1 | P137-11 | H-2 | H-1 | H-1 |
| P137-2 | H-3 | | P137-12 | H-3 | | |
| P137-3 | H-4 | | P137-13 | H-4 | | |
| P137-4 | H-5 | | P137-14 | H-5 | | |
| P137-5 | H-6 | | P137-15 | H-6 | | |
| P137-6 | H-7 | | P137-16 | H-7 | | |
| P137-7 | H-8 | | P137-17 | H-8 | | |
| P137-8 | H-9 | | P137-18 | H-9 | | |
| P137-9 | H-10 | | P137-19 | H-10 | | |
| P137-10 | H-11 | | P137-20 | H-11 | | |
TABLE 108
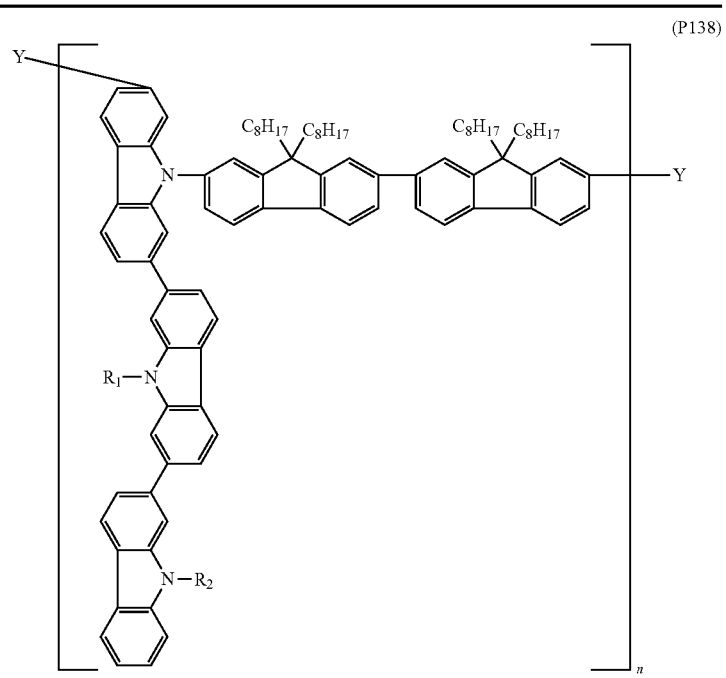
(P138)
| Compound | R₁ = R₂ | Y | Compound | R₁ | R₂ | Y |
|---|---|---|---|---|---|---|
| P138-1 | H-2 | H-1 | P138-11 | H-2 | H-1 | H-1 |
| P138-2 | H-3 | | P138-12 | H-3 | | |
| P138-3 | H-4 | | P138-13 | H-4 | | |
| P138-4 | H-5 | | P138-14 | H-5 | | |
| P138-5 | H-6 | | P138-15 | H-6 | | |
| P138-6 | H-7 | | P138-16 | H-7 | | |
| P138-7 | H-8 | | P138-17 | H-8 | | |
| P138-8 | H-9 | | P138-18 | H-9 | | |
| P138-9 | H-10 | | P138-19 | H-10 | | |
| P138-10 | H-11 | | P138-20 | H-11 | | |

TABLE 109

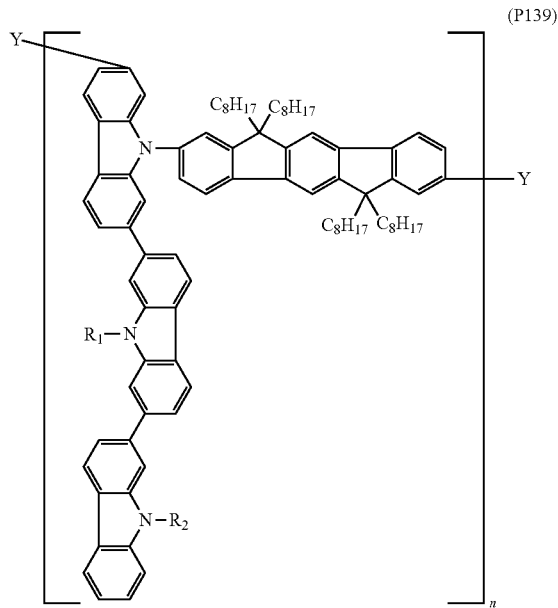

(P139)

| Compound | R₁ = R₂ | Y | Compound | R₁ | R₂ | Y |
|---|---|---|---|---|---|---|
| P139-1 | H-2 | H-1 | P139-11 | H-2 | H-1 | H-1 |
| P139-2 | H-3 | | P139-12 | H-3 | | |
| P139-3 | H-4 | | P139-13 | H-4 | | |
| P139-4 | H-5 | | P139-14 | H-5 | | |
| P139-5 | H-6 | | P139-15 | H-6 | | |
| P139-6 | H-7 | | P139-16 | H-7 | | |
| P139-7 | H-8 | | P139-17 | H-8 | | |
| P139-8 | H-9 | | P139-18 | H-9 | | |
| P139-9 | H-10 | | P139-19 | H-10 | | |
| P139-10 | H-11 | | P139-20 | H-11 | | |

TABLE 110

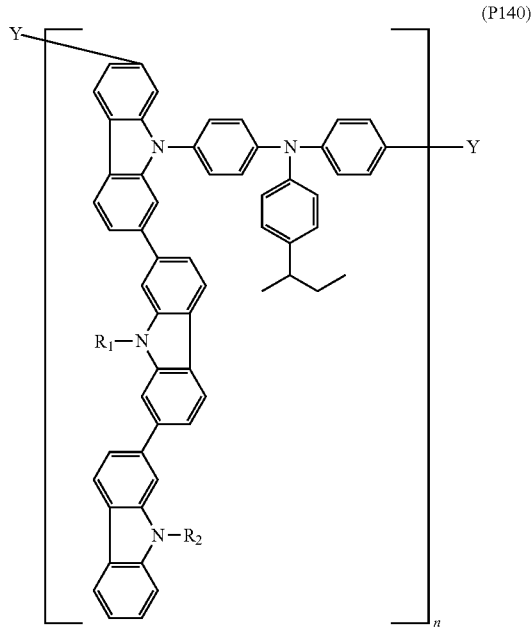

(P140)

| Compound | R₁ = R₂ | Y | Compound | R₁ | R₂ | Y |
|---|---|---|---|---|---|---|
| P140-1 | H-2 | H-1 | P140-11 | H-2 | H-1 | H-1 |
| P140-2 | H-3 | | P140-12 | H-3 | | |
| P140-3 | H-4 | | P140-13 | H-4 | | |
| P140-4 | H-5 | | P140-14 | H-5 | | |
| P140-5 | H-6 | | P140-15 | H-6 | | |
| P140-6 | H-7 | | P140-16 | H-7 | | |
| P140-7 | H-8 | | P140-17 | H-8 | | |
| P140-8 | H-9 | | P140-18 | H-9 | | |
| P140-9 | H-10 | | P140-19 | H-10 | | |
| P140-10 | H-11 | | P140-20 | H-11 | | |

The polymer of the invention can be formed into a thin film by a coating method. As a coating method, wet film forming methods can be suitably used. Specifically, a thin film can be formed by a relief printing method, an intaglio printing method, a planographic printing method, a stencil printing method, and the combination of these and an offset printing method, and an inkjet printing method, a dispenser spin coating method, a bar coating method, a dip coating method, a spray coating method, a slit coating method, a roll coating method, a cap coating method, a gravure roll coating method and a meniscus coating method.

In particular, when a fine patterning is desired, a relief printing method, an intaglio printing method, a planographic printing method, a stencil printing method, and the combination of these and an offset printing method, and an inkjet printing method, a dispenser spin coating method and the like are preferable.

In addition, a method in which after the polymer is formed into a thin film on a precursor substrate before transcription by the above-mentioned dry or wet film forming methods, patterns are printed on an intended wiring substrate with electrodes by using laser beam or hot press, can be used.

The film formation by these methods can be conducted under conditions known to one skilled in the art, and the details thereof are omitted.

A coating liquid used in a coating method contains the polymer of the invention and a solvent. The polymer contained in the coating liquid may be either dissolved or dispersed in the solvent.

The solvent is preferably an organic solvent. Examples of the organic solvent include chlorine-based solvents such as chloroform, chlorobenzene, chlorotoluene, chloroxylene, chloroanisole, dichloromethane, dichlorobenzene, dichlorotoluene, dichloroethane, trichloroethane, trichlorobenzene, trichloromethylbenzene, bromobenzene, dibromobenzene and bromoanisole, ether-based solvents such as tetrahydrofuran, dioxane, dioxolan, oxazole, methylbenzoxazole, benzisoxazole, furan, furazan, benzofuran and dihydrobenzofuran, aromatic hydrocarbon-based solvents such as ethylbenzene, diethylbenzene, triethylbenzene, trimethylbenzene, trimethoxybenzene, propylbenzene, isopropylbenzene, diisopropylbenzene, dibutylbenzene, amylbenzene, dihexylbenzene, cyclohexylbenzene, tetramethylbenzene, dodecylbenzene, benzonitrile, acetophenone, methyl acetophenone, methoxy acetophenone, toluic acid ethyl ester, toluene, ethyltoluene, methoxytoluene, dimethoxytoluene, trimethoxytoluene, isopropyltoluene, xylene, butylxylene, isopropylxylene, anisole, ethylanisole, dimethylanisole, trimethylanisole, propylanisole, isopropylanisole, butylanisole, methylethylanisole, anethole anisyl alcohol, methyl benzoate, ethyl benzoate, propyl benzoate, butyl benzoate, diphenyl ether, butylphenyl ether, benzylmethyl ether, benzylethyl ether, methylenedioxybenzene, methylnaphthalene, tetrahydronaphthalene, aniline, methylaniline, ethylaniline, butylaniline, biphenyl, methylbiphenyl and isopropylbiphenyl, aliphatic hydrocarbon-based solvents such as cyclohexane, methylcyclohexane, n-pentane, n-hexane, n-heptane, n-octane, n-nonane, n-decane, tetradecane, decalin and isopropylcyclohexane, ketone-based solvents such as acetone, methylethylketone, cyclohexanone and acetophenone, ester-based solvents such as ethyl acetate, butyl acetate, ethyl cellosolve acetate, methyl benzoate and phenyl acetate, polyvalent alcohols such as ethylene glycol, ethylene glycol monobutyl ether, ethylene glycol monoethyl ether, ethylene glycol monomethyl ether, dimethoxyethane, propylene glycol, diethoxyethane, triethylene glycol monoethyl ether, glycerin and 1,2-hexanediol and derivatives thereof, alcohol-based solvents such as methanol, ethanol, propanol, isopropanol and cyclohexanol, sulfoxide-based solvents such as dimethyl sulfoxide, and amide-based solvents such as N-methyl-2-pyrrolidone and N,N-dimethylformamide. Further, these organic solvents may be used singly or in combination of two or more.

Of these, in respect of solubility, uniform film formation, viscosity or the like, it is preferred that the solvent contain at least one of toluene, xylene, ethylbenzene, amylbenzene, anisole, 4-methoxytoluene, 2-methoxytoluene, 1,2-dimethoxybenzene, mesitylene, tetrahydronaphthalene, cyclohexylbenzene, 2,3-dihydrobenzofuran, cyclohexanone and methylcyclohexanone.

Further, to the above-mentioned coating liquid, if needed, a viscosity modifier, and a regulator of surface tension can be added. As the viscosity modifier and regulator of surface tension, it is preferred that one which exerts no adverse effect on the device characteristics even if it remains in a film or one which can be removed from a film during film formation be selected.

In the invention, a dispersion or a solution obtained by dispersing or dissolving at least one polymer contained in a solvent can be preferably used.

Meanwhile, during formation of a thin film, an antioxidant such as a phosphate antioxidant, which has no adverse effect on the performance of an organic EL device may be mixed. In addition, other compounds (acceptor materials described later, for example) and the like may be mixed depending on the intended use.

The polymer of the invention can be formed into a thin film by a coating method. The resulting film normally exhibits hole-transporting properties. Therefore, it is useful as a material for organic electronics. In particular, it is suitable for a material for an organic electroluminescence device, particularly a material used in a hole-transporting region between an anode and an emitting layer (a hole-transporting layer, a hole-injecting layer or the like).

The organic EL device of the invention comprises one or more organic thin film layers comprising at least an emitting layer between a cathode and an anode. At least one of the organic thin film layers comprises the polymer of the invention.

It is preferred that the organic EL device of the invention have an organic thin film layer between an anode and an emitting layer, the layer be an organic thin film layer containing the polymer of the invention, and the organic thin film layer be a hole-transporting region. As a layer formed in a hole-transporting region, a hole-transporting layer, a hole-injecting layer or the like can be given. In addition, the hole-transporting layer or hole-injecting layer is preferably in contact with the emitting layer.

In the invention, it is preferred that the above-mentioned polymer be contained in at least one of the hole-injecting layer and the hole-transporting layer as a main component.

Specifically, the hole-transporting layer or the hole-injecting layer preferably contains the polymer of the invention in an amount of 51 to 100 wt %.

Further, it is preferred that at least one of the hole-transporting layer and the hole-injecting layer contain an acceptor material. In particular, it is preferred that the layer that be in contact with an anode contain an acceptor material. By allowing an acceptor material to be contained, the hole density in a hole-injecting/transporting layer is increased or the hole mobility is improved. Hence, the resulting organic EL device can be driven at a lower voltage, and the carrier balance can be improved, thereby leading to a prolonged life.

The acceptor material is preferably an organic compound including an electron-attracting substituent or an electron-deficient ring.

As the electron-attracting substituent, halogen, CN—, a carbonyl group, an aryl boron group or the like can be given.

The electron-deficient ring includes, but not limited to, a compound or the like selected from the group consisting of 2-pyridyl, 3-pyridyl, 4-pyridyl, 2-quinolyl, 3-quinolyl, 4-quinolyl, 2-imidazole, 4-imidazole, 3-pyrazole, 4-pyrazole, pyridazine, pyrimidine, pyrazine, cinnoline, phthalazine, quinazoline, quinoxaline, 3-(1,2,4-N)-triazolyl, 5-(1,2, 4-N)-triazolyl, 5-tetrazolyl, 4-(1-O,3-N)-oxazole, 5-(1-O,3-N)-oxazole, 4-(1-S,3-N)-thiazole, 5-(1-S,3-N)-thiazole, 2-benzoxazole, 2-benzothiazole, 4-(1,2,3-N)-benzotriazole and benzimidazole.

As a representative device configuration of an organic EL device of the invention, the following configurations (1) to (13) can be given.
(1) Anode/emitting layer/cathode
(2) Anode/hole-injecting layer/emitting layer/cathode
(3) Anode/emitting layer/electron-injecting layer/cathode
(4) Anode/hole-injecting layer/emitting layer/electron-injecting layer/cathode
(5) Anode/organic semiconductor layer/emitting layer/cathode
(6) Anode/organic semiconductor layer/electron blocking layer/emitting layer/cathode
(7) Anode/organic semiconductor layer/emitting layer/adhesion improving layer/cathode
(8) Anode/hole-injecting layer/hole-transporting layer/emitting layer/electron injecting layer/cathode
(9) Anode/insulating layer/emitting layer/insulating layer/cathode
(10) Anode/inorganic semiconductor layer/insulating layer/emitting layer/insulating layer/cathode
(11) Anode/organic semiconductor layer/insulating layer/emitting layer/insulating layer/cathode
(12) Anode/insulating layer/hole-injecting layer/hole-transporting layer/emitting layer/insulating layer/cathode
(13) Anode/insulating layer/hole-injecting layer/hole-transporting layer/emitting layer/electron injecting layer/cathode Of these, normally, the configuration (8) is preferably used. However, the device configuration is not limited to these.

In an organic EL device of the invention, for other constituent elements than an organic thin film layer comprising the polymer of the invention, known materials can be used. For example, an emitting layer preferably comprises a styrylamine compound, an arylamine compound or a fluoranthene-based compound.

The layers which are not the organic thin film layer comprising the polymer of the invention can be formed by known methods including dry film forming methods such as vacuum vapor deposition, sputtering or plasma ion-plating, and wet film forming methods such as coating (spin coating, dipping, flow coating, or the like) or printing.

Although the film thickness of each layer is not particularly restricted, it is required to be a proper value. If the film thickness is too large, a large applied voltage is required for a predetermined light output, thereby causing efficiency to be lowered. If the film thickness is too small, pinholes and the like are generated, whereby sufficient luminance can hardly be obtained when an electric field is impressed. The film thickness is normally in a range from 5 nm to 10 μm, further preferably in a range from 10 nm to 0.2 μm.

By the above-mentioned various materials and methods for forming a layer, an anode, an emitting layer, if needed, a hole-injecting/transporting layer and, if needed, an electron-injecting/transporting layer are formed and further a cathode is formed, whereby an organic EL device can be fabricated. From a cathode to an anode, an organic EL device can be fabricated in the reverse order of the above-mentioned order.

EXAMPLES

Example 1

P-1 was synthesized by the following synthesis scheme.

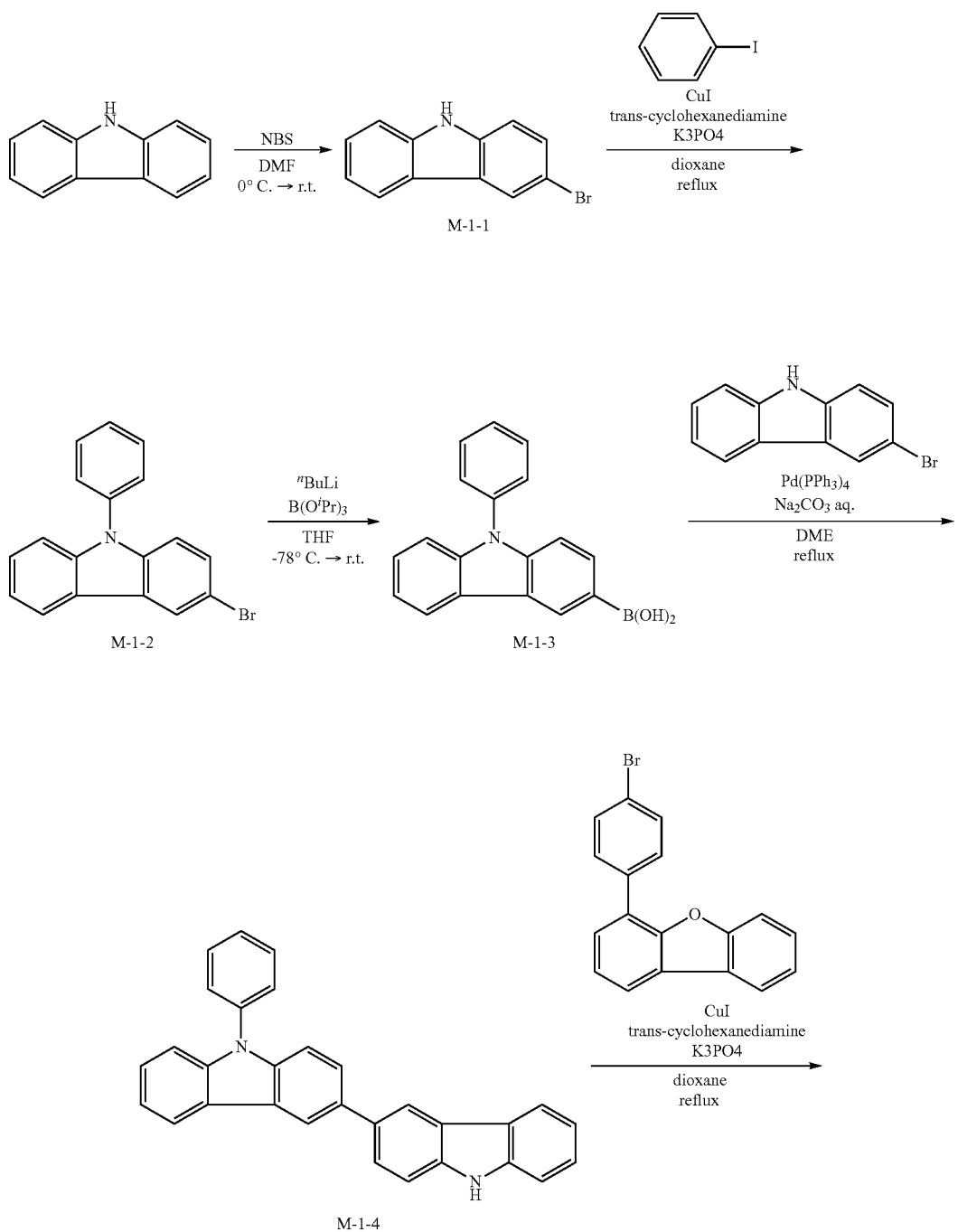

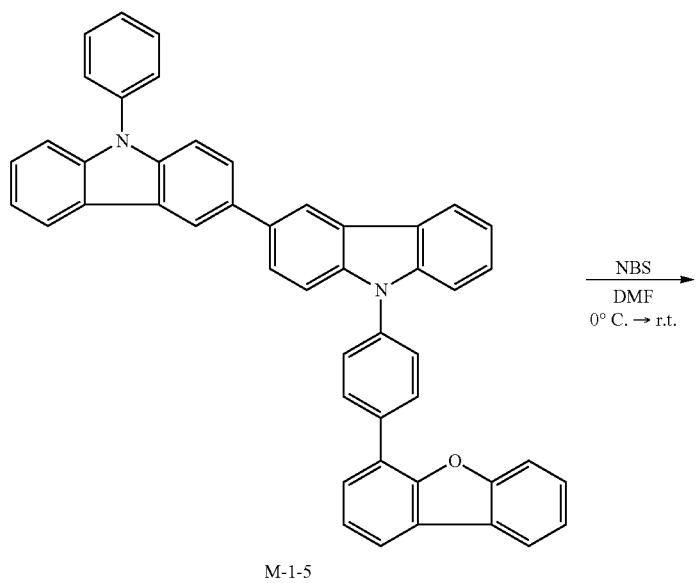
M-1-5
NBS
DMF
0° C. → r.t.
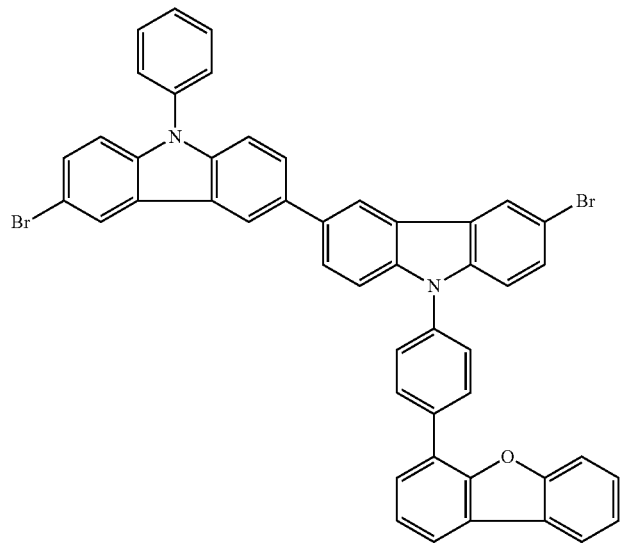
M-1
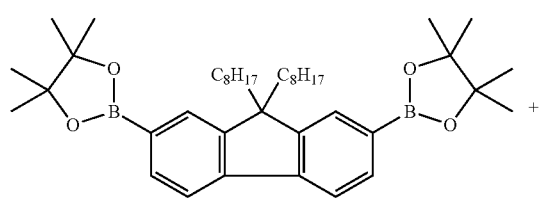

-continued

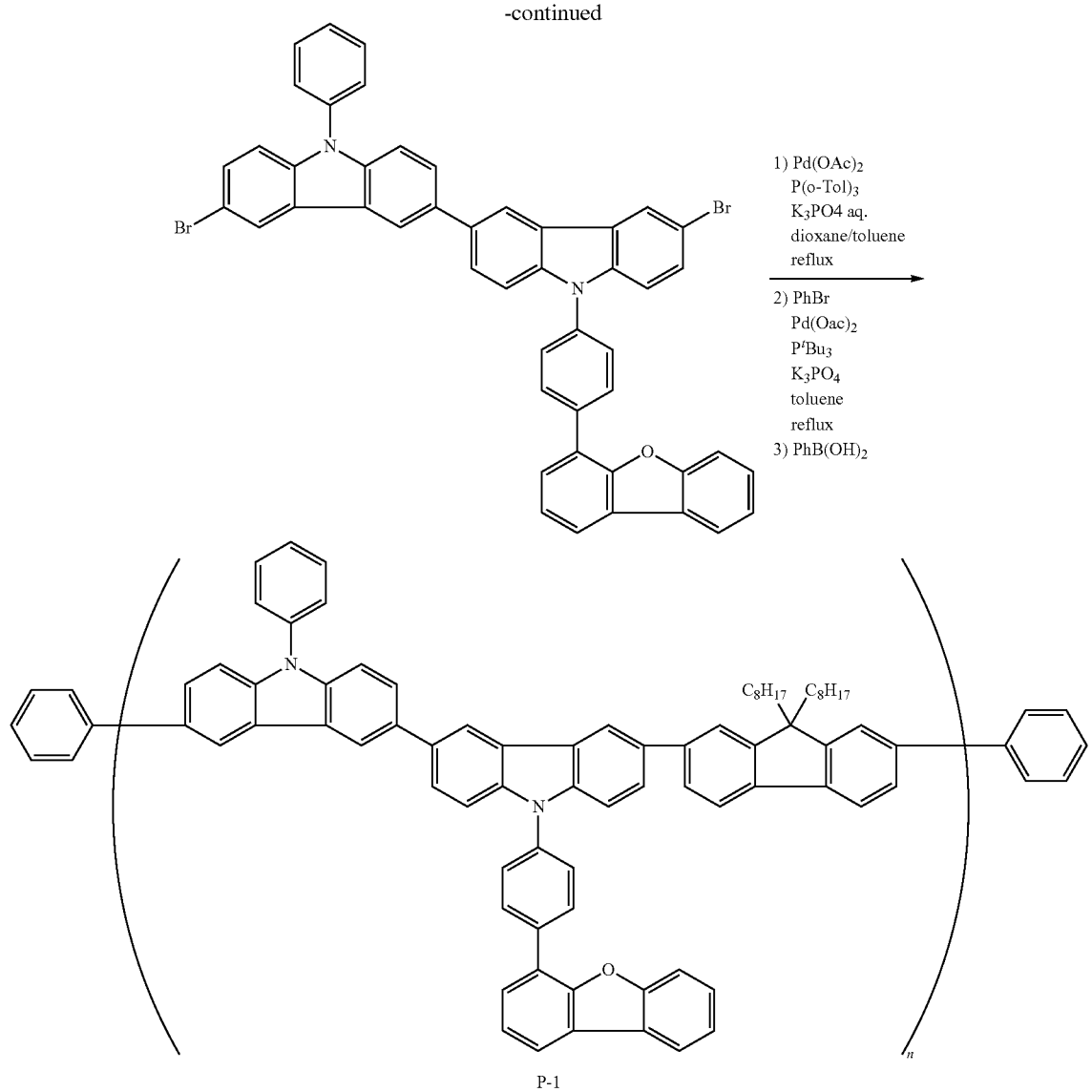

P-1

(1) Synthesis of Intermediate M-1-1

Under a nitrogen atmosphere, 10.0 g (59.8 mmol) of carbazole and 100 mL of dimethylformamide (DMF) were placed in a 500 mL three-necked flask equipped with a cooling tube. The mixture was cooled to 0° C. in an ice water bath. After cooling, a solution obtained by dissolving 10.6 g (59.8 mmol) of N-bromosuccinimide (NBS) in 100 mL of DMF was added dropwise slowly. After completion of the addition, the flask was taken from the ice water bath, returned to room temperature and stirred for 8 hours.

A reaction liquid was dropped in water to precipitate solids. By filtration, a precipitate was obtained. The resulting crude product was purified by means of silica-gel chromatography (toluene). The resulting solids were dried under reduced pressure to obtain 12.2 g of white solids (yield: 83%).

By $^1$H-NMR spectrum and Field Desorption Mass Spectrometry (hereinafter referred to as FD-MS) analysis, the white powder obtained was confirmed to be intermediate M-1-1.

(2) Synthesis of Intermediate M-1-2

Under a nitrogen atmosphere, 6.0 g (24.3 mmol) of M-1-1, 5.4 g (26.7 mmol) of iodobenzene, 1.4 g (7.29 mmol) of CuI, 0.8 g (7.29 mmol) of trans-cyclohexanediamine, 10.3 g (48.6 mmol) of potassium phosphate and 120 mL of dioxane were placed in a 300 mL three-necked flask equipped with a cooling tube. The mixture was heated under reflux for 8 hours.

After completion of the reaction, the solvent was removed under reduced pressure. Then, 100 mL of dichloromethane and 100 mL of water were added to extract an intended substance to take out an organic phase. MgSO$_4$ was added to the organic phase thus taken out for drying. MgSO$_4$ was removed by filtration. The solvent was removed under reduced pressure, and the crude product obtained was purified by means of silica-gel chromatography (toluene: hexane=1:10). The resulting solids were dried under reduced pressure to obtain 6.7 g of white solids (yield: 85%). By $^1$H-NMR spectrum and FD-MS analysis, the white powder obtained was confirmed to be intermediate M-1-2.

(3) Synthesis of Intermediate M-1-3

Under a nitrogen atmosphere, 4.0 g (12.5 mmol) of M-1-2, 2.8 g (15.0 mmol) of triisopropyl borate and 60 mL of dehydrated tetrahydrofuran (THF) were placed in a 300 mL three-necked flask equipped with a cooling tube. The mixture was stirred and cooled to −78° C. in a methanol/dry ice bath. After cooling, 38 mL (60.9 mmol) of n-butyllithium (1.61M) was added dropwise slowly. After the dropwise addition, the mixture was cooled and stirred for an hour. Then, the mixture was returned to room temperature and stirred for 7 hours. After completion of the reaction, 10 mL of methanol was added dropwise, and further 30 mL of a 1N aqueous solution of HCl was added dropwise. By adding methylene chloride and water, an intended substance was extracted to take out an organic phase. $MgSO_4$ was added to the organic phase thus taken out for drying. $MgSO_4$ was removed by filtration. The solvent was removed under reduced pressure and isolated by means of column chromatography to obtain 2.1 g of white solids (yield: 60%). By $^1$H-NMR spectrum and FD-MS analysis, the white powder obtained was confirmed to be intermediate M-1-3.

(4) Synthesis of Intermediate M-1-4

Under a nitrogen atmosphere, 4 g (10.0 mmol) of M-1-1, 3.7 g (10.0 mmol) of M-1-3, 0.2 g (0.2 mol) of Pd(PPh$_3$)$_4$, 2.1 g (20.0 mmol) of sodium carbonate, 40 mL of DME and 20 mL of water were placed in a 300 mL three-necked flask equipped with a cooling tube. The mixture was heated under reflux for 8 hours. After completion of the reaction, the solvent was removed under reduced pressure. Then, 100 mL of dichloromethane and 100 mL of water were added to extract an intended substance to take out an organic phase. $MgSO_4$ was added to the organic phase thus taken out for drying. $MgSO_4$ was removed by filtration. The solvent was removed under reduced pressure, and the crude product obtained was purified by means of silica-gel chromatography. The resulting solids were dried under reduced pressure to obtain 3.0 g of white solids (yield: 74%). By $^1$H-NMR spectrum and FD-MS analysis, the white powder obtained was confirmed to be intermediate M-1-4.

(5) Synthesis of Intermediate M-1-5

Under a nitrogen atmosphere, 2.5 g (6.1 mmol) of M-1-4, 2.0 g (6.1 mmol) of 4-(4-bromophenyl)-dibenzofuran, 0.4 g (1.8 mmol) of CuI, 0.2 g (1.8 mmol) of trans-cyclohexanediamine, 2.6 g (12.2 mmol) of potassium phosphate and 30 mL of dioxane were mixed, and heated under reflux for 8 hours.

After completion of the reaction, the solvent was removed under reduced pressure. Then, 100 mL of dichloromethane and 100 mL of water were added to extract an intended substance to take out an organic phase. $MgSO_4$ was added to the organic phase thus taken out for drying. $MgSO_4$ was removed by filtration. The solvent was removed under reduced pressure, and the crude product obtained was purified by means of silica-gel chromatography. The resulting solids were dried under reduced pressure to obtain 2.8 g of white solids (yield: 70%). By $^1$H-NMR spectrum and FD-MS analysis, the white powder obtained was confirmed to be intermediate M-1-5.

(6) Synthesis of Monomer M-1

Under a nitrogen atmosphere, 2.5 g (3.8 mmol) of M-1-5 and 40 mL of DMF were mixed and cooled to 0° C. in an ice water bath.

After cooling, a solution obtained by dissolving 1.4 g (8.0 mmol) of N-bromosuccinimide in 40 mL of DMF was added dropwise slowly. After completion of the addition, the flask was taken from the ice water bath, returned to room temperature and stirred for 8 hours. The reaction liquid was dropped in water to precipitate solids. The resulting solids were collected by suction filtration.

The resulting crude product was purified by means of silica-gel chromatography. The resulting solids were dried under reduced pressure to obtain 2.5 g of white solids (yield: 80%).

By $^1$H-NMR spectrum and FD-MS analysis, the white powder obtained was confirmed to be intermediate M-1.

(7) Synthesis of Polymer P-1

Under a nitrogen atmosphere, 4.1 g (6.2 mmol) of 2,7-bis(4,4,5,5-tetramethyl-1,3,2-dioxaborolane-2-yl)-9,9-di-n-octylfluorene, 5.0 g (6.2 mmol) of M-1, 0.01 g (0.04 mmol) of Pd(OAc)$_2$, 0.06 g (0.2 mmol) of P(o-Tol)$_3$, 6.6 g (30.9 mmol) of potassium phosphate, 50 mL of dioxane, 12 mL of toluene and 11 mL of water were mixed and heated under reflux for 16 hours.

After completion of the reaction, the solvent was removed under reduced pressure. By addition of 150 mL of toluene and 100 mL of water, an intended substance was extracted to take out an organic phase. $MgSO_4$ was added to the organic phase thus taken out for drying. $MgSO_4$ was removed by filtration. The solvent was concentrated under reduced pressure to obtain a concentrated liquid. Filtration was conducted by passing the concentrated liquid through silica gel. The collected solution was concentrated under reduced pressure. The concentrated liquid was added dropwise to methanol to precipitate solids. The solids were filtrated and dried under reduced pressure.

Under a nitrogen atmosphere, the resulting crude product, 0.3 g (1.9 mmol) of bromobenzene, 0.03 g (0.04 mmol) of Pd(OAc)$_2$, 0.01 g (0.05 mmol) of P(t-Bu)$_3$, 2.0 g (9.5 mmol) of potassium phosphate and 50 mL of toluene were mixed, and heated under reflux for 8 hours. Next, 0.2 g (1.9 mmol) of phenylboronic acid was added, followed by heating further for 8 hours.

After completion of the reaction, an intended substance was extracted by adding 100 mL of water to take out an organic phase. $MgSO_4$ was added to the organic phase thus taken out for drying. $MgSO_4$ was removed by filtration. The collected filtrate was filtered through silica gel. The collected solution was concentrated, followed by addition of an aqueous solution of diethyldithiacarbamate. The mixture was stirred at 80° C. for 8 hours. After cooling, an organic phase was washed with water. The resulting solution was dropped in methanol to obtain a precipitate by filtration.

The precipitate was dissolved in toluene and purified through a silica-gel column. The solution obtained was dropped in methanol and stirred. Then, the precipitate obtained was filtered and dried to obtain 3.4 g of polymer P-1. P-1 had a number average molecular weight of $1.0 \times 10^4$ in terms of polystyrene and a weight average molecular weight of $2.3 \times 10^4$ in terms of polystyrene.

As the method for measuring the molecular weight, size exclusion chromatography (SEC) was used. Specifically, the measurement was conducted as follows. 10 mg of a sample was dissolved in 10 ml of THF. 100 μl of the solution thus obtained was injected into a column, and the measurement was conducted. The flow rate was set to 1 ml per minute. The column temperature was set to 40° C. As a size exclusion chromatography (SEC) apparatus, HLC-8220 manufactured by TOSO CORPORATION was used. As a detector, a refractive index (RI) detector or an ultraviolet-visible (UV) detector was used. As for columns, 2 of TSKgel GMH-XL and 1 of TSKgel G2000-XL manufactured by TOSO CORPORATION were used. As the polystyrene as a standard sample, TSK standard polystyrene manufactured by TOSO CORPORATION was used.

Example 2
P-2 was synthesized by the following synthesis scheme.
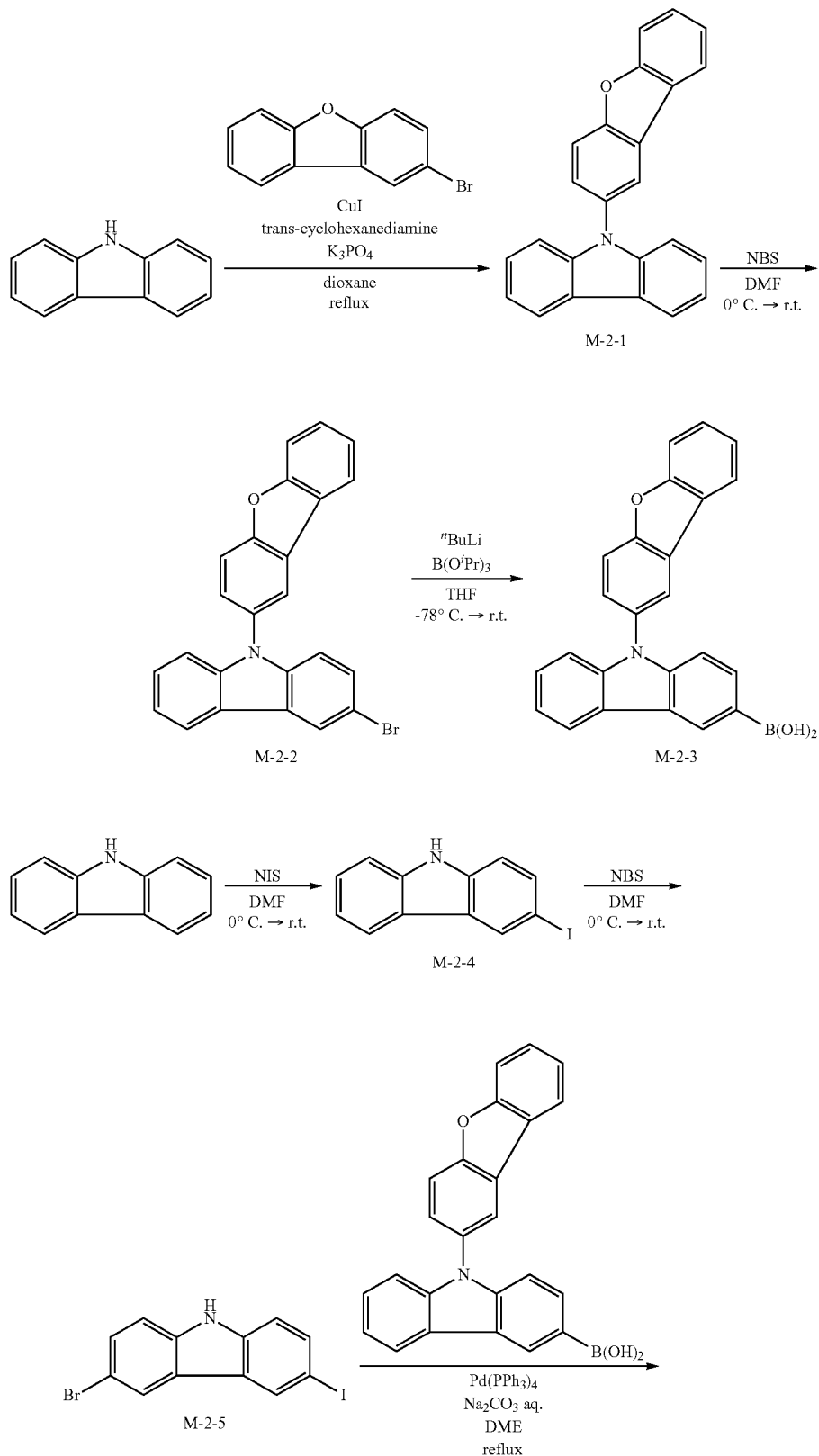

-continued
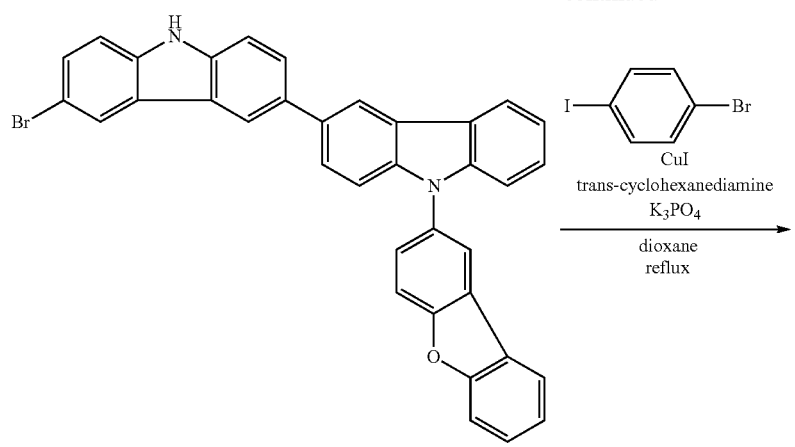
M-2-6
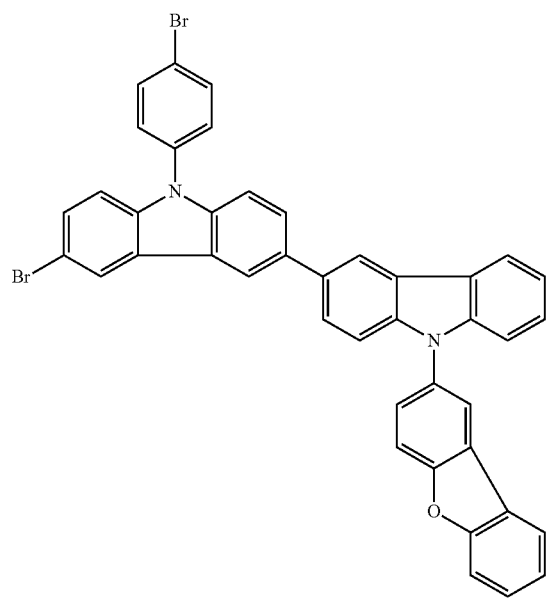
M-2
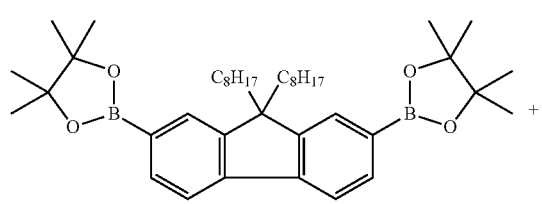

-continued

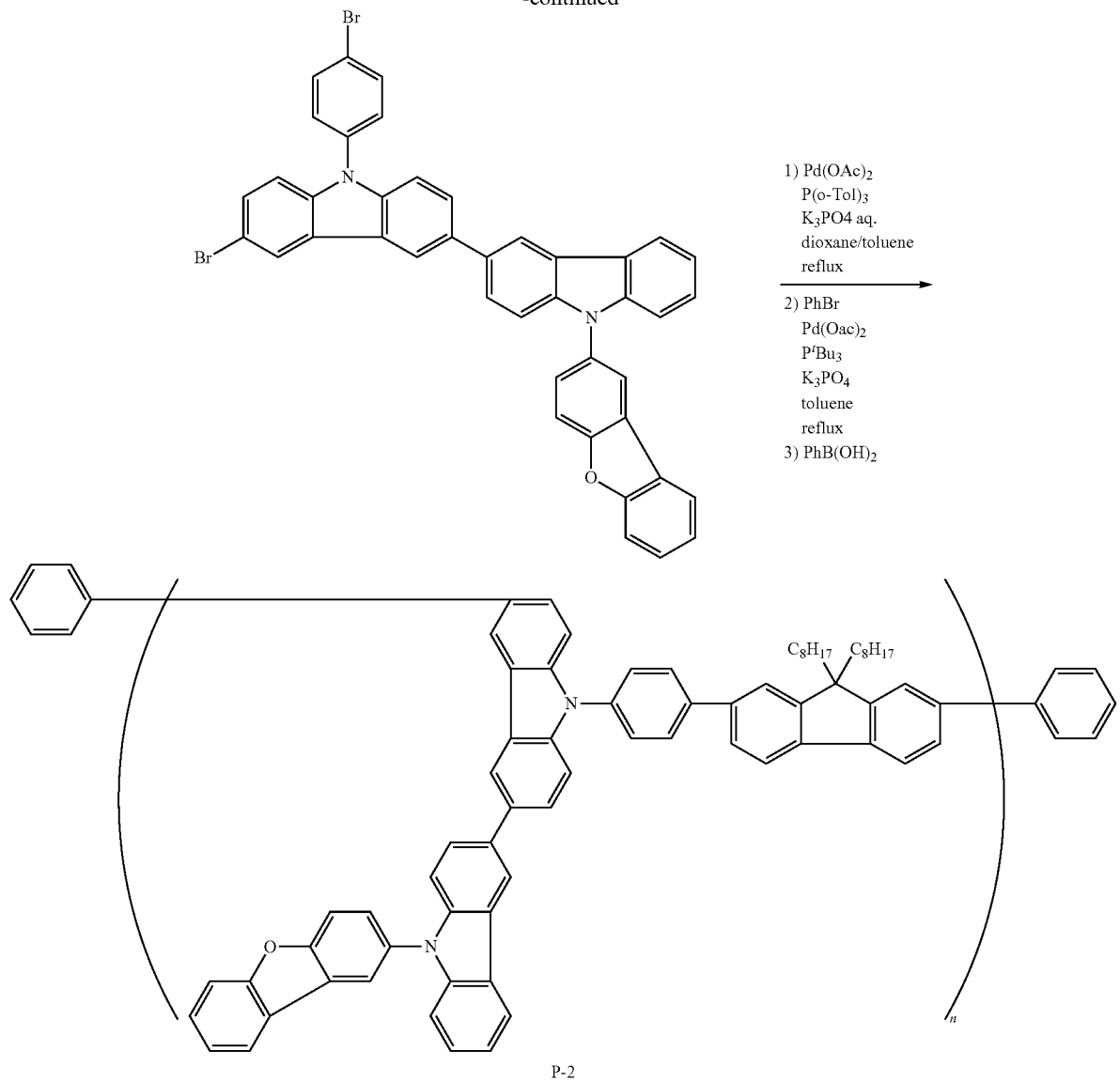

P-2

(1) Synthesis of Intermediate M-2-1

M-2-1 was synthesized in the same manner as in the synthesis of M-1-2, except that carbazole was used as the raw material and 2-bromodibenzofuran was used instead of iodobenzene. 4.0 g of an intended substance was obtained (yield: 68%). By $^1$H-NMR spectrum and FD-MS analysis, the substance obtained was confirmed to be M-2-1.

(2) Synthesis of intermediate M-2-2

M-2-2 was synthesized in the same manner as in the synthesis of intermediate M-1-1 by using M-2-1 as the raw material. 3.2 g of an intended substance was obtained (yield: 59%). By $^1$H-NMR spectrum and FD-MS analysis, the substance obtained was confirmed to be M-2-2.

(3) Synthesis of intermediate M-2-3

M-2-3 was synthesized in the same manner as in the synthesis of M-1-3 by using M-2-2 as the raw material. 5.4 g of an intended substance was obtained (yield: 66%). By $^1$H-NMR spectrum and FD-MS analysis, the substance obtained was confirmed to be M-2-3.

(4) Synthesis of Intermediate M-2-4

M-2-4 was synthesized in the same manner as in the synthesis of intermediate M-1-1, except that N-iodosuccinimide (NIS) was used instead of NBS. 5.6 g of an intended substance was obtained (yield: 79%). By $^1$H-NMR spectrum and FD-MS analysis, the substance obtained was confirmed to be M-2-4.

(5) Synthesis of Intermediate M-2-5

The intermediate M-2-5 was synthesized in the same manner as in the synthesis of intermediate M-1-1, except that M-2-4 was used as the raw material. 3.7 g of an intended substance was obtained (yield: 82%). By $^1$H-NMR spectrum and FD-MS analysis, the substance obtained was confirmed to be M-2-5.

(6) Synthesis of intermediate M-2-6

M-2-6 was synthesized in the same manner as in the synthesis of intermediate M-1-4, except that M-2-5 was used as the raw material and M-2-3 was used instead of 3-bromo-9H-carbazole. 5.2 g of an intended substance was obtained (yield: 76%). By $^1$H-NMR spectrum and FD-MS analysis, the substance obtained was confirmed to be M-2-6.

(7) Synthesis of Monomer M-2

M-2 was synthesized in the same manner as in the synthesis of intermediate M-1-2, except that M-2-6 was used as the raw material and 1-bromo-4-iodobenzene was used instead of iodobenzene. 4.9 g of an intended substance was obtained (yield: 66%). By $^1$H-NMR spectrum and FD-MS analysis, the substance obtained was confirmed to be M-2.

(8) Synthesis of Polymer P-2

P-2 was synthesized in the same manner as in the synthesis of P-1, except that M-2 was used instead of M-1. 2.2 g of an intended substance was obtained. Polymer P-2 had a number average molecular weight of $1.2 \times 10^4$ in terms of polystyrene and a weight average molecular weight of $3.3 \times 10^4$ in terms of polystyrene.

Example 3

P-3 was synthesized by the following synthesis scheme.

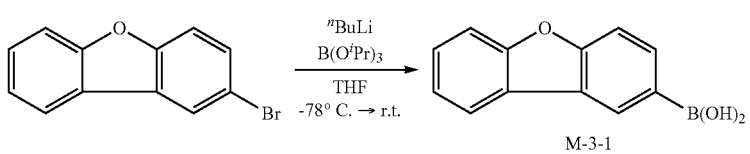

M-3-1

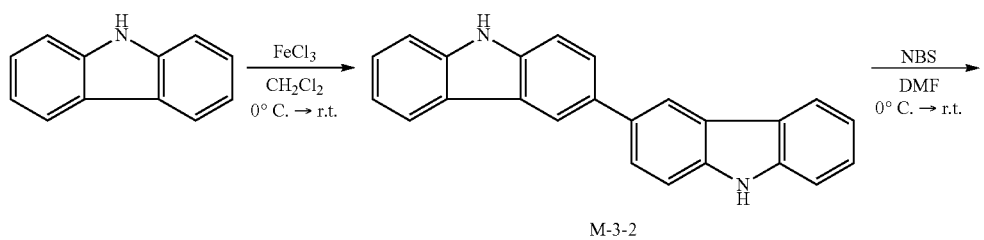

M-3-2

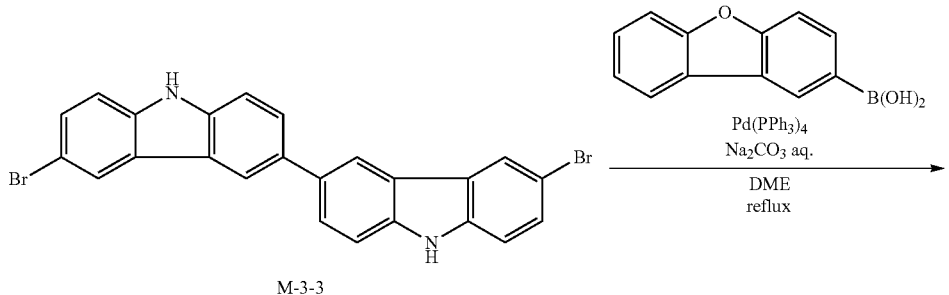

M-3-3

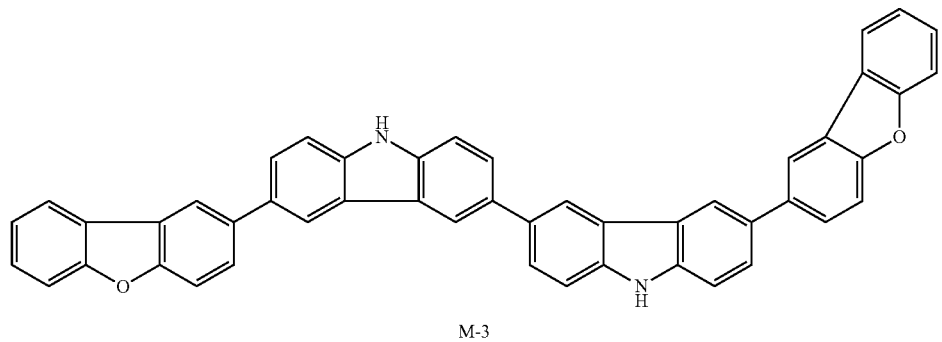

M-3

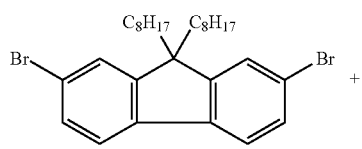

+

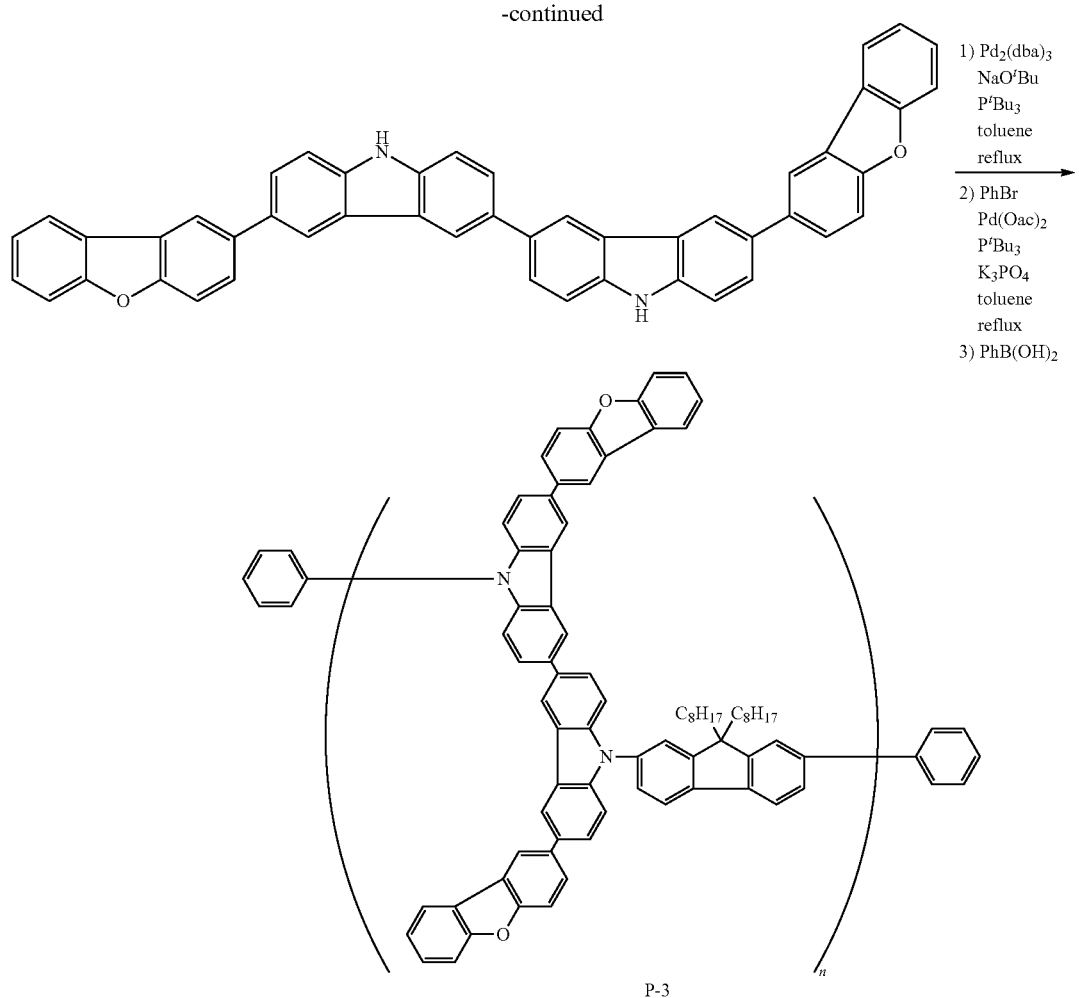

(1) Synthesis of Intermediate M-3-1

M-3-1 was synthesized in the same manner as in the synthesis of intermediate M-1-3, except that 2-bromodibenzofuran was used as the raw material. 6.1 g of an intended substance was obtained (yield: 63%). By $^1$H-NMR spectrum and FD-MS analysis, the substance obtained was confirmed to be M-3-1

(2) Synthesis of Intermediate M-3-2

Under a nitrogen atmosphere, a solution obtained by dissolving 10 g (59.8 mmol) of 9-H-carbazole in 75 ml of chloroform was cooled to 0° C. in an ice water bath. Next, a solution obtained by dispersing 38.8 g (239.2 mmol) of FeCl$_3$ in about 60 ml of chloroform was added dropwise slowly. After the addition, the resulting mixture was returned to room temperature, and stirred for 24 hours. The reaction liquid was added to a large quantity of methanol dropwise to precipitate solids. The solids were collected by filtration. Then, the collected solids were washed with a large quantity of methanol and water repeatedly to obtain 7.8 g of solids by filtration (yield: 82%). By $^1$H-NMR spectrum and FD-MS analysis, the white powder obtained was confirmed to be M-3-2.

(3) Synthesis of Intermediate M-3-3

M-3-3 was synthesized in the same manner as in the synthesis of intermediate M-1-1, except that M-3-2 was used as the raw material. 4.1 g of an intended substance was obtained (yield: 56%). By $^1$H-NMR spectrum and FD-MS analysis, it was confirmed to be M-3-3.

(4) Synthesis of Monomer M-3

M-3 was synthesized in the same manner as in the synthesis of intermediate M-1-4, except that M-3-3 was used as the raw material and M-3-1 was used instead of 3-bromo-9H-carbazole. 3.4 g of an intended substance was obtained (yield: 48%). By $^1$H-NMR spectrum and FD-MS analysis, it was confirmed to be M-3.

(7) Synthesis of Polymer P-3

Under a nitrogen atmosphere, 5.8 g (10.0 mmol) of 9,9-dioctyl-2,7-dibromofluorene, 7.0 g (10.5 mmol) of M-3, 0.2 g (0.2 mmol) of Pd$_2$(dba)$_3$, 0.06 g (0.3 mmol) of P(t-Bu)$_3$, 3.0 g (31.5 mmol) of sodium-t-butoxide and 40 mL of toluene were mixed. The mixture was heated under reflux for 20 hours.

After completion of the reaction, the solvent was removed under reduced pressure. An intended substance was extracted by adding 100 mL of water to take out an organic phase. The organic phase thus taken out was dried by adding MgSO$_4$. MgSO$_4$ was removed by filtration. The solvent was concentrated under reduced pressure. The concentrated liquid was filtered through silica gel. The collected solution was concentrated under reduced pressure. The concentrated solution was added to methanol dropwise to precipitate solids. The solids were collected by suction filtration and dried under reduced pressure.

Under a nitrogen atmosphere, the crude product, 0.5 g (3.2 mmol) of bromobenzene, 0.04 g (0.2 mmol) of Pd(OAc)$_2$, 0.06 g (0.3 mmol) of P(t-Bu)$_3$, 1.1 g (5.2 mmol) of potassium phosphate and 40 mL of toluene were mixed. The mixture was heated for 8 hours under reflux. Next, 0.4 g (3.2 mmol) of phenyl boronic acid was added thereto, and heated for further 8 hours.

After completion of the reaction, an intended substance was extracted by adding 100 mL of water to take out an organic phase. MgSO$_4$ was added to the organic phase thus taken out for drying. MgSO$_4$ was removed by filtration. The collected filtrate was filtered through silica gel. The collected solution was concentrated, followed by addition of an aqueous solution of sodium diethyldithiacarbamate. The mixture was stirred at 80° C. for 2 hours. After cooling, an organic phase was washed with water. The solution obtained was added to methanol dropwise to obtain a precipitate by filtration.

The precipitate was dissolved in toluene and purified through a silica-gel column. The solution obtained was added to methanol dropwise and stirred. Then, the precipitate obtained was filtered and dried to obtain 5.3 g of polymer P-3. Polymer P-3 had a number average molecular weight of 1.4×10$^4$ in terms of polystyrene and a weight average molecular weight of 2.9×10$^4$ in terms of polystyrene.

Example 4

P-4 was synthesized by the following synthesis scheme.

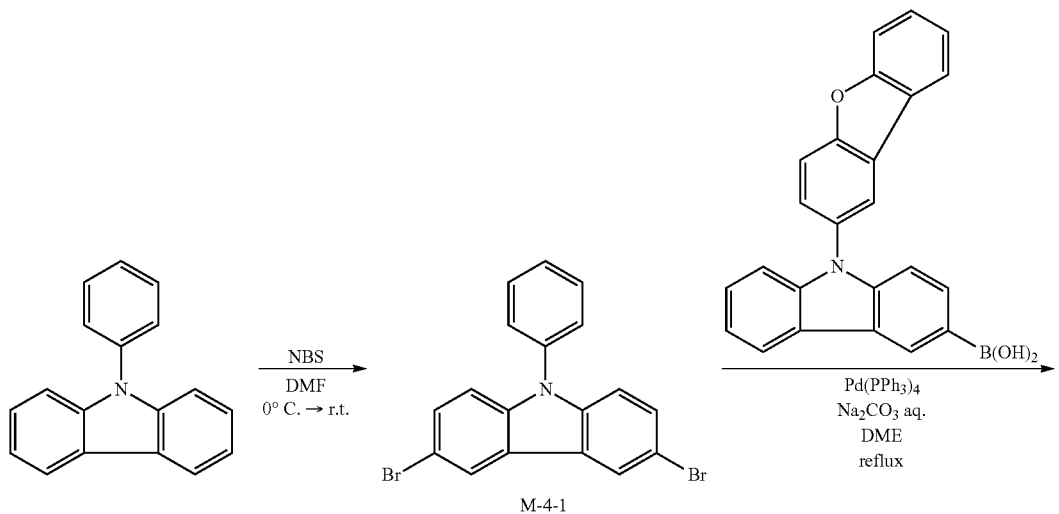

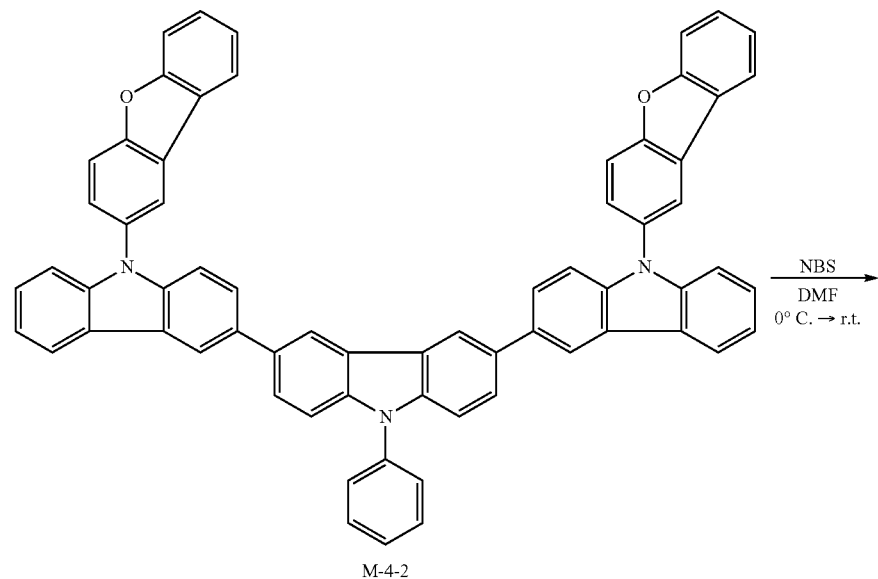

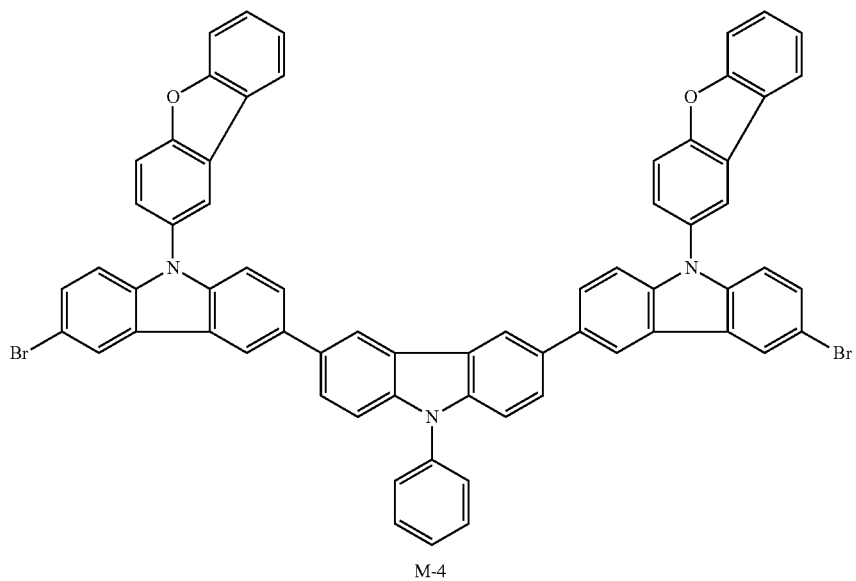
M-4
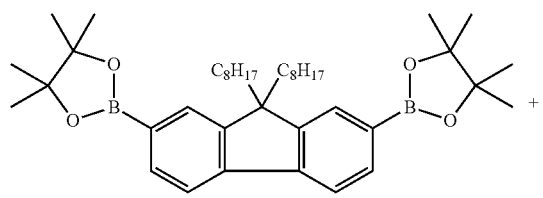
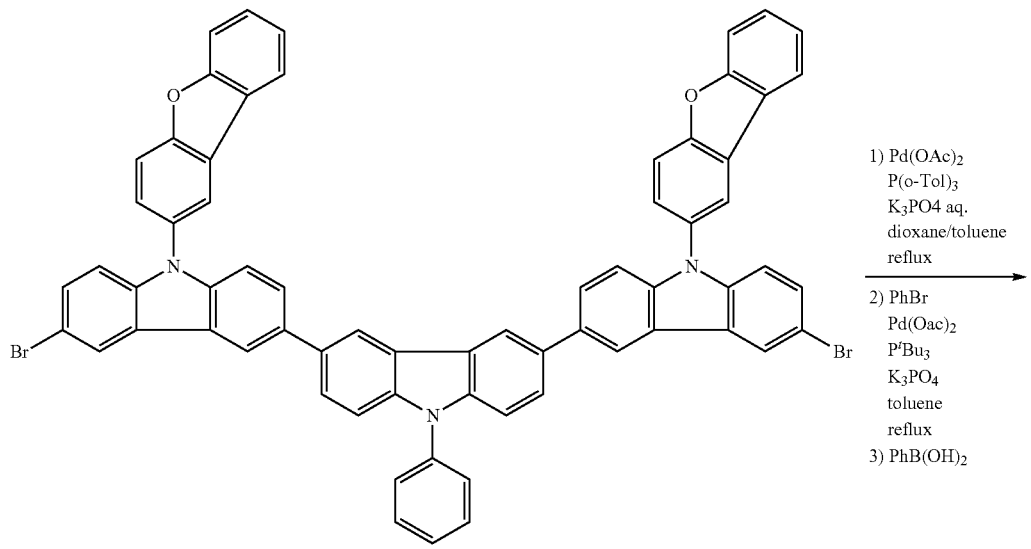

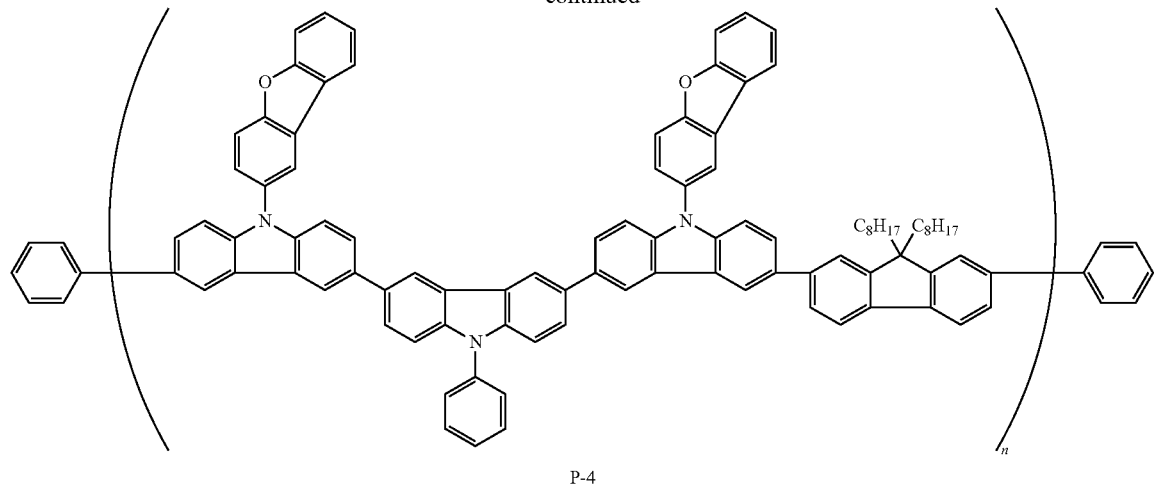

P-4

(1) Synthesis of Intermediate M-4-1

M-4-1 was synthesized in the same manner as in the synthesis of monomer M-1 by using 9-phenylcarbazole as the raw material. 2.9 g of an intended substance was obtained (yield: 73%). By $^1$H-NMR spectrum and FD-MS analysis, it was confirmed to be M-4-1.

(4) Synthesis of Intermediate M-4-2

M-4-2 was synthesized in the same manner as in the synthesis of intermediate M-1-4, except that M-2-3 was used as the raw material and M-4-1 was used instead of 3-bromo-9H-carbazole. 2.7 g of an intended substance was obtained (yield: 61%). By $^1$H-NMR spectrum and FD-MS analysis, it was confirmed to be M-4-2.

(5) Synthesis of Monomer M-4

Synthesis was conducted in the same manner as in the synthesis of monomer M-1, except that M-4-2 was used as the raw material. 3.9 g of an intended substance was obtained (yield: 56%). By $^1$H-NMR spectrum and FD-MS analysis, it was confirmed to be M-4.

(6) Synthesis of Polymer P-4

P-4 was synthesized in the same manner as in the synthesis of P-1, except that M-4 was used instead of M-1. 3.6 g of an intended substance was obtained. Polymer P-4 had a number average molecular weight of $1.4 \times 10^4$ in terms of polystyrene and a weight average molecular weight of $3.5 \times 10^4$ in terms of polystyrene.

Example 5

P-5 was synthesized by the following synthesis scheme.

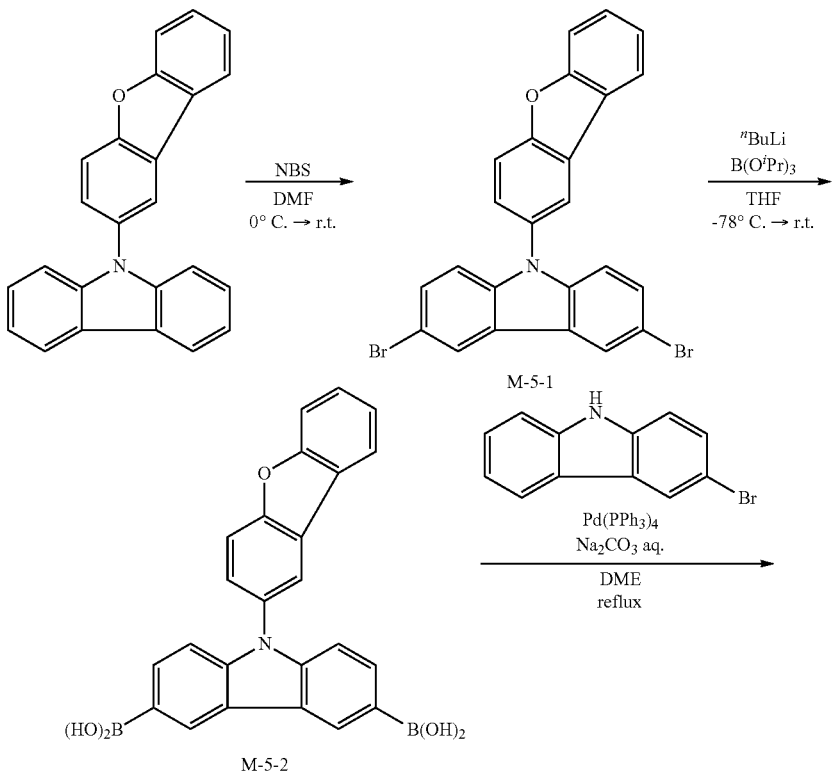

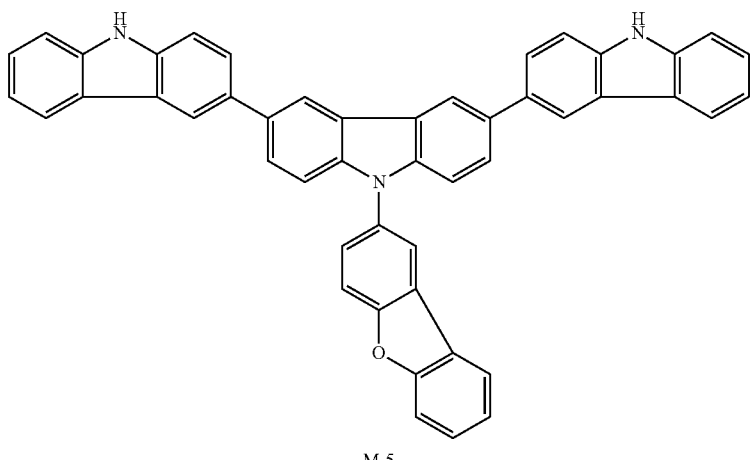
M-5
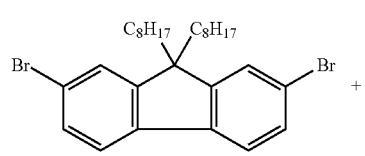
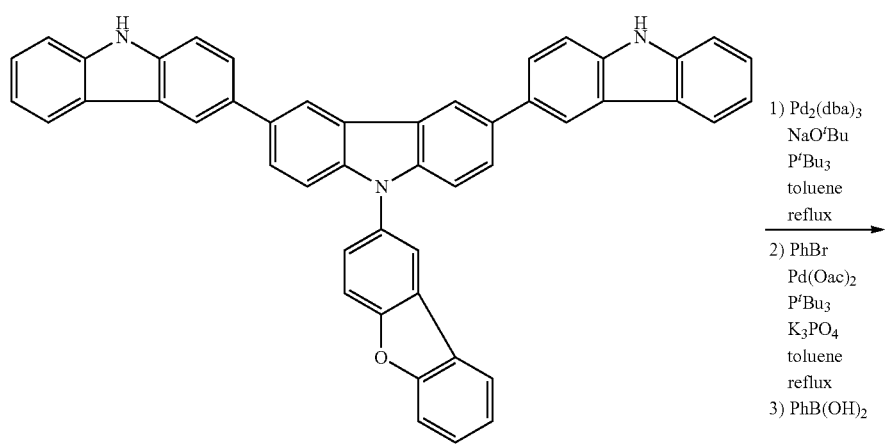
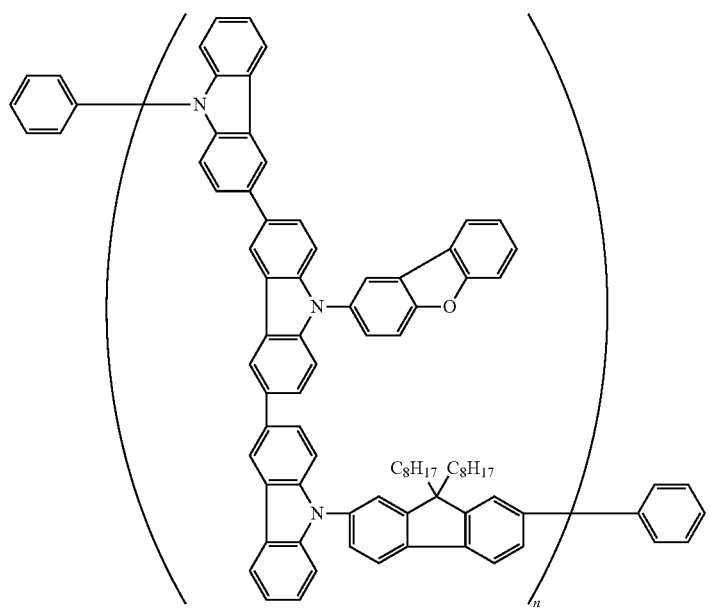
P-5

(1) Synthesis of Intermediate M-5-1

M-5-1 was synthesized in the same manner as in the synthesis of the intermediate M-1-1 by using 2-(9H-carbazole-9-yl)dibenzofuran as the raw material. 4.6 g of an intended substance was obtained (yield: 87%). By $^1$H-NMR spectrum and FD-MS analysis, it was confirmed to be M-5-1.

(2) Synthesis of Intermediate M-5-2

M-5-2 was synthesized in the same manner as in the synthesis of intermediate M-1-3 by using M-5-1 as the raw material. 1.9 g of an intended substance was obtained (yield: 43%). By $^1$H-NMR spectrum and FD-MS analysis, it was confirmed to be M-5-2.

(3) Synthesis of Monomer M-5

M-5 was synthesized in the same manner as in the synthesis of intermediate M-1-4 by using M-5-2 as the raw material. 3.5 g of an intended substance was obtained (yield: 56%). By $^1$H-NMR spectrum and FD-MS analysis, it was confirmed to be M-5.

(4) Synthesis of Polymer P-5

Polymer P-5 was synthesized in the same manner as in the synthesis of P-3 by using M-5 instead of M-3. 6.2 g of an intended substance was obtained. Polymer P-5 had a number average molecular weight of $1.7 \times 10^4$ in terms of polystyrene and a weight average molecular weight of $3.3 \times 10^4$ in terms of polystyrene.

Example 6

P-6 was synthesized by the following synthesis scheme.

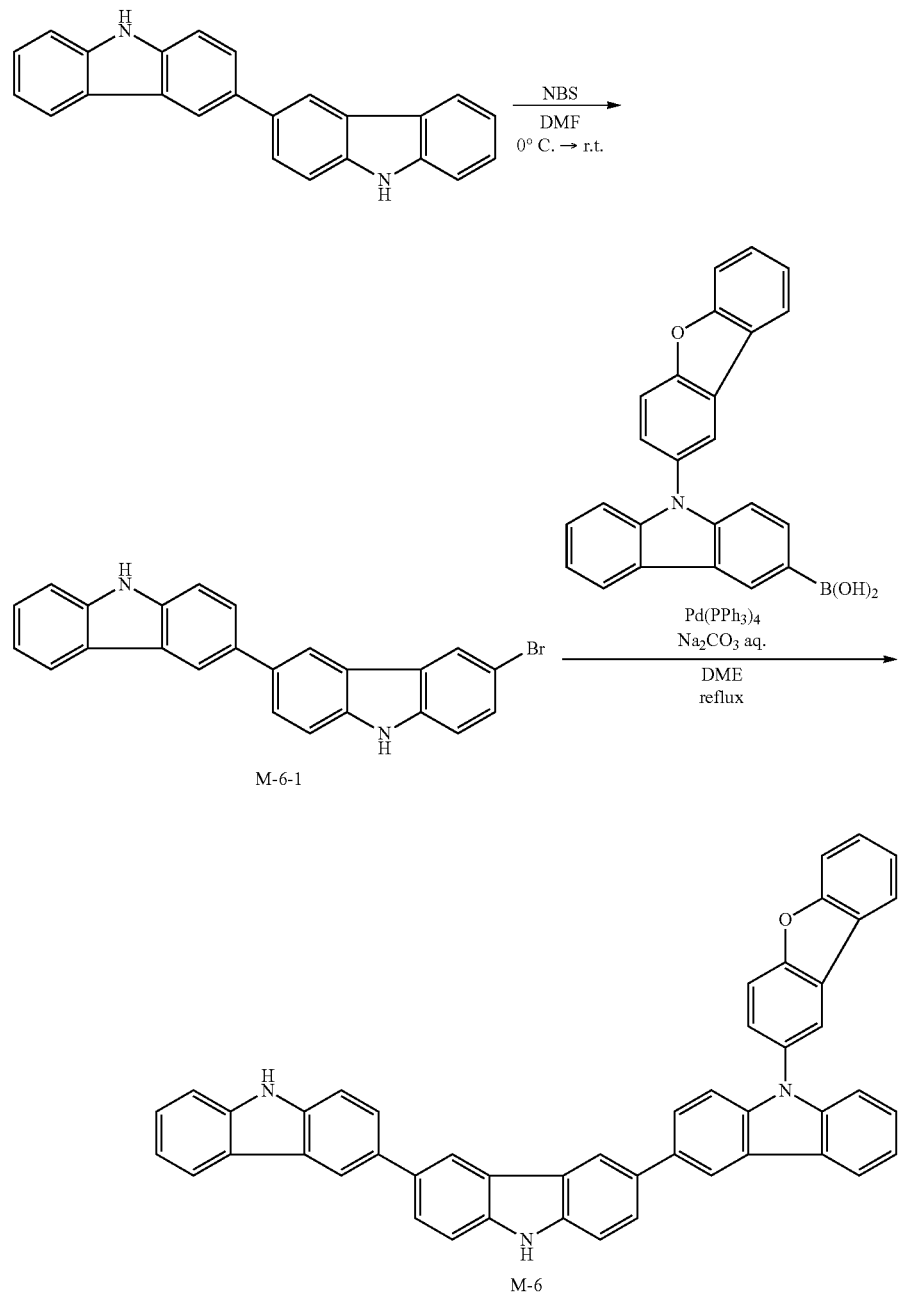

-continued

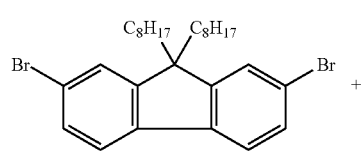

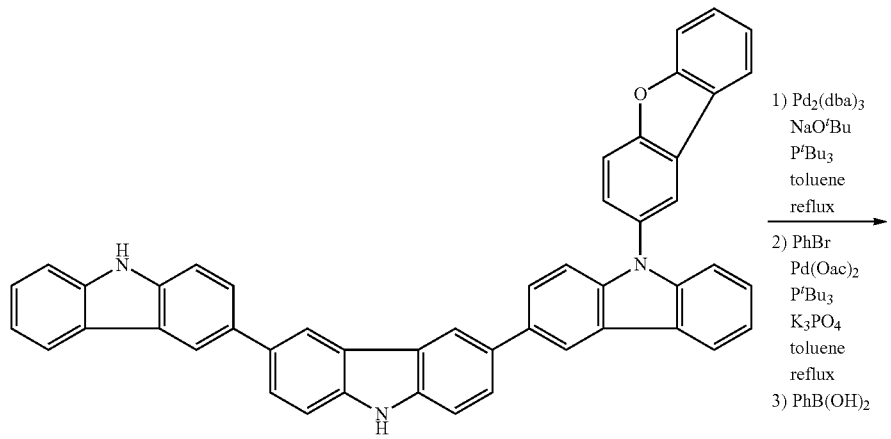

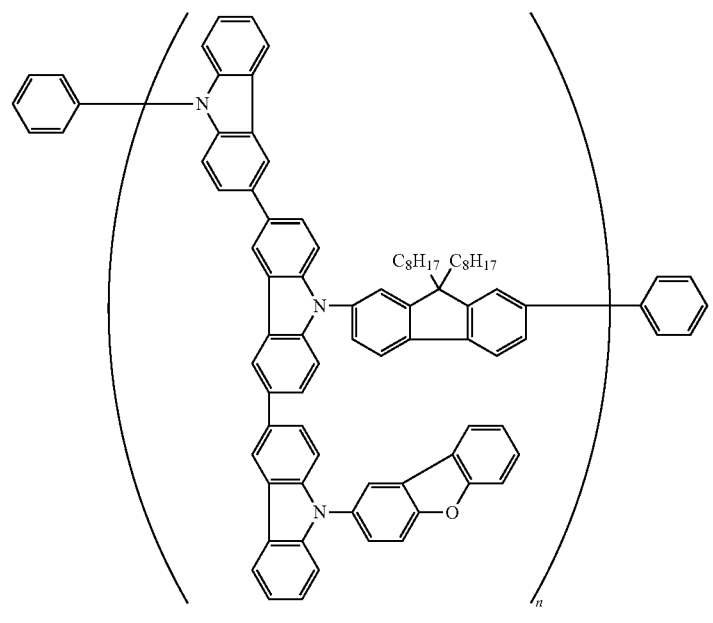

P-6

(1) Synthesis of Intermediate M-6-1

M-6-1 was synthesized in the same manner as in the synthesis of intermediate M-1-1 by using 3-(9H-carbazole-3-yl)carbazole as the raw material. 3.5 g of an intended substance was obtained (yield: 66%). By $^1$H-NMR spectrum and FD-MS analysis, it was confirmed to be M-6-1.

(2) Synthesis of Intermediate M-6

M-6 was synthesized in the same manner as in the synthesis of intermediate M-1-4, except that M-6-1 was used as the raw material and (9-(dibenzofuran-2-yl)-carbazole-3-yl)boronic acid was used instead of 3-bromo-9H-carbazole. 4.9 g of an intended substance was obtained (yield: 72%). By $^1$H-NMR spectrum and FD-MS analysis, it was confirmed to be M-6.

(3) Synthesis of Polymer P-6

P-6 was synthesized in the same manner as in the synthesis of P-3 by using M-6 instead of M-3. 2.4 g of an intended substance was obtained. Polymer P-6 had a number average molecular weight of $1.3 \times 10^4$ in terms of polystyrene and a weight average molecular weight of $3.0 \times 10^4$ in terms of polystyrene.

Example 7
P-7 was synthesized by the following synthesis scheme.
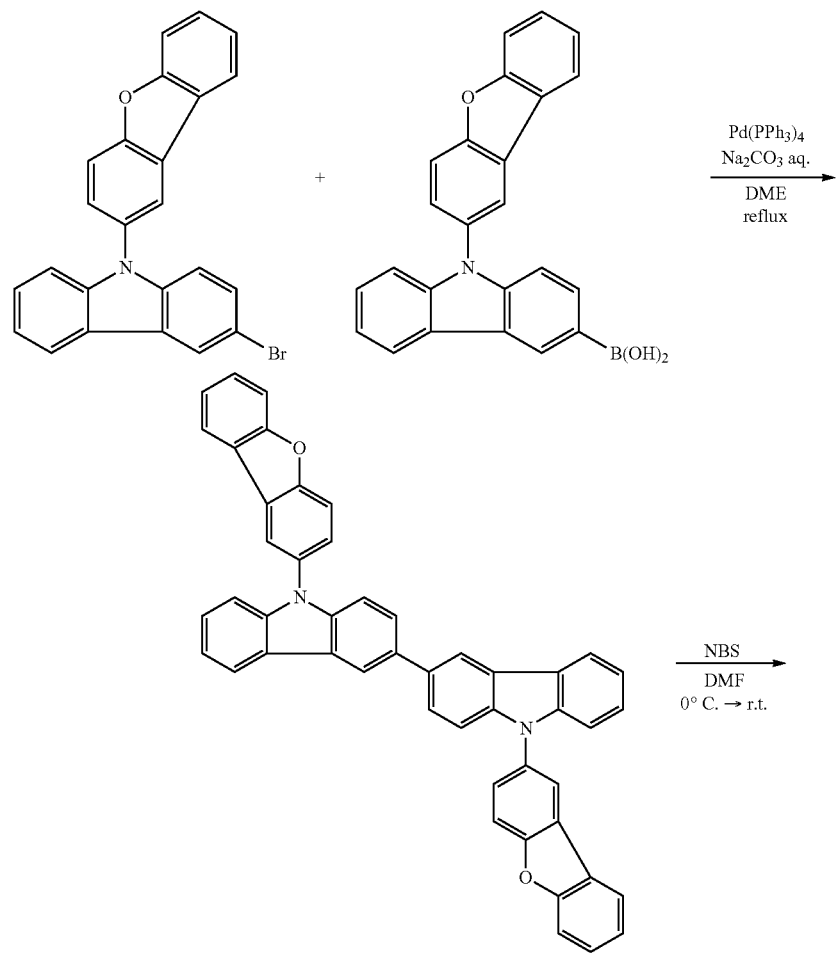
M-7-1
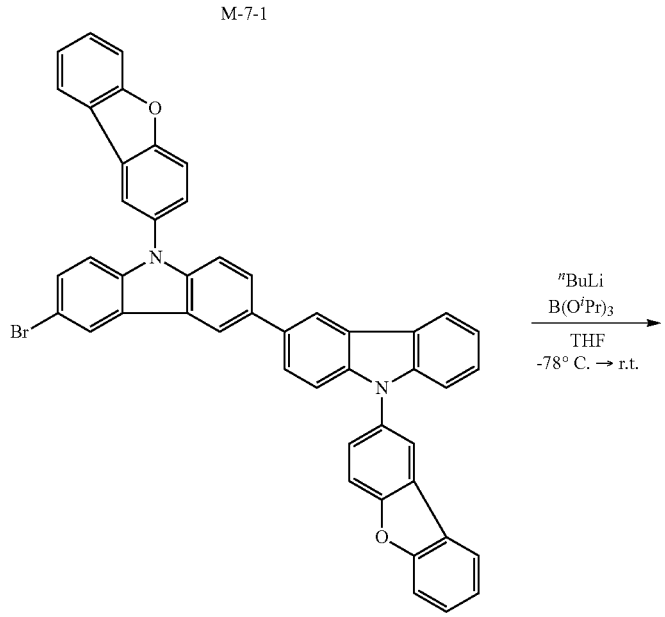
M-7-2

-continued
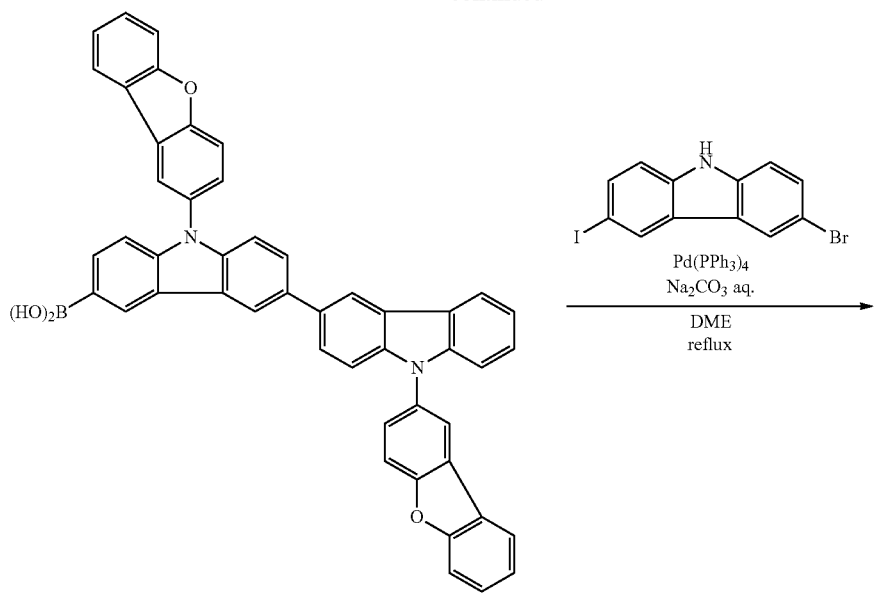
M-7-3
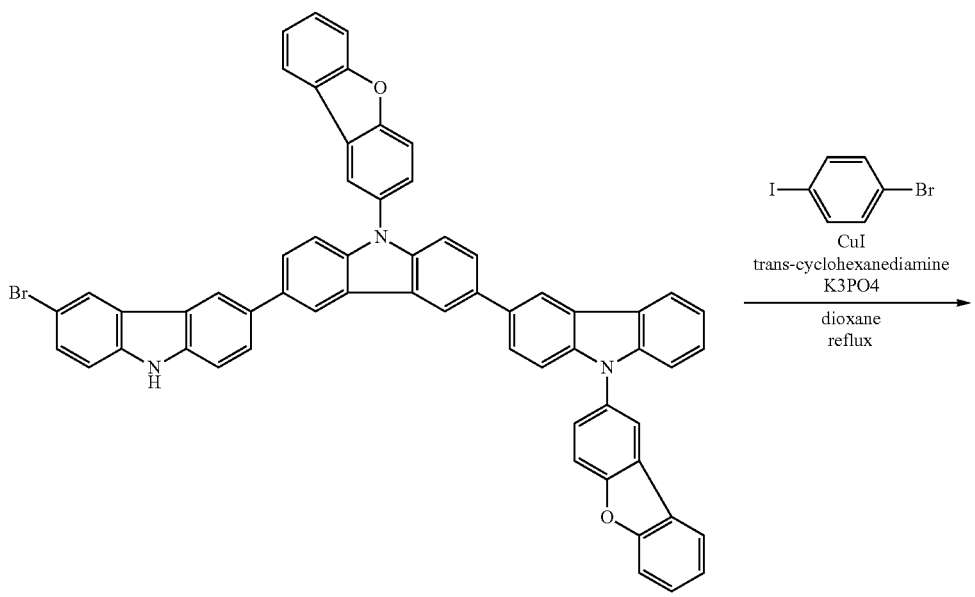
M-7-4

-continued
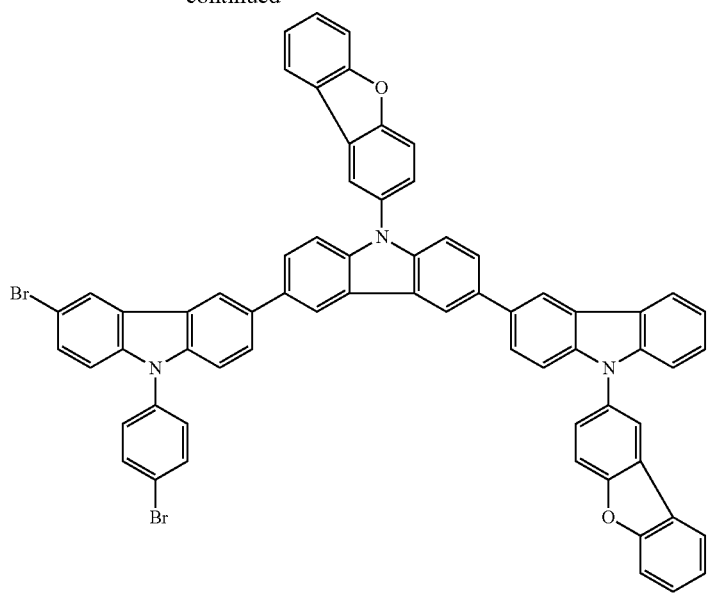
M-7
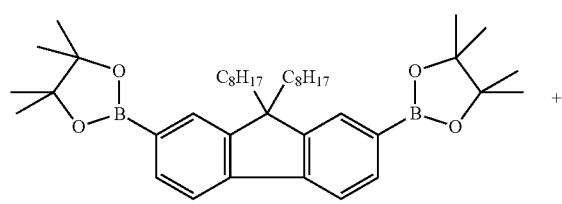
+
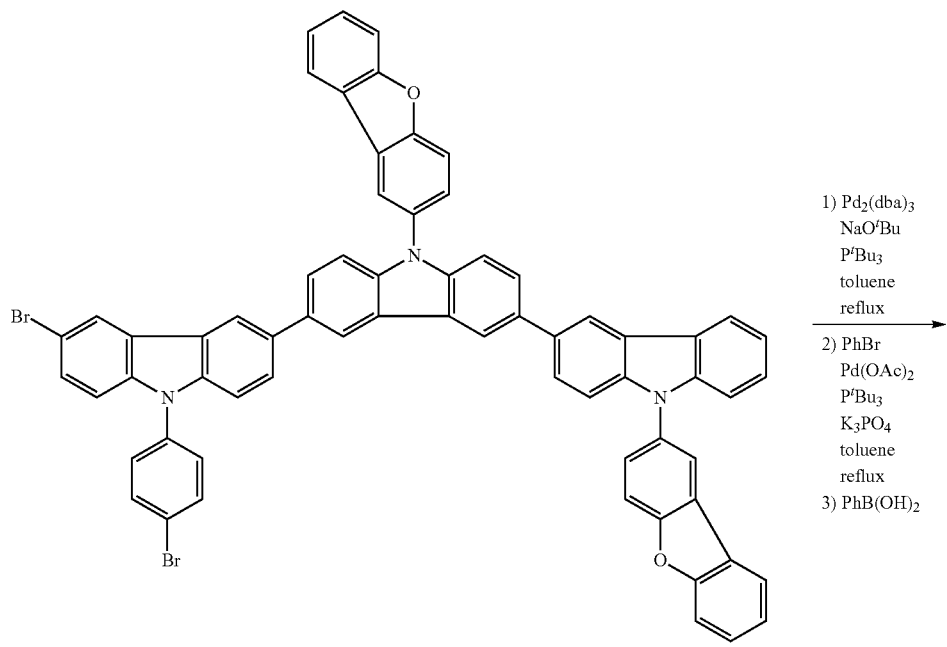
1) Pd$_2$(dba)$_3$
   NaO$^t$Bu
   P$^t$Bu$_3$
   toluene
   reflux
2) PhBr
   Pd(OAc)$_2$
   P$^t$Bu$_3$
   K$_3$PO$_4$
   toluene
   reflux
3) PhB(OH)$_2$ -continued

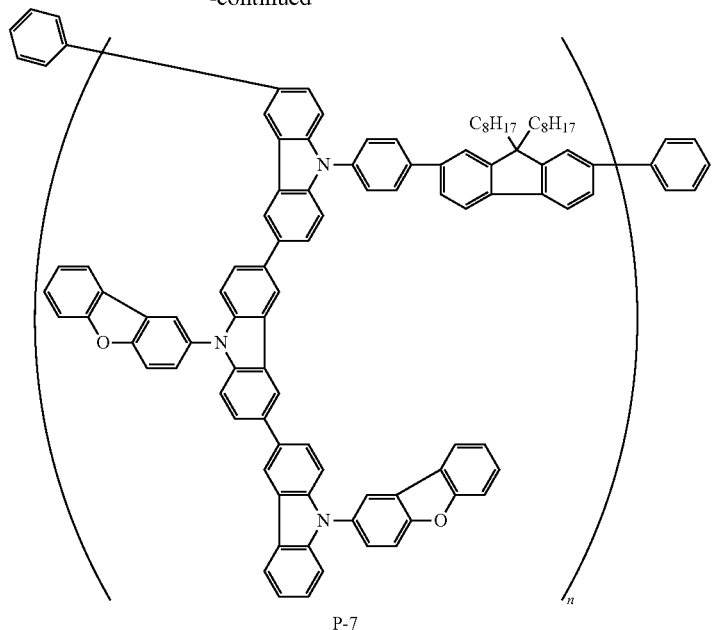

P-7

(1) Synthesis of Intermediate M-7-1
M-7-1 was synthesized in the same manner as in the synthesis of intermediate M-1-4, except that (9-(dibenzofuran-2-yl)-carbazole-3-yl-boronic acid was used as the raw material and 3-bromo-9-(dibenzofuran-2-yl)-carbazole was used instead of 3-bromo-9H-carbazole. 3.6 g of an intended substance was obtained (yield: 82%). By $^1$H-NMR spectrum and FD-MS analysis, it was confirmed to be M-7-1.

(2) Synthesis of Intermediate M-7-2
M-7-2 was synthesized in the same manner as in the synthesis of intermediate M-1-1 by using except that M-7-1 as the raw material. 3.5 g of an intended substance was obtained (yield: 66%). By $^1$H-NMR spectrum and FD-MS analysis, it was confirmed to be M-7-2.

(3) Synthesis of Intermediate M-7-3
M-7-3 was synthesized in the same manner as in the synthesis of intermediate M-1-3 by using M-7-2 as the raw material. 4.1 g of an intended substance was obtained (yield: 62%). By $^1$H-NMR spectrum and FD-MS analysis, it was confirmed to be M-7-3.

(4) Synthesis of Intermediate M-7-4
M-7-4 was synthesized in the same manner as in the synthesis of intermediate M-1-4, except that M-7-3 was used as the raw material and 3-bromo-6-iodo-9H-carbazole was used instead of 3-bromo-9H-carbazole. 1.8 g of an intended substance was obtained (yield: 76%). By $^1$H-NMR spectrum and FD-MS analysis, it was confirmed to be M-7-4.

(5) Synthesis of Monomer M-7
M-7 was synthesized in the same manner as in the synthesis of intermediate M-1-2, except that M-7-4 was used as the raw material and 1-bromo-4-iodobenzene was used instead of iodobenzene. 2.7 g of an intended substance was obtained (yield: 70%). By $^1$H-NMR spectrum and FD-MS analysis, it was confirmed to be M-7.

(6) Synthesis of Polymer P-7
P-7 was synthesized in the same manner as in the synthesis of P-1 by using M-7 instead of M-1. 3.1 g of an intended substance was obtained. Polymer P-7 had a number average molecular weight of $1.1 \times 10^4$ in terms of polystyrene and a weight average molecular weight of $2.7 \times 10^4$ in terms of polystyrene.

Example 8

P-8 was synthesized by the following synthesis scheme.

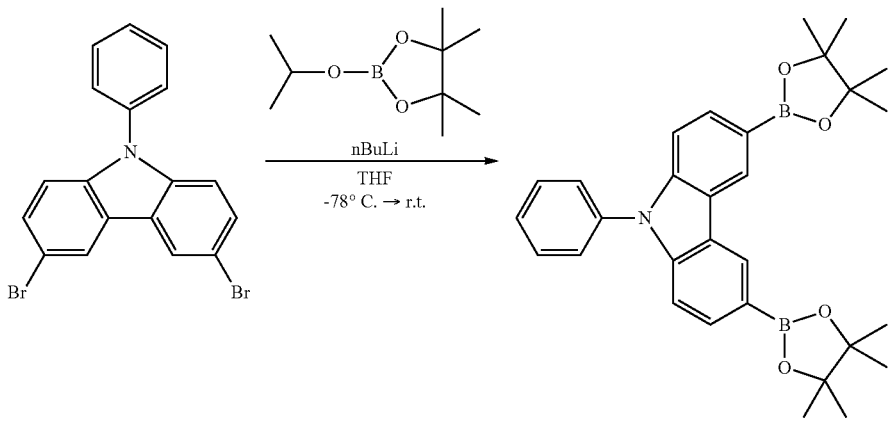

M-8-1

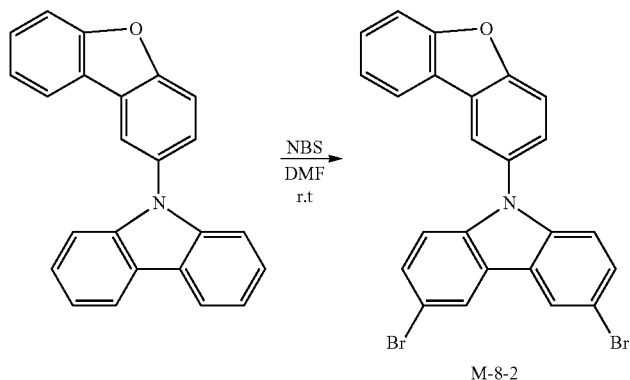
-continued
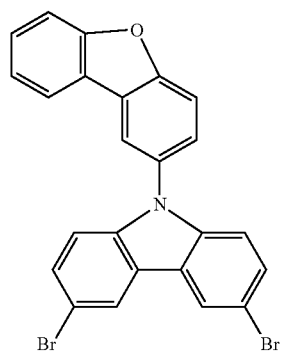
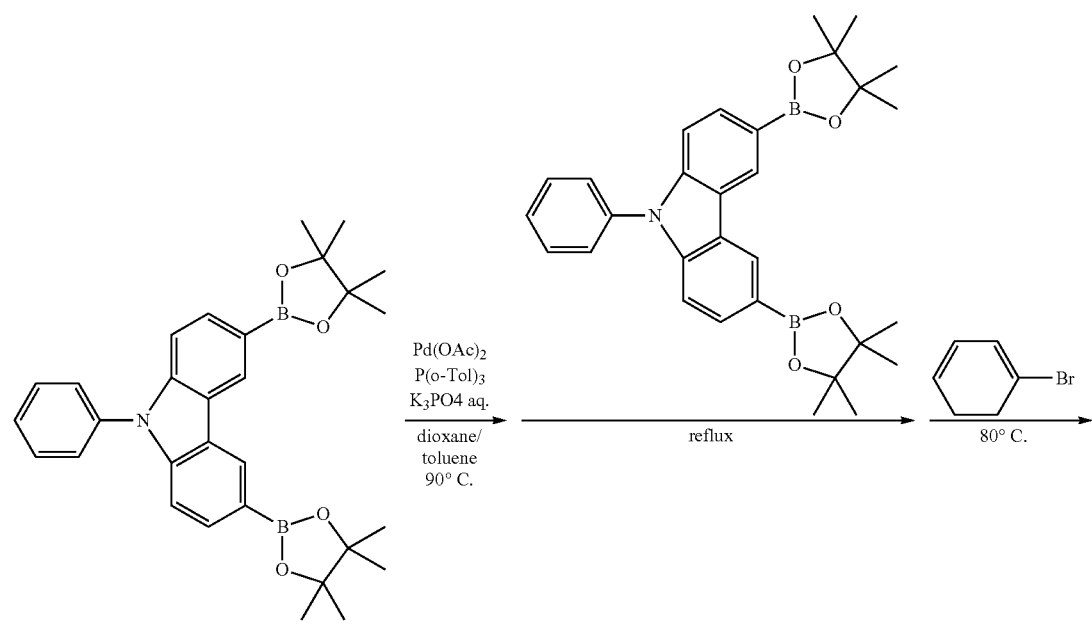

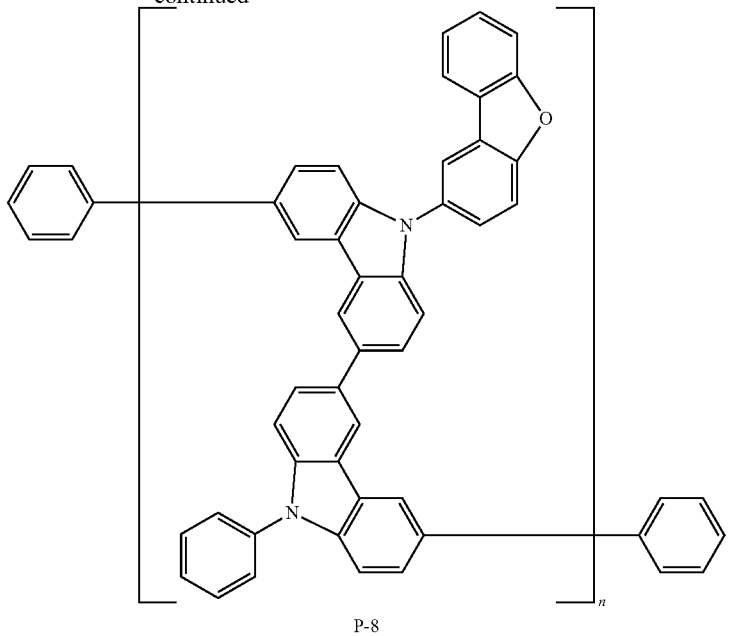

P-8

(1) Synthesis of Intermediate M-8-1

Under a nitrogen atmosphere, a reaction was conducted by using a stirrer while keeping a homogenous state.

10.03 g ($2.50 \times 10^{-2}$ mol) of 9-phenyl-3,6-dibromocarbazole and 125 mL of THF as a solvent were placed in a 300 mL three-necked flask. The mixture was cooled to −78° C. in a dry ice/methanol bath. 34.4 mL ($2.50 \times 10^{-2}$ mol) of a hexane solution of n-butyllithium (1.6M) was added dropwise slowly. After completion of the dropwise addition, stirring was conducted for one hour, whereby 9-phenyl-3,6-dilithiocarbazole (dilithio body) was obtained.

Then, while keeping at −78° C., to the reaction solution, 11.2 g ($6.00 \times 10^{-2}$ mol) of 2-isopropoxy-4,4,5,5-tetramethyl-1,3,2-dioxaborane was added slowly, and the resultant was returned to room temperature slowly. A reaction was conducted by stirring for further 5 hours. After completion of the reaction, the reaction liquid was poured to 500 mL of water, extraction was conducted with methylene chloride by using a separating funnel. Methylene chloride was removed by distillation under reduced pressure to obtain a crude product. Finally, purification was conducted by silica gel column chromatography (a mixed solvent of methylene chloride and hexane; solvent:volume ratio 1:1, or methylene chloride alone), whereby 8.20 g of M-8-1 as an intended product was isolated (yield: 66%). By $^1$H-NMR spectrum and FD-MS analysis, it was confirmed to be M-8-1.

(2) Synthesis of Intermediate M-8-2

Synthesis was conducted in the same manner as in the synthesis of monomer M-1 by using M-2-1 as the raw material. 4.86 g of an intended substance was obtained (yield: 75%). By $^1$H-NMR spectrum and FD-MS analysis, it was confirmed to be M-8-2.

(3) Synthesis of Polymer P-8

Under a nitrogen atmosphere, a reaction was conducted by using a stirrer while keeping a homogenous state.

In a 100 mL-three neck flask equipped with a cooling tube (reflux condenser), 0.69 g ($1.40 \times 10^{-3}$ mol) of M-8-1, 0.69 g ($1.40 \times 10^{-3}$ mol) of M-8-2, 1.53 g ($7.21 \times 10^{-3}$ mmol) of tripotassium phosphate, 0.0122 g ($4.00 \times 10^{-5}$ mol) of tri(o-tolyl)phosphine, 17 mL of dioxane, 4 mL of toluene and 2.7 mL of water were placed, and the resulting mixture was sufficiently stirred. To this, 0.0225 g ($1.00 \times 10^{-5}$ mol) of palladium acetate was added, and a polymerization reaction was conducted at 90° C. for 8 hours. Subsequently, to this reaction liquid, 0.0297 g ($6.00 \times 10^{-5}$ mol) of M-8-1 was added, and refluxed for 4 hours. Further, 0.100 g ($6.37 \times 10^{-4}$ mol) of benzene bromide was added and refluxed for 4 hours. Finally, 1.26 g ($5.60 \times 10^{-3}$ mol) of sodium N,N-diethyldithiocarbamate was added, and a reaction was conducted at 80° C. for 8 hours.

To the resulting reaction solution, 100 mL of dioxane was put to allow soluble components and insoluble components to be separated by filtration. The soluble components were concentrated under reduced pressure, and the resultant was poured to 500 mL of methanol to conduct re-precipitation. The formed solid components were taken out by filtration, and the solvent was fully dried under reduced pressure, whereby 0.12 g (recovery: 15%) of polymer P-8 as an intended product was obtained. Polymer P-8 had a weight average molecular weight of 1500 in terms of polystyrene and a number average molecular weight of 1200 in terms of polystyrene. Subsequently, 100 mL of toluene was added to the insoluble components and refluxed, and the toluene-soluble components were concentrated under reduced pressure. Then, the resultant was poured to 500 mL of methanol to conduct re-precipitation. The formed solid components were collected by filtration, and the solvent was sufficiently dried under reduced pressure, whereby 0.27 g (recovery: 33%) of polymer P-8 as an intended product was obtained. Polymer P-8 had a number average molecular weight of 1700 in terms of polystyrene and a weight average molecular weight of 1200 in terms of polystyrene.

Comparative Example 1

P-9 was synthesized by the following synthesis scheme.

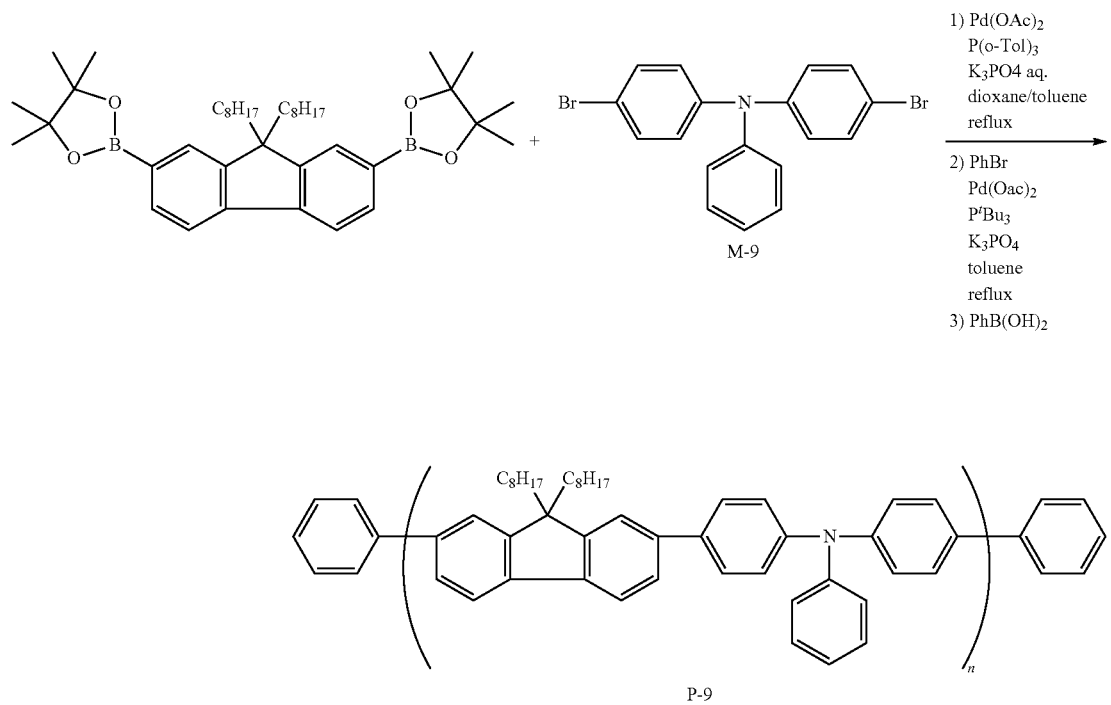

(1) Synthesis of P-9

P-9 was synthesized in the same manner as in the synthesis of P-1 by using 2,7-bis(4,4,5,5-tetramethyl-1,3,2-dioxaborolane-2-yl)-9,9-di-n-octylfluorene and M-9. An intended product was obtained in a yield of 5.6 g. Polymer P-9 had a weight average molecular weight of $2.4 \times 10^4$ in terms of polystyrene and a number average molecular weight of $7.8 \times 10^3$ in terms of polystyrene.

Comparative Example 2

P-10 was synthesized by the following synthesis scheme.

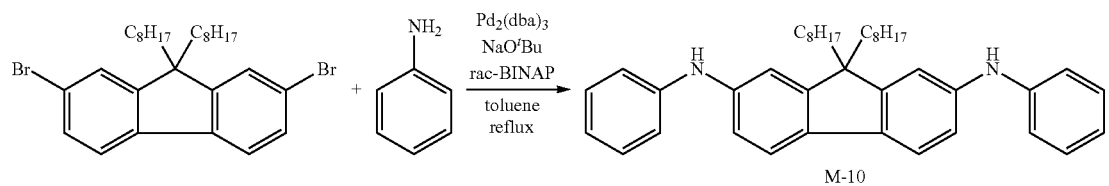

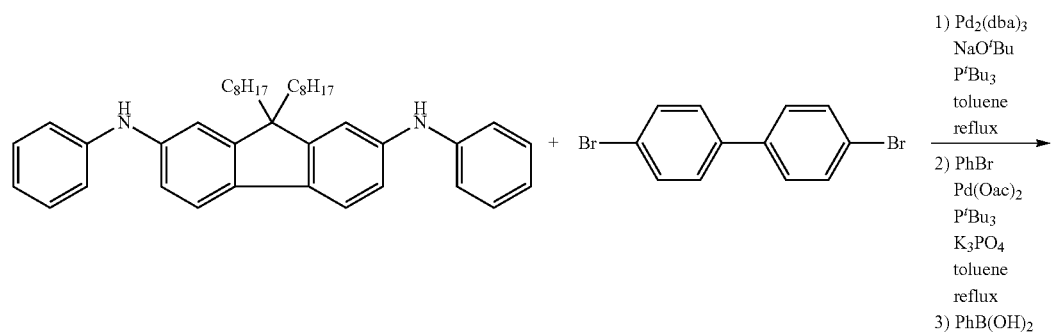

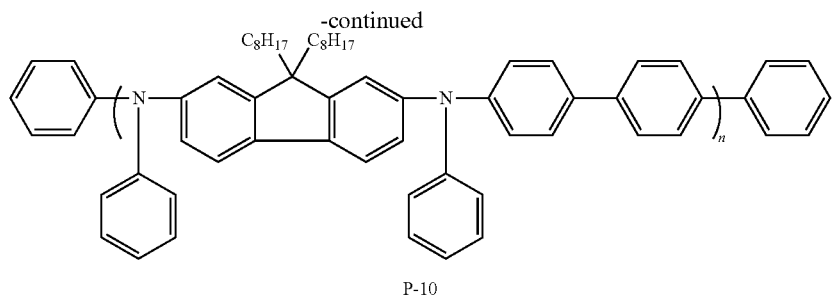

P-10

(1) Synthesis of monomer M-10

Under a nitrogen atmosphere, 10.0 g (18.2 mmol) of 9,9-dioctyl-2,7-dibromofluorene, 1.7 g (18.2 mmol) of aniline, 0.6 g (0.6 mmol) of $Pd_2(dba)_3$, 1.7 g (0.8 mmol) of rac-BINAP (2,2'-bis(diphenylphosphino)-1,1'-binaphthyl), 5.0 g (72.8 mmol) of sodium-t-butoxide and 500 mL of toluene were mixed. The mixture was heated under reflux for 16 hours.

After completion of the reaction, the solvent was removed under reduced pressure. An intended substance was extracted by adding 100 mL of water to take out an organic phase. The organic phase thus taken out was dried by adding $MgSO_4$. $MgSO_4$ was removed by filtration. The solvent was removed under reduced pressure. The resulting crude product was purified by silica gel chromatography. The resulting solids were dried under reduced pressure, whereby 6.8 g (yield: 65%) of white solids were obtained.

By $^1$H-NMR spectrum and FD-MS analysis, the resulting white solids were confirmed to be intermediate M-10.

(4) Synthesis of Polymer P-10

P-10 was synthesized in the same manner as in the synthesis of P-4 by using 4,4'-dibromobiphenyl and M-10. An intended product was obtained in a yield of 4.5 g. Polymer P-10 had a weight average molecular weight of $1.3 \times 10^4$ in terms of polystyrene and a number average molecular weight of $3.6 \times 10^4$ in terms of polystyrene.

Comparative Example 3

P-11 was synthesized by the following synthesis scheme.

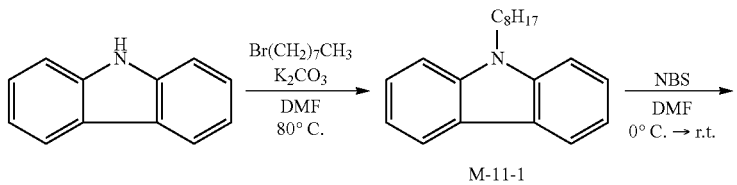

M-11-1

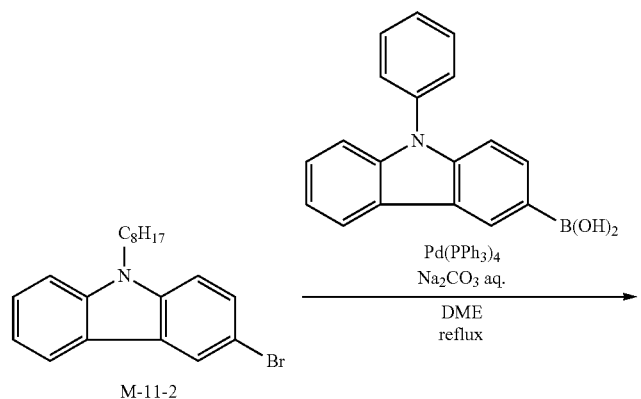

M-11-2

-continued
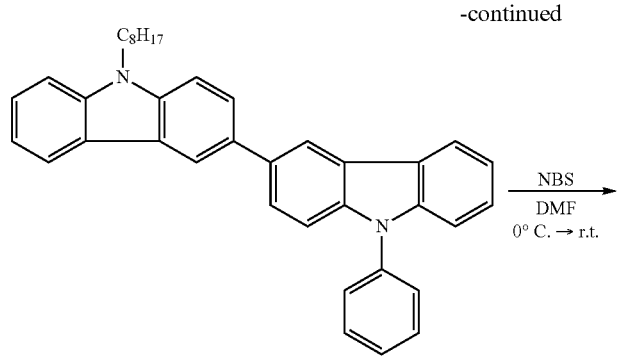
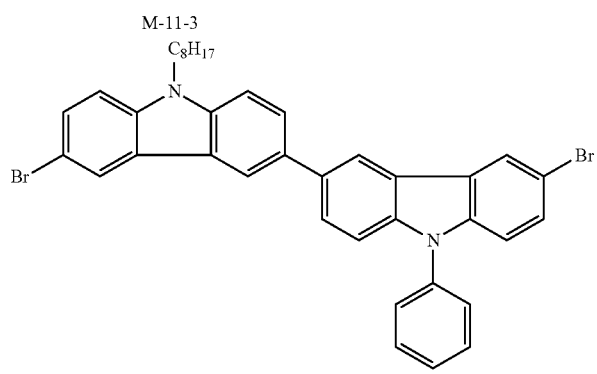
M-11-3
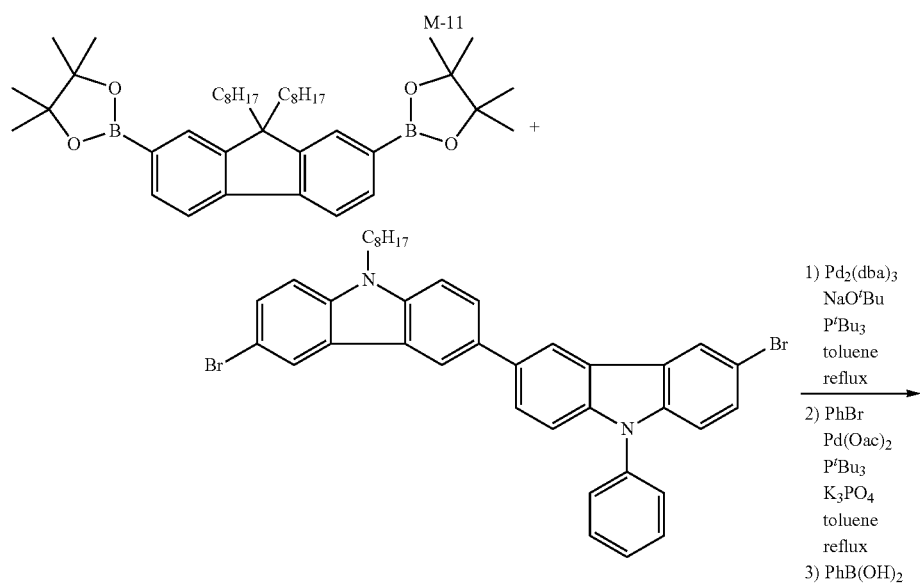
M-11
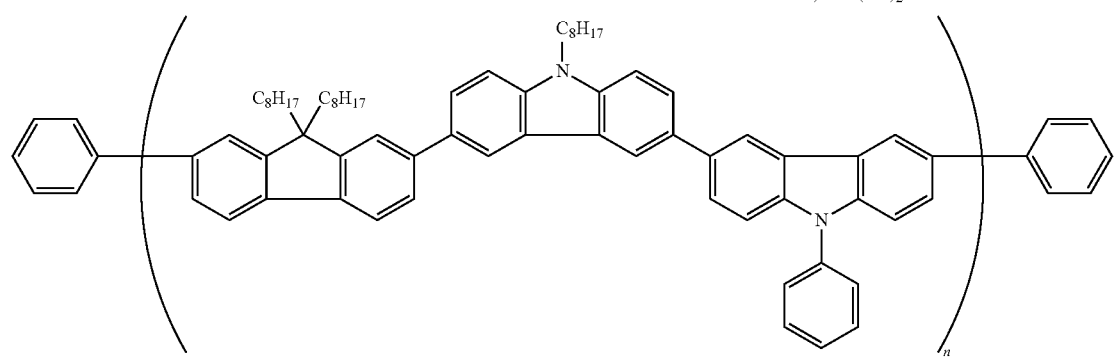
P-11

(1) Synthesis of Intermediate M-11-1

Under a nitrogen atmosphere, 1.3 g (8.0 mmol) of 9H-carbazole, 3.1 g (16 mmol) of, and 1.7 g (12 mmol) of potassium carbonate were placed, and 20 mL of DMF was added. Further, 3.0 g (11.4 mmol) of 1-bromooctane was added, and the resultant was stirred at 80° C. for 16 hours. After completion of the reaction, the solvent was removed under reduced pressure. 100 mL of water was added to extract an intended product and an organic phase was taken out. The organic phase thus taken out was dried by adding MgSO$_4$. MgSO$_4$ was removed by filtration. The solvent was removed under reduced pressure. The resulting crude product was purified by silica gel chromatography. The resulting solids were dried under reduced pressure, whereby 1.9 g (yield: 86%) of white solids were obtained.

By $^1$H-NMR spectrum and FD-MS analysis, the resulting white solids were confirmed to be intermediate M-11-1.

(2) Synthesis of Intermediate M-11-2

Synthesis was conducted in the same manner as in the synthesis of intermediate M-1-1 by using M-11-1 as the raw material. An intended product was obtained in a yield of 5.3 g (yield: 83%). By $^1$H-NMR spectrum and FD-MS analysis, the intended product was confirmed to be M-11-2.

(3) Synthesis of Intermediate M-11-3

Synthesis was conducted in the same manner as in the synthesis of intermediate M-1-4 by using M-11-2 instead of 3-bromocarbazole as the raw material. 4.4 g of an intended substance was obtained (yield: 78%). By $^1$H-NMR spectrum and FD-MS analysis, it was confirmed to be M-11-3.

(4) Synthesis of Monomer M-11

Synthesis was conducted in the same manner as in the synthesis of monomer M-1 by using M-11-3 as the raw material. 4.9 g of an intended substance was obtained (yield: 75%). By $^1$H-NMR spectrum and FD-MS analysis, it was confirmed to be M-11.

(7) Polymer P-11

Synthesis was conducted in the same manner as in the synthesis of P-1 by using M-11 instead of M-1. 3.3 g of an intended substance was obtained. Polymer P-11 had a weight average molecular weight of $1.9 \times 10^4$ in terms of polystyrene and a number average molecular weight of $4.1 \times 10^4$ in terms of polystyrene.

Example 9

Fabrication and Evaluation of Organic EL Device

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then UV ozone cleaning for 30 minutes. On the cleaned glass substrate with a transparent electrode, a mixture of polyethylenedioxythiophene/polystyrenesulfonate (PEDOT:PSS (acceptor)) was formed into a 10 nm-thick film as a hole-injecting layer by spin coating.

Subsequently, a xylene solution (1.0% by weight) of P-1 obtained in Example 1 was formed into a 25 nm-thick film by spin coating. Next, the resulting thin film was dried under reduced pressure at 120° C. for an hour to form a hole-transporting layer.

Further, the following compound EM1 was formed into a 40 nm-thick film by deposition. At the same time, as light emitting molecules, the following amine compound D1 including a styryl group was deposited such that the ratio by weight of EM1 to D1 became 95:5 to form an emitting layer. On the film obtained, the following compound Alq was deposited to form a 10 nm-thick film. The layer obtained served as an electron-injecting layer.

Subsequently, Li as a reducing dopant (Li source: manufactured by SAES Getters Co., Ltd.) and compound Alq were co-deposited to form an Alq:Li film (film thickness: 10 nm) as an electron-injecting layer (cathode). On the Alq:Li film, metal Al was deposited to form a metallic cathode. Glass sealing was conducted in nitrogen to fabricate an organic EL device. The fabricated organic EL device was evaluated for luminous efficiency (cd/A) by applying an electric current. The results are shown in Table 1.

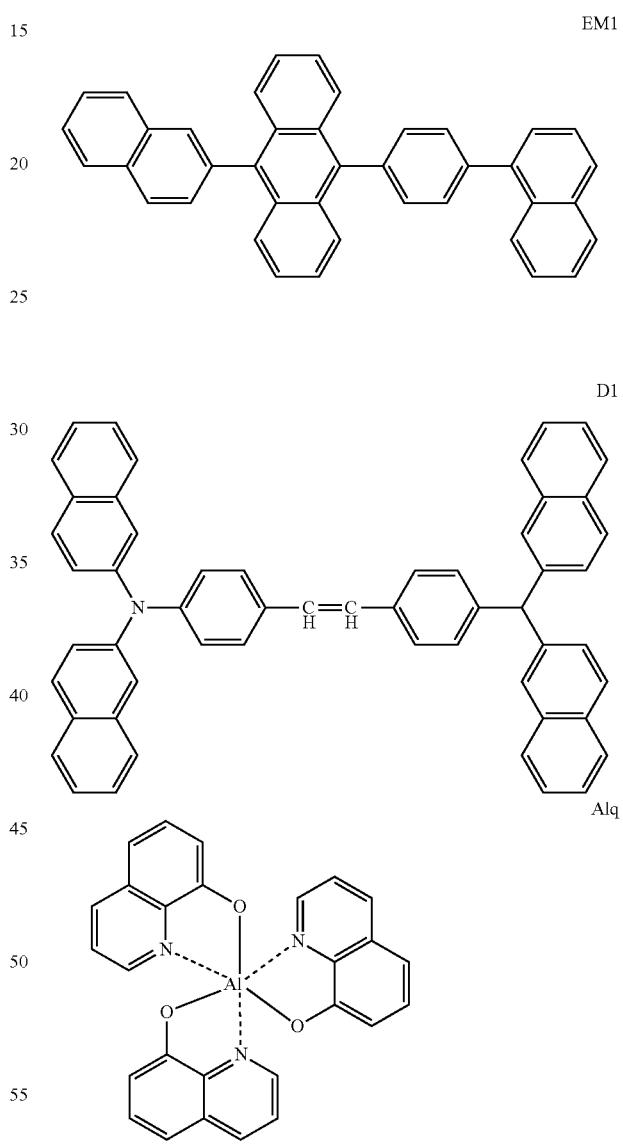

Example 10

An organic EL device was fabricated and evaluated in the same manner as in Example 9, except that the following arylamine compound D2 was used instead of amine compound D1 including a styryl group as a material for an emitting layer. The results are shown in Table 1.

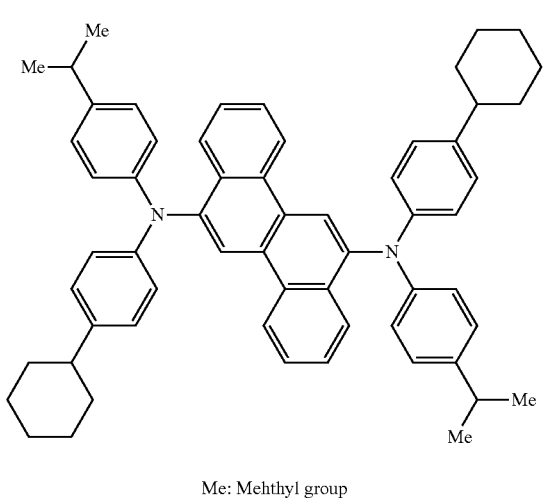

D2

Me: Mehthyl group

Comparative Example 4

An organic EL device was fabricated and evaluated in the same manner as in Example 9, except that P-9 obtained in Comparative Example 1 was used instead of P-1 as a hole-transporting material. The results are shown in Table 1.

Comparative Example 5

An organic EL device was fabricated and evaluated in the same manner as in Example 9, except that P-10 obtained in Comparative Example 2 was used instead of P-1 as a hole-transporting material. The results are shown in Table 1.

Comparative Example 6

An organic EL device was fabricated and evaluated in the same manner as in Example 9, except that P-11 obtained in Comparative Example 3 was used instead of P-1 as a hole-transporting material. The results are shown in Table 1.

Example 11 (Fabrication and Evaluation of Organic EL Device)

An organic EL device was fabricated and evaluated in the same manner as in Example 9, except that a hole-transporting layer and an emitting layer were formed according to the following procedure. The results are shown in Table 2.

On a hole-injecting layer, a xylene solution (1.0% by weight) of polymer P-1 obtained in Example 1 was formed into a 25 nm-thick film by spin coating. The resulting thin film was dried and hardened by heat treatment at 230° C. for 30 minutes to form a hole-transporting layer.

Next, a xylene solution (1.0% by weight) in which the compound EM1 (host) and amine compound D1 including a styryl group (dopant) were mixed at the solid matter weight ratio of 95:5 was formed into a 40 nm-thick film by spin coating, dried at 150° C. for 30 minutes to obtain an emitting layer. On the film obtained, Alq was deposited to form a 10 nm-thick film. The layer obtained served as an electron-injecting layer.

Example 12

An organic EL device was fabricated and evaluated in the same manner as in Example 11, except that P-2 obtained in Example 2 was used instead of P-1 as a hole-transporting material. The results are shown in Table 2.

Example 13

An organic EL device was fabricated and evaluated in the same manner as in Example 11, except that P-3 obtained in Example 3 was used instead of P-1 as a hole-transporting material. The results are shown in Table 2.

Example 14

An organic EL device was fabricated and evaluated in the same manner as in Example 11, except that P-4 obtained in Example 4 was used instead of P-1 as a hole-transporting material. The results are shown in Table 2.

TABLE 1

|  | Hole-transporting layer | Emitting layer Host | Emitting layer Dopant | Emitting color | Luminous efficiency (cd/A) | Relative lifetime* |
|---|---|---|---|---|---|---|
| Example 9 | P-1 | EM1 | D1 | Blue | 3.9 | 1.0 |
| Example 10 | P-1 | EM1 | D2 | Blue | 4.0 | 1.0 |
| Com. Ex. 4 | P-9 | EM1 | D1 | Blue | 1.0 | 0.5 |
| Com. Ex. 5 | P-10 | EM1 | D1 | Blue | 1.2 | 0.3 |
| Com. Ex. 6 | P-11 | EM1 | D1 | Blue | 2.3 | 0.7 |

*In the table, the relative lifetime is a value calculated by taking the lifetime of the device of Example 9 as 1.

The results of Examples 9 and 10 and Comparative Examples 4 to 6 show that an organic EL device using a bis- or triscarbazole polymer of the invention which has a specific substituent represented by the formulas (3) to (7) has superior luminous efficiency and longer lifetime as compared with an organic EL device using a comparative compound as an aromatic amine derivative.

Example 15

An organic EL device was fabricated and evaluated in the same manner as in Example 11, except that P-5 obtained in Example 5 was used instead of P-1 as a hole-transporting material. The results are shown in Table 2.

Example 16

An organic EL device was fabricated and evaluated in the same manner as in Example 11, except that P-6 obtained in Example 6 was used instead of P-1 as a hole-transporting material. The results are shown in Table 2.

Example 17

An organic EL device was fabricated and evaluated in the same manner as in Example 11, except that P-7 obtained in Example 7 was used instead of P-1 as a hole-transporting material. The results are shown in Table 2.

Example 18

An organic EL device was fabricated and evaluated in the same manner as in Example 11, except that arylamine compound D2 was used instead of amine compound D1 including a styryl group as a material for an emitting layer. The results are shown in Table 2.

Comparative Example 7

An organic EL device was fabricated and evaluated in the same manner as in Example 11, except that P-9 obtained in Comparative Example 1 was used instead of P-1 as a hole-transporting material. The results are shown in Table 2.

Comparative Example 8

An organic EL device was fabricated and evaluated in the same manner as in Example 11, except that P-10 obtained in Comparative Example 2 was used instead of P-1 as a hole-transporting material. The results are shown in Table 2.

Comparative Example 9

An organic EL device was fabricated and evaluated in the same manner as in Example 11, except that P-11 obtained in Comparative Example 3 was used instead of P-1 as a hole-transporting material. The results are shown in Table 2.

INDUSTRIAL APPLICABILITY

The organic EL device of the invention can be used in a planar luminous body such as a flat panel display of a wall-hanging TV, a copier, a printer, a backlight of a crystal liquid display, or a light source of instruments, a displaying board, sign lighting or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the Japanese application specification claiming priority under the Paris Convention are incorporated herein by reference in its entirety.

The invention claimed is:
1. A polymer comprising a structural unit represented by the following formula (A):

$$\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;\;$$

$-[(P)_a-(L)_b]-$ (A)

wherein in the formula (A), P is independently a substituted or unsubstituted carbazole residue;

a is an integer of 2 to 5, (P)a means that "a" Ps are bonded sequentially in which "a" is the number of Ps, one P contained in (P)a is bonded with (L)b at the 9th position of the carbazole residue of the P and the "a" Ps may be the same or different;

when the carbazole residue contained in (P)a has a substituent, the substituent is independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, or a substituted or unsubstituted arylsily group;

provided that at least one carbazole residue contained in (P)a has a substituent represented by any one of the following formulas (3) to (7);

TABLE 2

| Examples | Hole-transporting layer | Emitting layer Host | Dopant | Emitting color | Luminous efficiency (cd/A) | Relative lifetime* |
|---|---|---|---|---|---|---|
| Example 11 | P-1 | EM1 | D1 | Blue | 2.9 | 1.0 |
| Example 12 | P-2 | EM1 | D1 | Blue | 3.1 | 0.9 |
| Example 13 | P-3 | EM1 | D1 | Blue | 3.0 | 1.1 |
| Example 14 | P-4 | EM1 | D1 | Blue | 3.0 | 1.1 |
| Example 15 | P-5 | EM1 | D1 | Blue | 2.9 | 1.0 |
| Example 16 | P-6 | EM1 | D1 | Blue | 3.0 | 1.1 |
| Example 17 | P-7 | EM1 | D1 | Blue | 2.8 | 0.9 |
| Example 18 | P-1 | EM1 | D2 | Blue | 3.1 | 0.9 |
| Com. Ex. 7 | P-9 | EM1 | D1 | Blue | 0.3 | 0.1 |
| Com. Ex. 8 | P-10 | EM1 | D1 | Blue | 0.3 | 0.2 |
| Com. Ex. 9 | P-11 | EM1 | D1 | Blue | 1.3 | 0.3 |

*In the table, the relative lifetime is a value calculated by taking the lifetime of the device of Example 11 as 1.

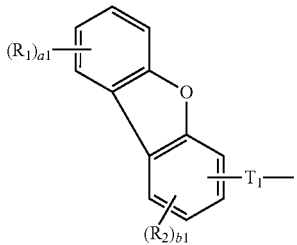
(3)

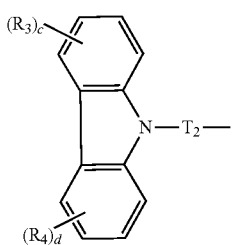
(4)

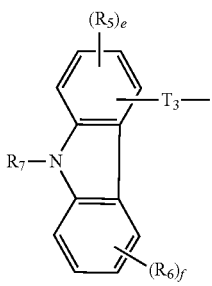
(5)

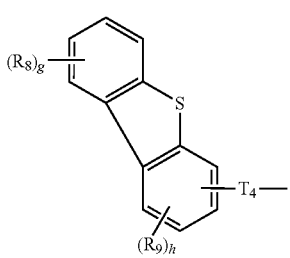
(6)

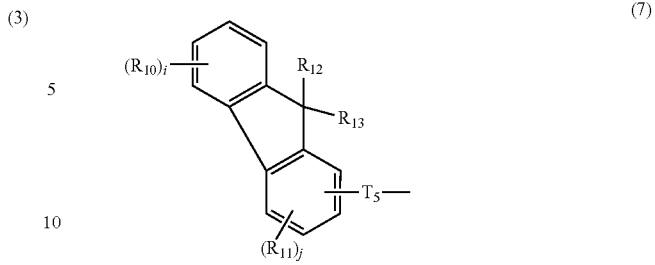
(7)

wherein $R_1$ to $R_{13}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted or unsubstituted alkylamino group, a substituted or unsubstituted arylamino group, a silyl group substituted by one or more selected from alkyl groups and aryl groups, a halogen atom, a nitro group, a cyano group or a hydroxyl group, a1, c, d, f, g and i are independently an integer of 0 to 4;

b1, e, h and j are independently an integer of 0 to 3;

$T_1$ to $T_5$ are independently a single bond or a substituted or unsubstituted arylene group including 6 to 50 ring carbon atoms;

L is a linkage group;

b is an integer of 0 to 5, (L)b means, when b is 2 or more, "b" Ls are bonded sequentially in which "b" is the number of L, and in this case, "b" Ls may be the same or different, and bonding position of Ls is not limited; and when b is 0, (L)b is a single bond.

2. The polymer according to claim 1, wherein bonding position of adjacent carbazole residues in the "a" carbazole residues being bonded sequentially in which "a" is the number of the carbazole residues is one selected from the $3^{rd}$-$3^{rd}$ position, the $3^{rd}$-$2^{rd}$ position and the $2^{nd}$-the $2^{nd}$ position.

3. The polymer according to claim 1, wherein a is 2 or 3.

4. The polymer according to claim 1, which has a structure represented by any of the following formulas (10) to (14) and (23) to (36):

(10)
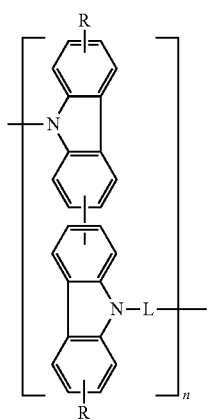
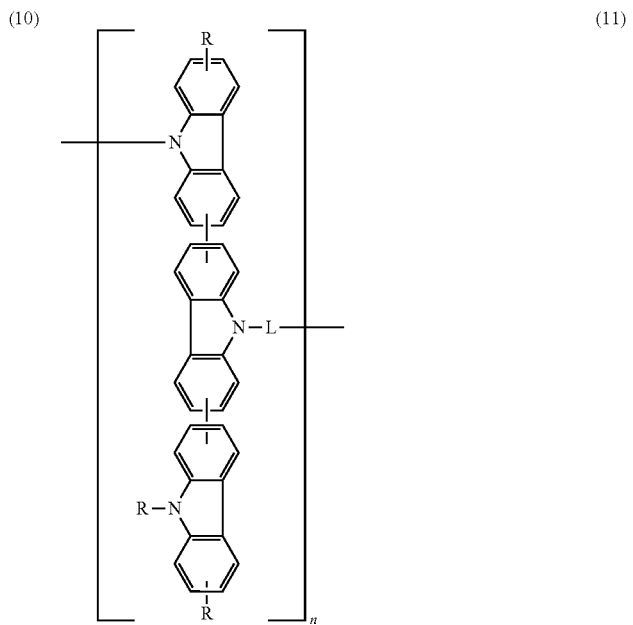
(11)
(12)
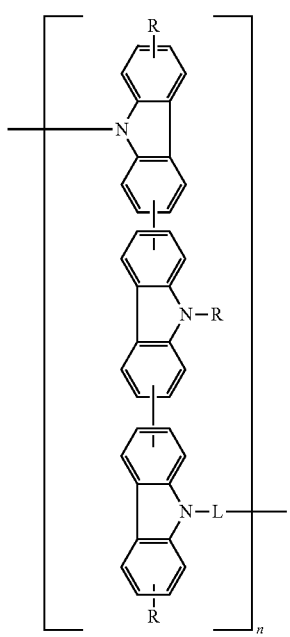
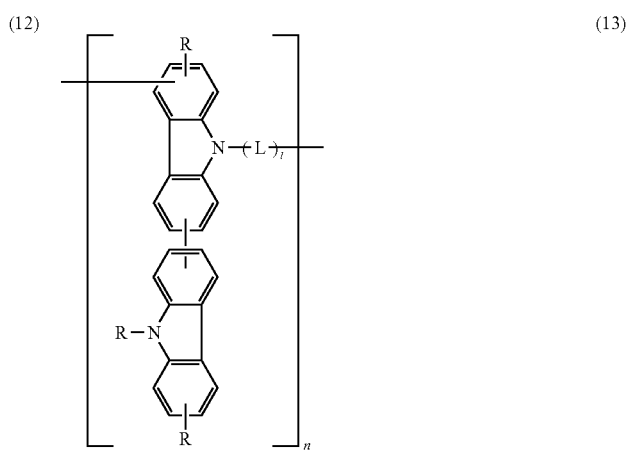
(13)

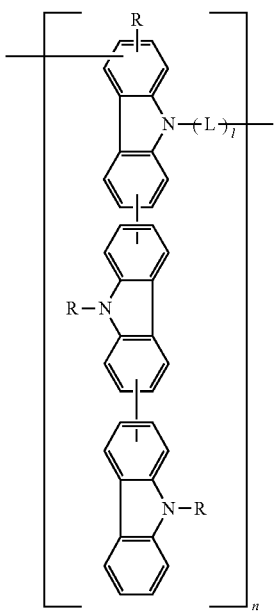 (14)
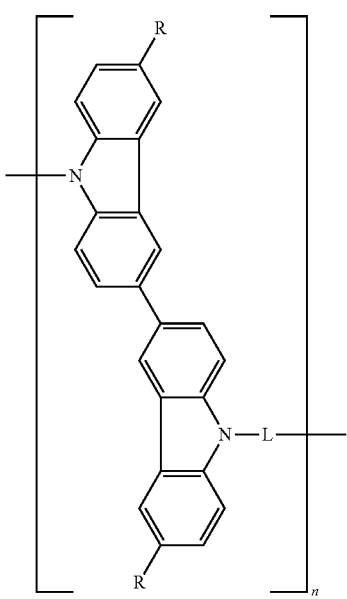 (23)
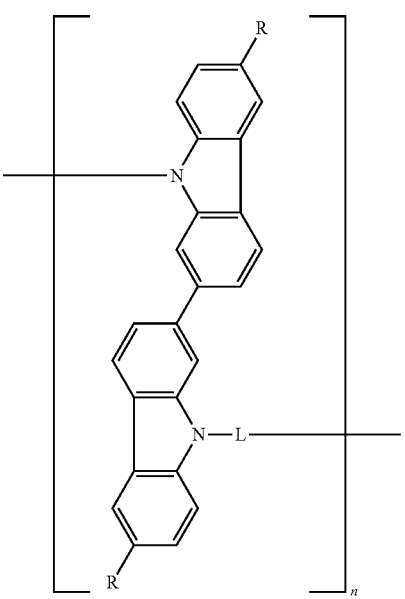 (24)

-continued
(25)
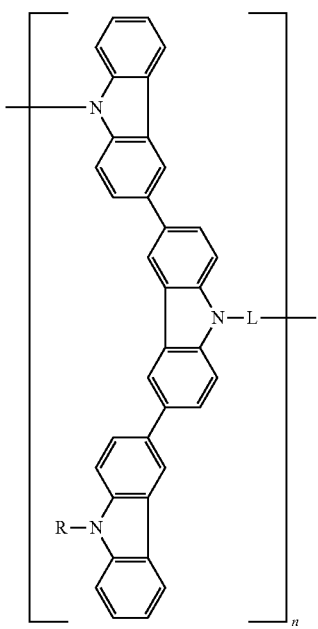
(26)
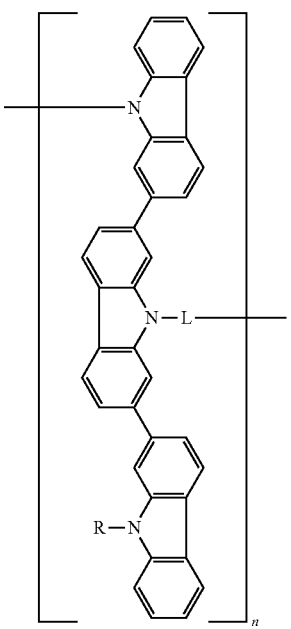
(27)
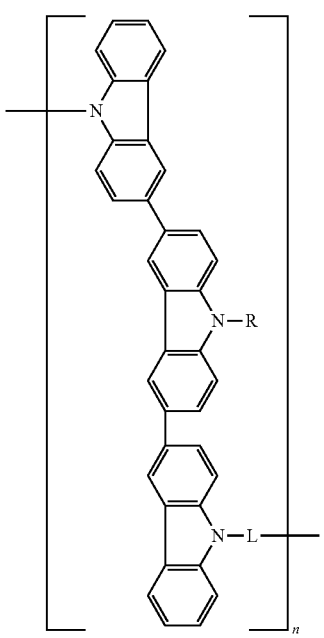
(28)
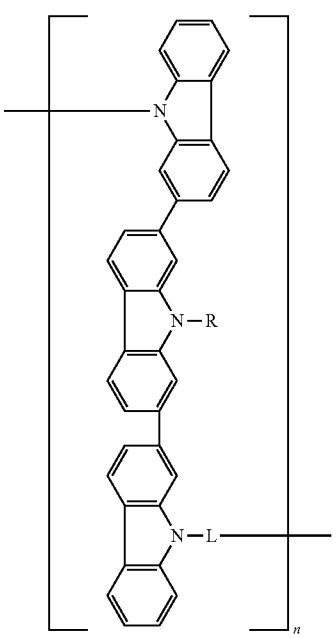

205
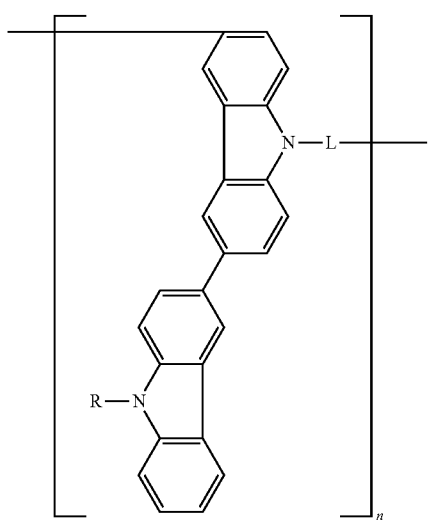
(29)
206
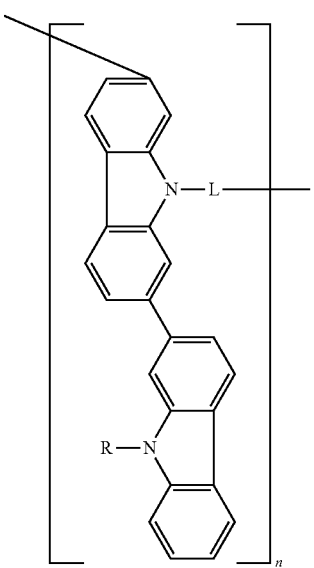
(30)
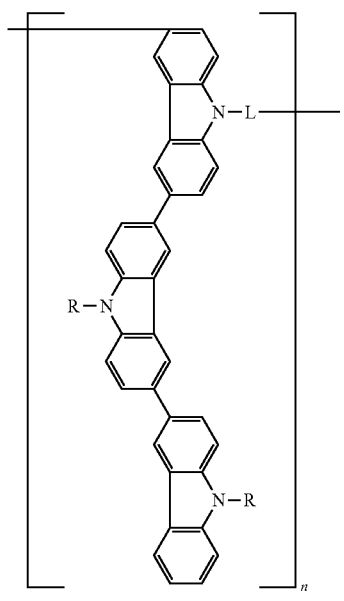
(31)
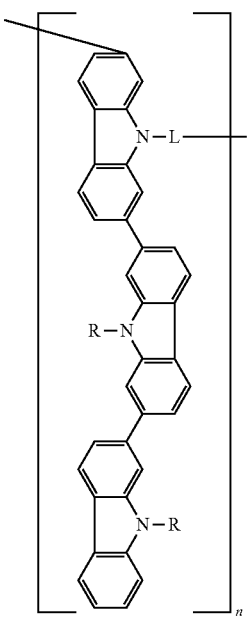
(32)

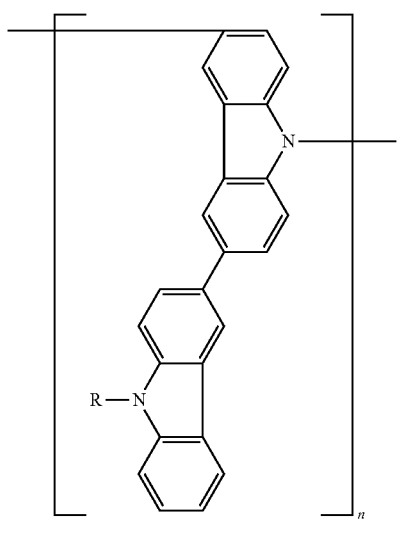 (33)

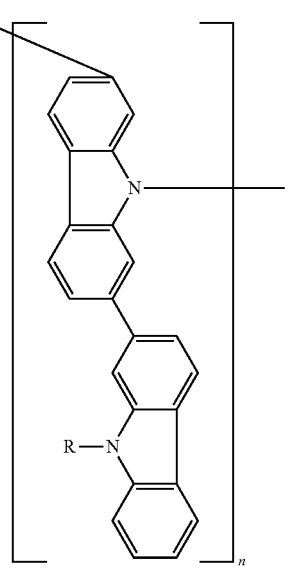 (34)

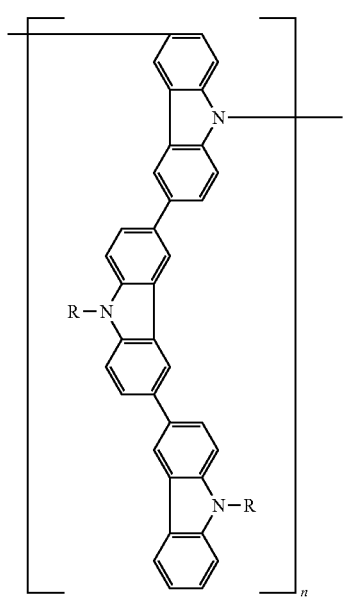 (35)

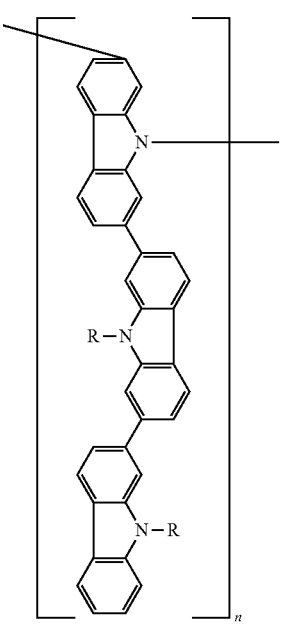 (36)

wherein in the formulas (10) to (14) and (23) to (36), R is independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or an arylsilyl group; and provided that, in each of the formulas, at least one R is independently represented by any of the following formulas (3) to (7):

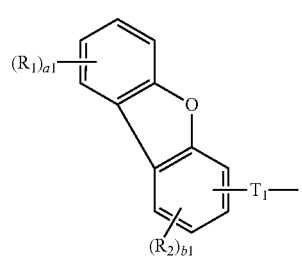 (3)

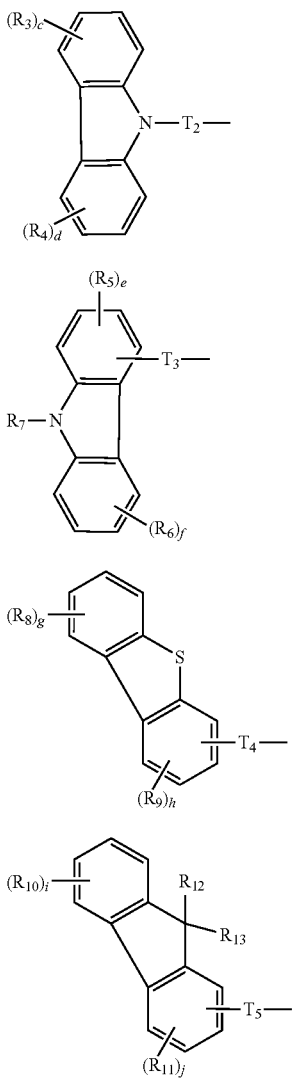

wherein $R_1$ to $R_{13}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 ring carbon atoms, a substituted or unsubstituted cycloalkoxy group including 3 to 10 ring carbon atoms, a substituted or unsubstituted aryloxy group including 6 to 30 ring caron atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a1, c, d, f, g and i are independently an integer of 0 to 4;
b1, e, h and j are independently an integer of 0 to 3;
$T_1$ to $T_5$ are independently a single bond or a substituted or unsubstituted arylene group including 6 to 50 ring carbon atoms;
l is 0 or 1;
n is the repeating number; and
L is a linkage group.

5. A coating liquid comprising the polymer according to claim 1 and a solvent.

6. The coating liquid according to claim 5, wherein at least one of the solvents is an organic solvent.

7. A method for producing an electronic device, wherein at least one film constituting an electronic device is formed into a film by a wet method by using the coating liquid according to claim 5.

8. The method for producing an electronic device according to claim 7, wherein the electronic device is an electroluminescence device, a photoelectronic conversion device or a transistor.

9. The method for producing an electronic device according to claim 7, wherein the electronic device is an organic electroluminecence device.

10. An organic electroluminecence device comprising:
an anode and a cathode; and
one or more organic thin film layers between the anode and the cathode, wherein
at least one of the organic thin film layers is an emitting layer, and
at least one of the organic thin film layers comprises the polymer according to claim 1.

11. The organic electroluminecence device according to claim 10, wherein at least one of the organic thin film layers is a hole-injecting layer or a hole-transporting layer.

12. The organic electroluminecence device according to claim 11, wherein the hole-injecting layer or the hole-transporting layer is in contact with the emitting layer.

13. The organic electrolumnecence device according to claim 10, wherein the emitting layer is formed by a wet film formation method.

14. The polymer according to claim 1, wherein at least one carbazole residue contained in (P)a has a substituent represented by any one of the formulas (3) to (6).

15. The polymer according to claim 1, wherein bonding position of adjacent carbazole residues in the "a" carbazole residues being bonded sequentially in which "a" is the number of the carbazole residues is one selected from the $3^{rd}$-$2^{nd}$ position and the $2^{nd}$-the $2^{nd}$ position.

16. The polymer according to claim 1, wherein b is 0.

17. The polymer according to claim 1, wherein b is an integer of 1 to 5.

18. The polymer according to claim 1, wherein $T_1$ to $T_5$ in the formulas (3) to (7) are a single bond.

19. A polymer comprising a structural unit represented by the following formula (A'):

$$\text{―}(P')_{a'}\text{-}(L')_{b'}\text{―} \tag{A'}$$

wherein in the formula (A'), P' is independently a substituted or unsubstituted carbazole residue;
a' is an integer of 2 to 5, (P')a' means that "a'" P's are bonded sequentially in which "a'" is the number of P's, the bonding position of adjacent carbazole residues in the "a'" substituted or unsubstituted carbazole residues being bonded sequentially is one selected from the 3rd position-2'nd position and the 2nd position-2'nd position, and the "a'" P's may be the same or different;
when the carbazole residue contained in (P')a' has a substituent, the substituent is independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, or a substituted or unsubstituted arylsily group;

provided that at least one carbazole residue contained in (P')a' has a substituent on at least one of the 1$^{st}$ and 8$^{th}$ position of the carbazole residue and the substituent is represented by any one of the following formulas (3) to (6);

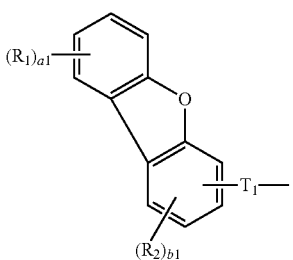

(3)

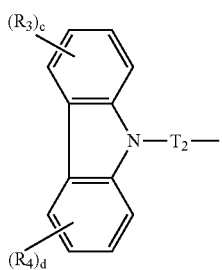

(4)

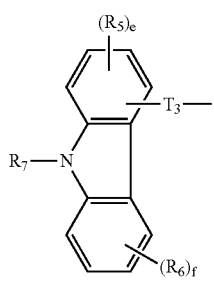

(5)

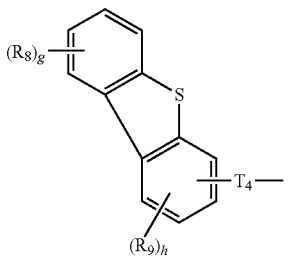

(6)

wherein R$_1$ to R$_9$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted or unsubstituted alkylamino group, a substituted or unsubstituted arylamino group, a silyl group substituted by one or more selected from alkyl groups and aryl groups, a halogen atom, a nitro group, a cyano group or a hydroxyl group, a1, c, d, f, and g are independently an integer of 0 to 4;

b1, e, and h are independently an integer of 0 to 3;

T$_1$ to T$_4$ are independently a single bond or a substituted or unsubstituted arylene group including 6 to 50 ring carbon atoms;

L' is a linkage group;

b' is an integer of 0 to 5, (L')b' means, when b' is 2 or more, "b'" L's are bonded sequentially in which "b'" is the number of L', and in this case, "b'" L's may be the same or different, and bonding position of L's is not limited; and when b' is 0, (L')b' is a single bond.

* * * * *